US012796064B2

United States Patent
Pan et al.

(10) Patent No.: US 12,796,064 B2
(45) Date of Patent: Nov. 10, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Kuan-Ting Pan, Taipei City (TW); Kuo-Cheng Chiang, Hsinchu County (TW); Shi-Ning Ju, Hsinchu City (TW); Shang-Wen Chang, Hsinchu County (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 268 days.

(21) Appl. No.: 18/195,351

(22) Filed: May 9, 2023

(65) Prior Publication Data

US 2023/0282519 A1 Sep. 7, 2023

Related U.S. Application Data

(62) Division of application No. 17/005,172, filed on Aug. 27, 2020, now Pat. No. 11,676,864.

(51) Int. Cl.

*H10D 84/03* (2025.01)
*H10D 84/01* (2025.01)
*H10D 84/83* (2025.01)

(52) U.S. Cl.

CPC ....... *H10D 84/038* (2025.01); *H10D 84/0133* (2025.01); *H10D 84/0151* (2025.01); *H10D 84/0158* (2025.01); *H10D 84/834* (2025.01)

(58) Field of Classification Search

CPC ........... H10D 84/0151; H10D 84/0188; H10D 84/038; H10D 84/0158; H10D 84/834; H10D 84/013; H10D 84/0133

See application file for complete search history.

(56) References Cited

U.S. PATENT DOCUMENTS 7,235,459 B2 * 6/2007 Sandhu .................. H10B 12/00 257/E21.548
9,209,247 B2 12/2015 Colinge et al.
9,236,267 B2 1/2016 De et al.
9,412,817 B2 8/2016 Yang et al.
9,412,828 B2 8/2016 Ching et al.

(Continued)

*Primary Examiner* — Tuan A Hoang
(74) *Attorney, Agent, or Firm* — NZ Carr Law Office

(57) ABSTRACT

A semiconductor device structure, along with methods of forming such, are described. The structure includes a first fin, a second fin adjacent the first fin, and a third fin adjacent the second fin. The structure further includes a first source/drain epitaxial feature merged with a second source/drain epitaxial feature. The structure further includes a third source/drain epitaxial feature, and a first liner positioned at a first distance away from a first plane defined by a first sidewall of the first fin and a second distance away from a second plane defined by a second sidewall of the second fin. The first distance is substantially the same as the second distance, and the merged first and second source/drain epitaxial features is disposed over the first liner. The structure further includes a dielectric feature disposed between the second source/drain epitaxial feature and the third source/drain epitaxial feature.

20 Claims, 49 Drawing Sheets

(56) References Cited

U.S. PATENT DOCUMENTS

| | | | | |
|---|---|---|---|---|
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,727,205 | B2 | 7/2020 | Wu et al. | |
| 2015/0035023 | A1 | 2/2015 | Kim et al. | |
| 2018/0166429 | A1 | 6/2018 | Chong et al. | |
| 2019/0067120 | A1 | 2/2019 | Ching et al. | |
| 2019/0067445 | A1 | 2/2019 | Ching et al. | |
| 2020/0119004 | A1* | 4/2020 | Ching | H10D 64/017 |
| 2020/0127113 | A1* | 4/2020 | Ching | H10D 84/0151 |
| 2020/0135580 | A1* | 4/2020 | Hsieh | H10D 84/0151 |

* cited by examiner

SEMICONDUCTOR DEVICE STRUCTURE AND METHODS OF FORMING THE SAME

CROSS-REFERENCE TO RELATED APPLICATIONS

This application is a divisional application of U.S. patent application Ser. No. 17/005,172 filed Aug. 27, 2020, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 16A-20A are cross-sectional side views of various stages of manufacturing the semiconductor device structure taken along line A-A of FIG. 5, in accordance with some embodiments.

FIGS. 16B-20B are cross-sectional side views of various stages of manufacturing the semiconductor device structure taken along line B-B of FIG. 15, in accordance with some embodiments.

FIGS. 16C-20C are cross-sectional side views of various stages of manufacturing the semiconductor device structure taken along line C-C of FIG. 15, in accordance with some embodiments.

FIGS. 16D-20D are cross-sectional side views of various stages of manufacturing the semiconductor device structure taken along line D-D of FIG. 15, in accordance with some embodiments.

FIGS. 21A-26A are perspective views of various stages of manufacturing a semiconductor device structure, in accordance with some embodiments.

FIGS. 21B-26B are cross-sectional side views of various stages of manufacturing the semiconductor device structure taken along line B-B of FIG. 21A, in accordance with some embodiments.

FIGS. 21C-26C are cross-sectional side views of various stages of manufacturing the semiconductor device structure taken along line C-C of FIG. 21A, in accordance with some embodiments.

DETAILED DESCRIPTION

Figure 1:
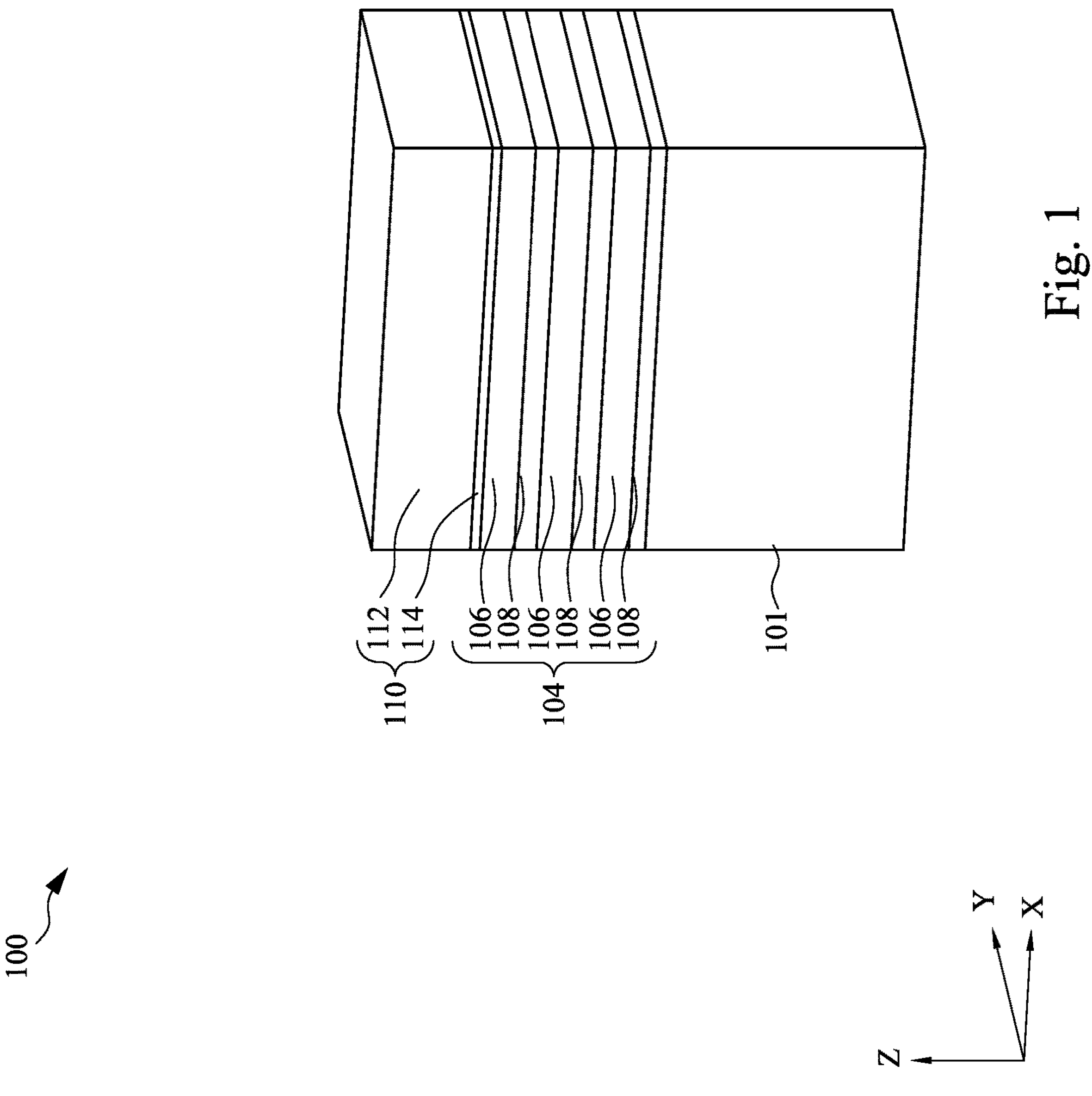
FIGS. 1-5 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-30 show exemplary sequential processes for manufacturing a semiconductor device structure 100, in accordance with some embodiments. It is understood that additional operations can be provided before, during, and after processes shown by FIGS. 1-30, and some of the operations described below can be replaced or eliminated, for additional embodiments of the method. The order of the operations/processes may be interchangeable.

As shown in FIG. 1, a stack of semiconductor layers 104 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate

101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate 101 to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

The substrate 101 may include various regions that have been suitably doped with impurities (e.g., p-type or n-type impurities). The dopants are, for example boron for an n-type fin field effect transistor (FinFET) and phosphorus for a p-type FinFET.

The stack of semiconductor layers 104 includes first semiconductor layers 106 and second semiconductor layers 108. The first semiconductor layers 106 and the second semiconductor layers 108 are made of semiconductor materials having different etch selectivity and/or oxidation rates. For example, the first semiconductor layers 106 are made of Si and the second semiconductor layers 108 are made of SiGe. In some embodiments, the stack of semiconductor layers 104 includes alternating first and second semiconductor layers 106, 108. The first semiconductor layers 106 or portions thereof may form nanosheet channel(s) of the semiconductor device structure 100. The semiconductor device structure 100 may include a nanosheet transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below. In some embodiments, the first and second semiconductor layers 106, 108 are replaced with a single semiconductor material connected to the substrate 101, and the device is a FinFET.

It is noted that 3 layers of the first semiconductor layers 106 and 3 layers of the second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8.

As described in more detail below, the first semiconductor layers 106 may serve as channels for the semiconductor device structure 100 and the thickness is chosen based on device performance considerations. In some embodiments, each first semiconductor layer 106 has a thickness ranging from about 6 nanometers (nm) to about 12 nm. The second semiconductor layers 108 may eventually be removed and serve to define a vertical distance between adjacent channels for the semiconductor device structure 100 and the thickness is chosen based on device performance considerations. In some embodiments, each second semiconductor layer 108 has a thickness ranging from about 2 nm to about 6 nm.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

A mask structure 110 is formed over the stack of semiconductor layers 104. The mask structure 110 may include an oxygen-containing layer 112 and a nitrogen-containing layer 114. The oxygen-containing layer 112 may be a pad oxide layer, such as a $SiO_2$ layer. The nitrogen-containing layer 114 may be a pad nitride layer, such as $Si_3N_4$. The mask structure 110 may be formed by any suitable deposition process, such as chemical vapor deposition (CVD) process.

Figure 2:
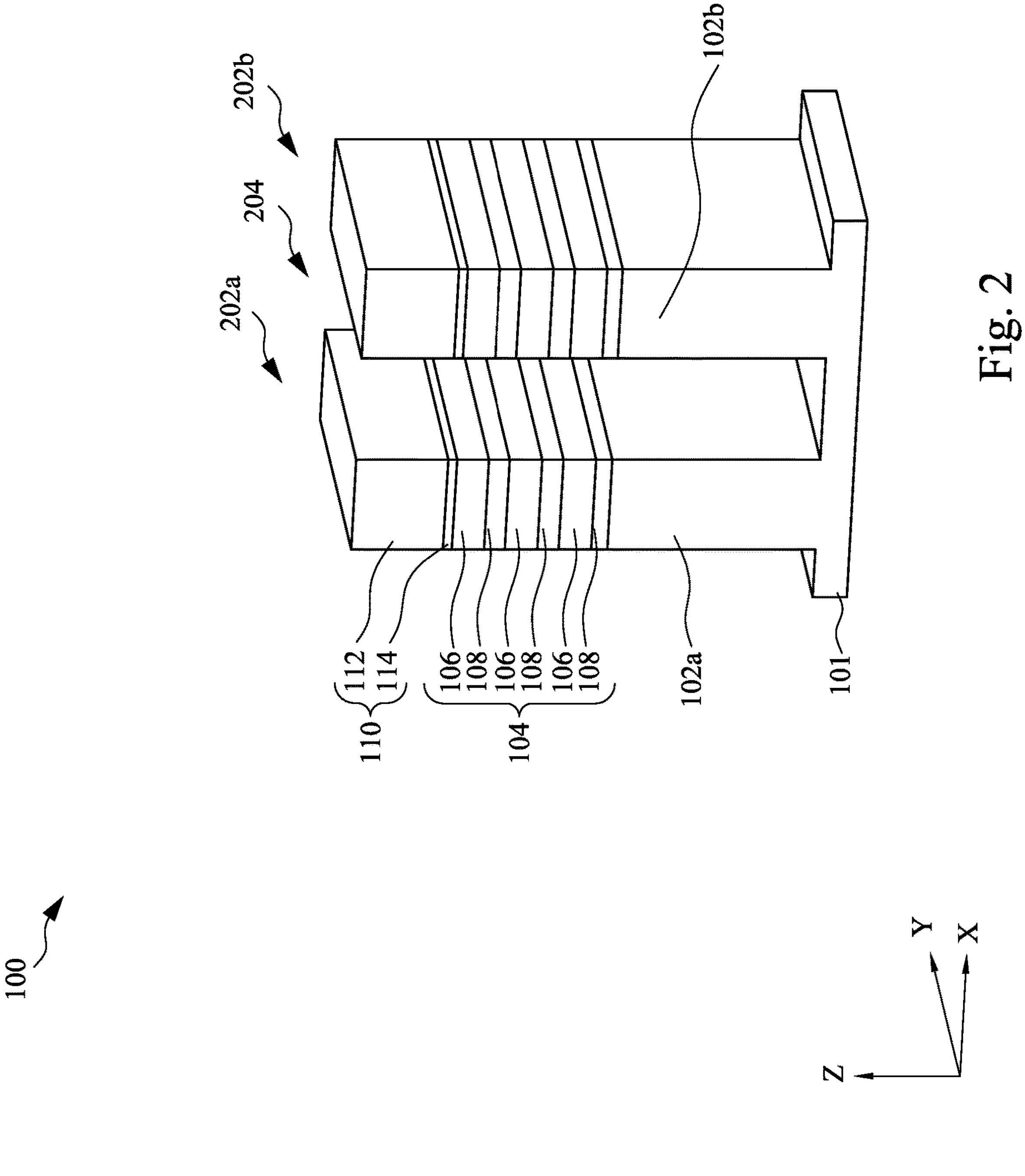
Figure 6:
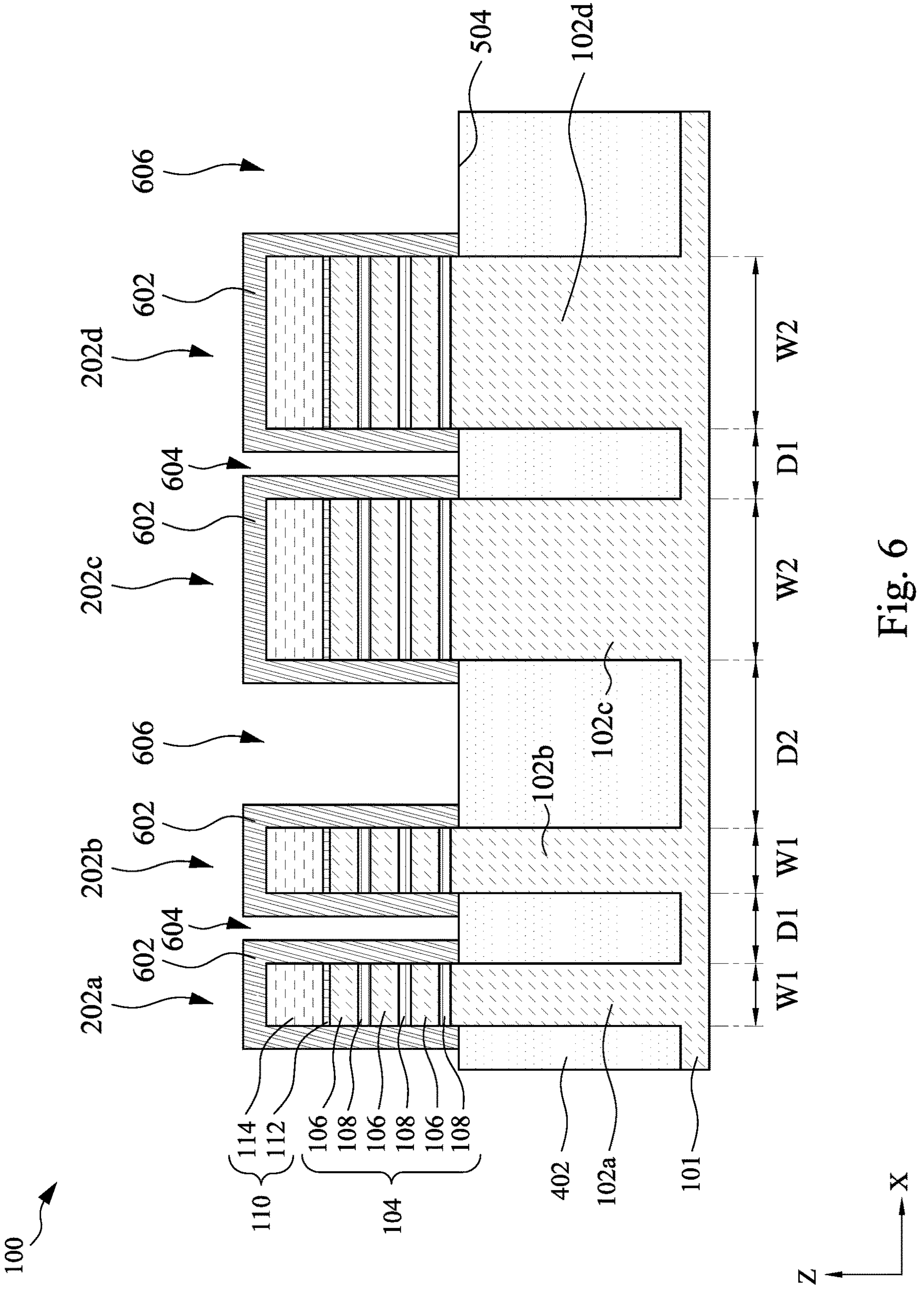
FIGS. 6-15 are cross-sectional side views of various stages of manufacturing the semiconductor device structure taken along line A-A of FIG. 5, in accordance with some embodiments.

FIG. 2 is a perspective view of one of the various stages of manufacturing the semiconductor device structure 100, in accordance with some embodiments. As shown in FIG. 2, fins 202*a* and 202*b* are formed. In some embodiments, each fin 202*a*, 202*b* includes a substrate portion 102*a*, 102*b* formed from the substrate 101, a portion of the stack of semiconductor layers 104, and a portion of the mask structure 110. The fins 202*a*, 202*b* may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 202*a*, 202*b* by etching the stack of semiconductor layers 104 and the substrate 101. The etching process can include dry etching, wet etching, reactive ion etching (RIE), and/or other suitable processes. As shown in FIG. 2, two fins are formed, but the number of the fins is not limited to two. Three or more fins are arranged in the X direction in some embodiments, as shown in FIG. 6.

In some embodiments, the fins 202*a*, 202*b* may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 204 in unprotected regions through the mask structure 110, the stack of semiconductor layers 104, and into the substrate 101, thereby leaving the extending fins 202*a*, 202*b*. The trenches 204 may be etched using a dry etch (e.g., RIE), a wet etch, and/or combination thereof.

Figure 3:
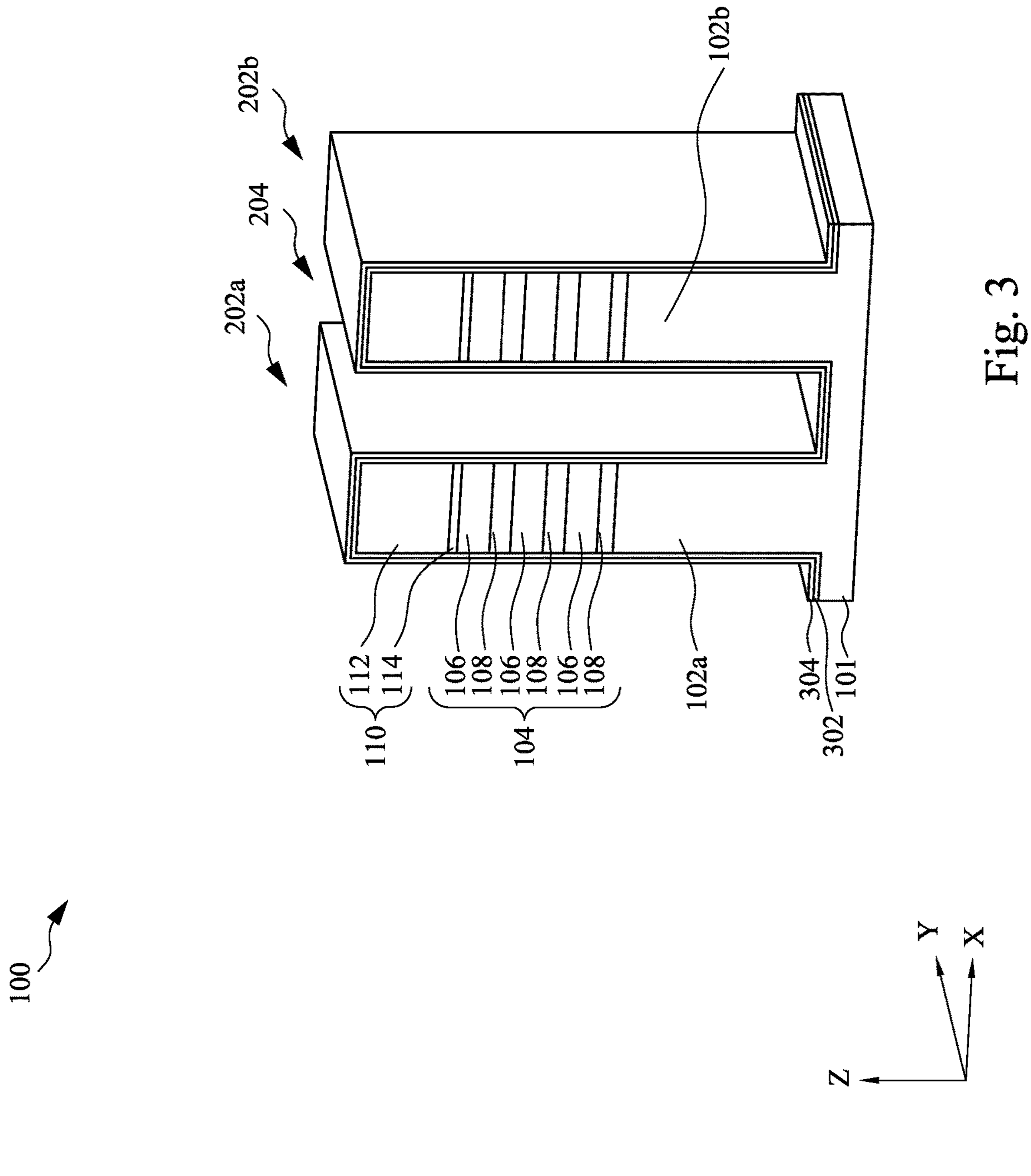

FIG. 3 is a perspective view of one of the various stages of manufacturing the semiconductor device structure 100, in accordance with some embodiments. As shown in FIG. 3, a liner 304 is formed over the substrate 101 and the fins 202*a*, 202*b*. In some embodiments, an optional liner 302 may be formed on the substrate 101 and fins 202*a*, 202*b*, and the liner 304 is formed on the optional liner 302. The liner 304 may be made of a semiconductor material, such as Si. In some embodiments, the liner 304 is made of the same material as the substrate 101. The optional liner 302 may be made of an oxygen-containing material, such as an oxide. The liner 304 may be a conformal layer and may be formed by a conformal process, such as an atomic layer deposition (ALD) process. The term "conformal" may be used herein for ease of description upon a layer having substantial same thickness over various regions. The optional liner 302 may be a conformal layer and may be formed by a conformal process, such as an ALD process.

Figure 4:
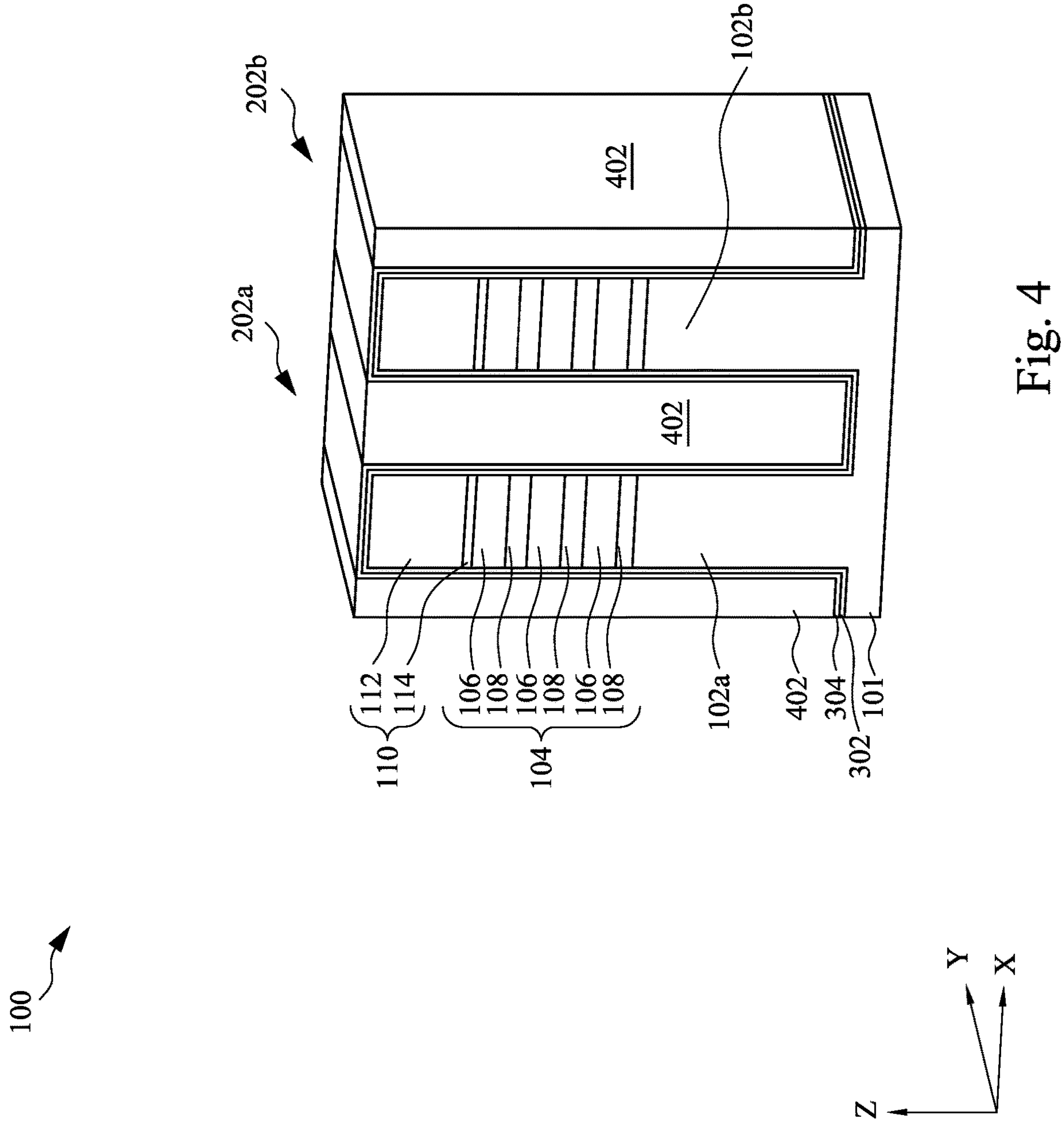

FIG. 4 is a perspective view of one of the various stages of manufacturing the semiconductor device structure 100, in accordance with some embodiments. As shown in FIG. 4, an insulating material 402 is formed on the substrate 101. The insulating material 402 fills the trench 204 (FIG. 2). The insulating material 402 may be first formed over the substrate 101 so that the fins 202*a*, 202*b* are embedded in the insulating material 402. Then, a planarization operation, such as a chemical mechanical polishing (CMP) process and/or an etch-back process, is performed such that the tops of the fins 202*a*, 202*b* (e.g., the liner 304) are exposed from the insulating material 402, as shown in FIG. 4. The insulating material 402 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material; or any suitable dielectric material. The insulating material 402 may be formed by any suitable method, such as low-pressure chemical vapor deposition (LPCVD), plasma enhanced CVD (PECVD) or flowable CVD (FCVD).

Figure 5:
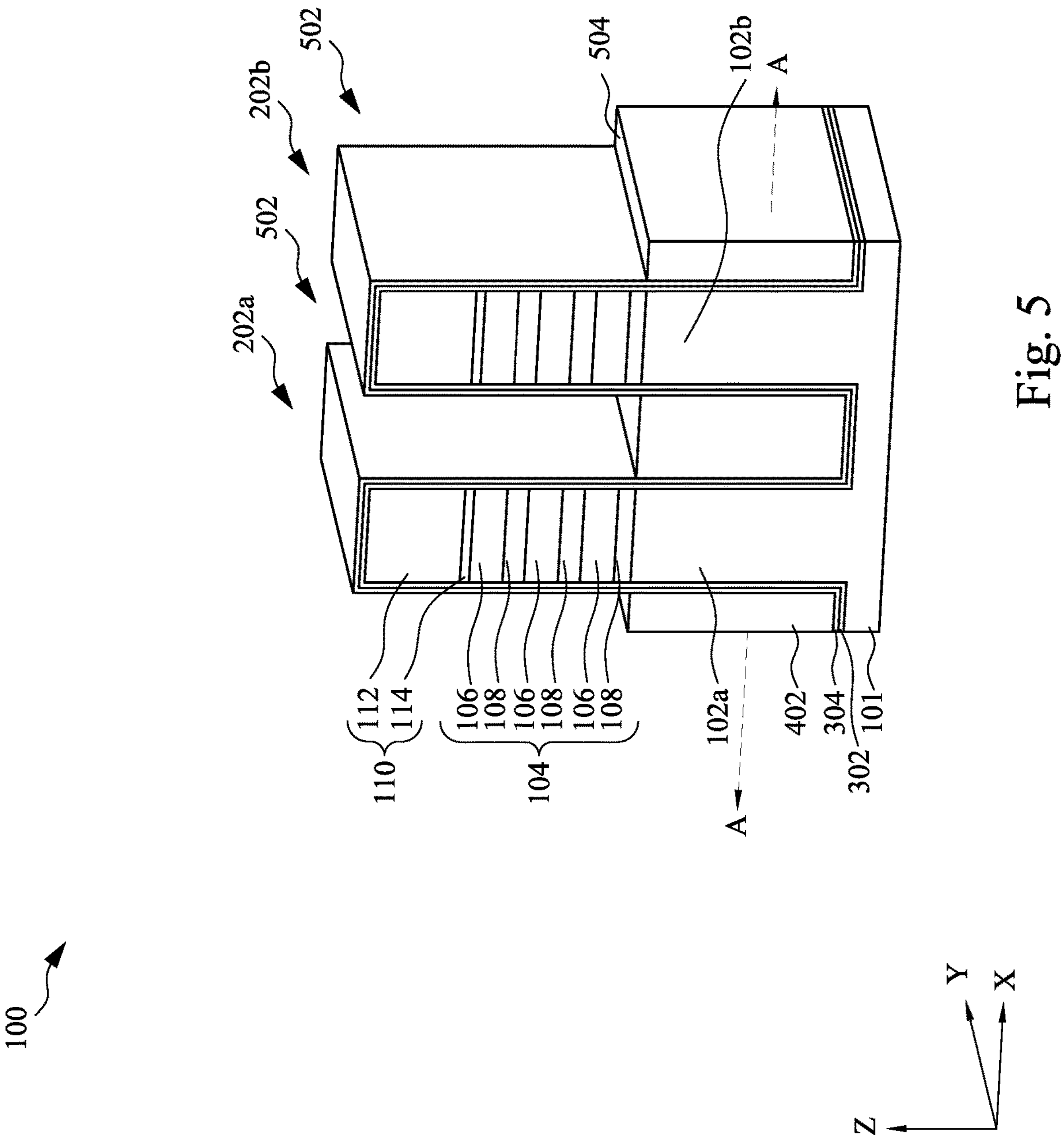

Next, as shown in FIG. 5, the insulating material 402 may be recessed by removing a portion of the insulating material 402 located between adjacent fins 202*a*, 202*b* to form trenches 502. The trenches 502 may be formed by any suitable removal process, such as dry etching or wet etching that selectively removes the insulating material 402 but not the semiconductor material of the liner 304. The recessed insulating material 402 may be the shallow trench isolation (STI). The insulating material 402 includes a top surface 504 that may be level with or below a surface of the second semiconductor layer 108 in contact with the substrate 101.

FIGS. 6-15 are cross-sectional side views of various stages of manufacturing the semiconductor device structure taken along line A-A of FIG. 5, in accordance with some embodiments. As shown in FIG. 6, four fins 202*a*, 202*b*, 202*c*, and 202*d* are formed along the X direction. The fins 202*a*, 202*b*, 202*c*, and 202*d* may include the substrate portions 102*a*, 102*b*, 102*c*, and 102*d*, respectively. The fins 202*a*, 202*b* may each has a first width W1, and the fins 202*c*, 202*d* may each has a second width W2. In some embodiments, the second width W2 is greater than the first width W1. As described above, the first semiconductor layers 106 may serve as channels in a nanosheet transistor device. The widths W1 and W2 may be the device's channel width. The device with a wider channel, such as the device fabricated from the fins 202*c*, 202*d*, may be more suitable for high-speed applications, such as a NAND device. The device with a narrower channel, such as the device fabricated from the fins 202*a*, 202*b*, may be more suitable for low-power and low-leakage applications, such as an inverter device. In some embodiments, both devices having narrow channel and wide channel may be formed in the same column (along the X direction), as shown in FIG. 6, in applications such as system on a chip (SOC) devices.

Figure 20A:
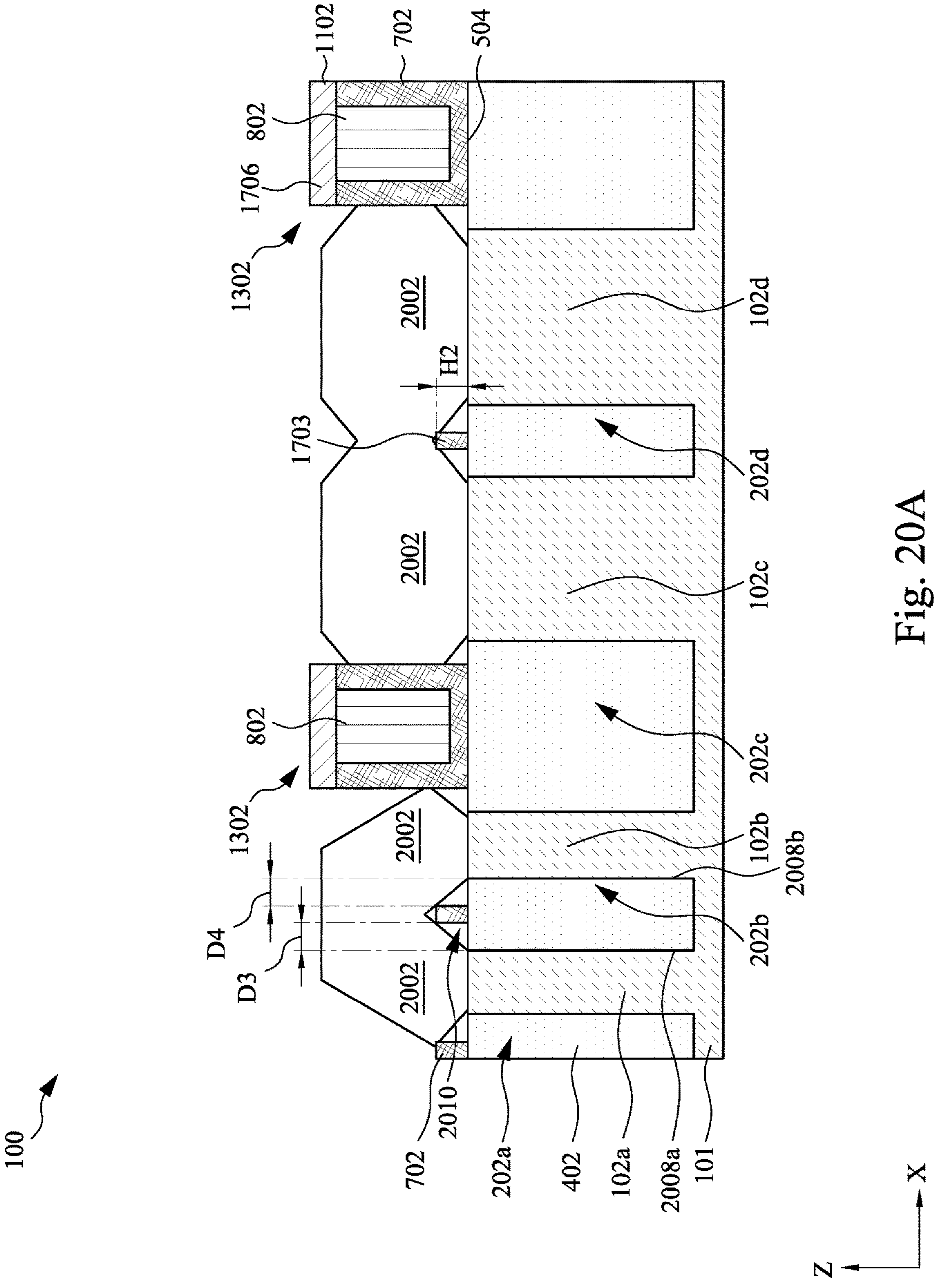
Figure 28A:
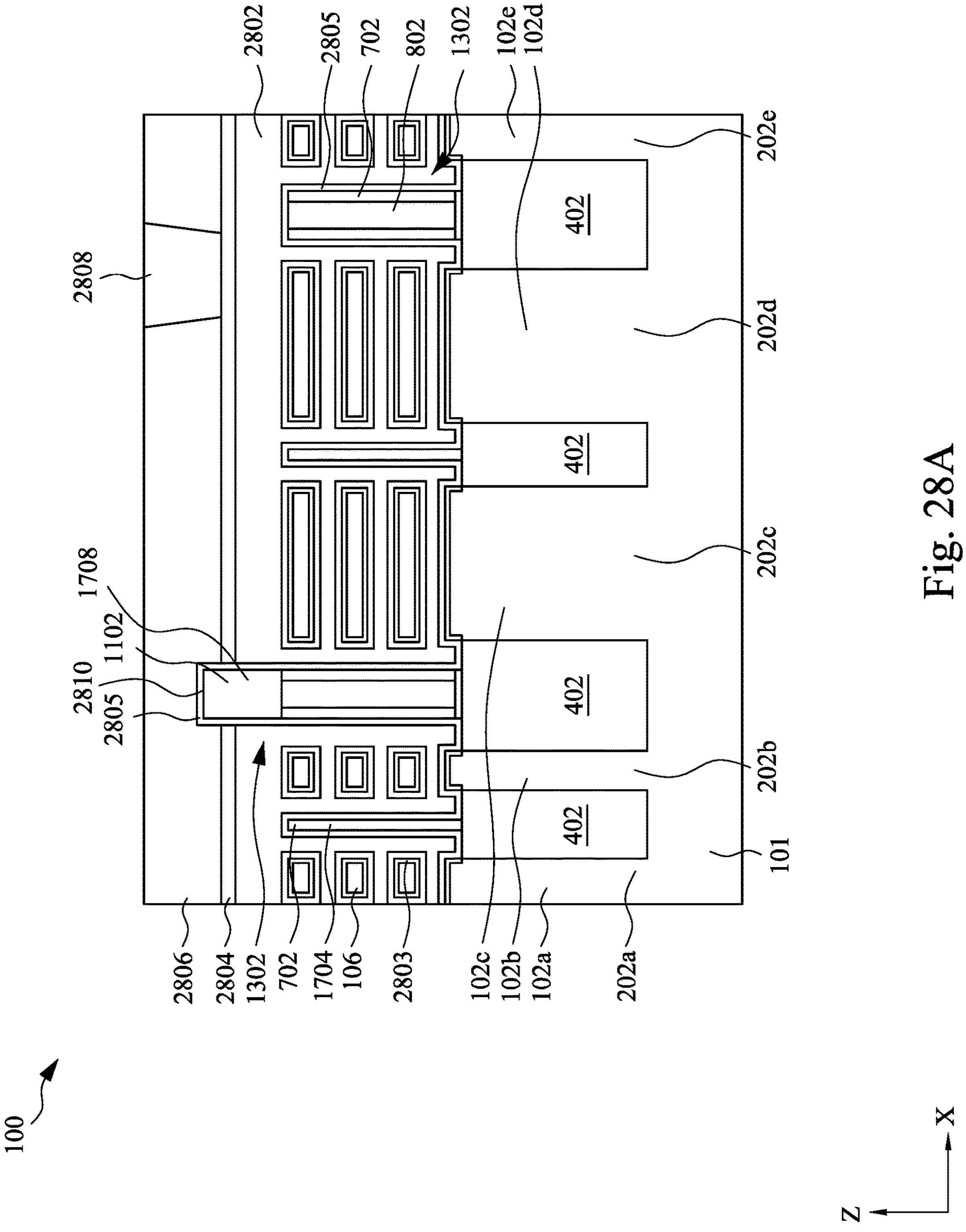
FIGS. 28A-28B are cross-sectional side views of the semiconductor device structure, in accordance with some embodiments.
Figure 28B:
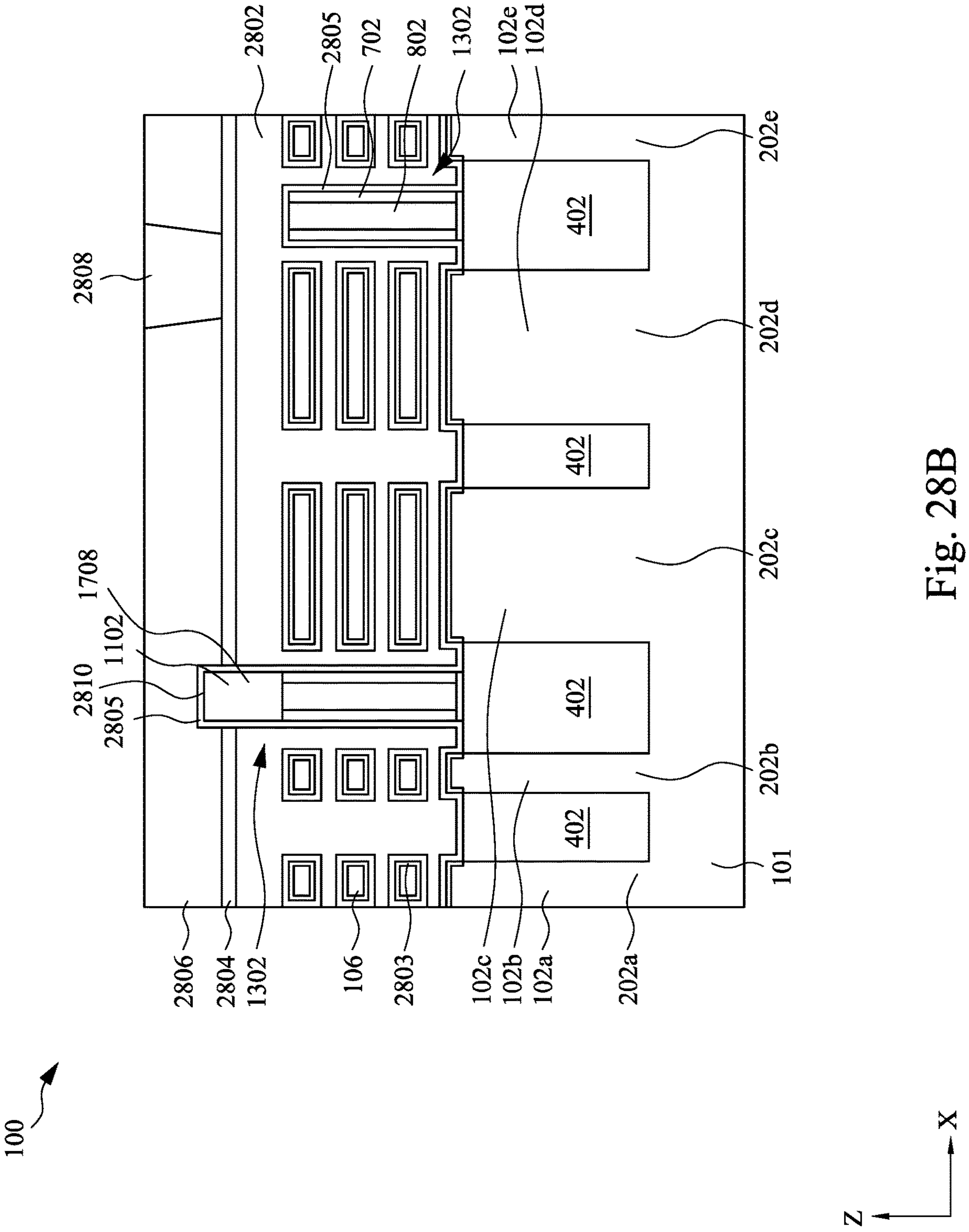

The distances between adjacent fins 202*a*, 202*b*, 202*c*, 202*d* may vary, as shown in FIG. 6. In some embodiments, adjacent fins used to form similar devices may be spaced apart by a first distance D1, and adjacent fins used to form different devices may be spaced apart by a second distance D2. The distance D1 or D2 between adjacent fins may be defined by the distance between a first sidewall of one fin and a second sidewall of the adjacent fin facing the first sidewall. For example, the fins 202*a*, 202*b* may be used to form inverter devices, the fins 202*c*, 202*d* may be used to form devices other than inverter devices, such as NAND devices, and the distance D1 between the fin 202*a* and the fin 202*b* is less than the distance D2 between the fin 202*b* and the fin 202*c*. With the smaller distance D1, the S/D epitaxial feature 2002 (FIG. 20A) formed from the substrate portion 102*a* of the fin 202*a* and the S/D epitaxial feature 2002 (FIG. 20A) formed from the substrate portion 102*b* of the fin 202*b* may be merged, as shown in FIG. 20A. Similarly, the S/D epitaxial feature 2002 (FIG. 20A) formed from the substrate portion 102*c* of the fin 202*c* and the S/D epitaxial feature 2002 (FIG. 20A) formed from the substrate portion 102*d* of the fin 202*d* may be merged, as shown in FIG. 20A. Merged S/D epitaxial features 2002 (FIG. 20A) may lead to increased device density and reduced electrical resistance and contact resistance. Furthermore, the channel regions (i.e., channels formed from the first semiconductor layers 106) formed from the fin 202*a* and the fin 202*b* may share the same gate electrode layer 2802 (FIGS. 28A and 28B). Thus, the distance D1 between channel regions formed from the fin 202*a* and channel regions formed from the fin 202*b* may accommodate a narrow dielectric feature (e.g., the second portion 1704 of the liner 702 between the channel regions shown in FIG. 28A) having a width less than about 10 nm. In some embodiments, the narrow dielectric feature (e.g., the second portion 1704 of the liners 702 shown in FIG. 28A) may not be present, as shown in FIG. 28B. The narrow or non-existent dielectric feature may lead to reduced electrical resistance of the gate electrode layer. In some embodiments, the distance D2 may accommodate a wide dielectric feature (e.g., the dielectric feature 1302 between the S/D regions shown in FIG. 20A) that can separate the S/D epitaxial features 2002 (FIG. 20A) of different devices. The wide dielectric feature may extend between the channel regions of the adjacent fins, and the gate electrode layer may or may not be separated, or cut-off, by the wide dielectric feature. The narrow and wide dielectric features are described in detail below.

As shown in FIG. 6, a cladding layer 602 is formed on the exposed surface of the liner 304 (FIG. 5), and the optional liner 302 is omitted for clarity. The liner 304 may be diffused into the cladding layer 602 during the formation of the cladding layer 602. Thus, in some embodiments, the optional liner 302 does not exist, and the cladding layer 602 is in contact with the stack of semiconductor layers 104, as shown in FIG. 6. In some embodiments, the cladding layer 602 includes a semiconductor material. The cladding layer 602 grows on semiconductor materials but not on dielectric materials. For example, the cladding layer 602 includes SiGe and is grown on the Si of the liner 304 but not on the dielectric material of the insulating material 402. In some embodiments, the cladding layer 602 may be formed by first forming a semiconductor layer on the liner 304 and the insulating material 402, and followed by an etch process to remove portions of the semiconductor layer formed on the insulating material 402. The etch process may remove some of the semiconductor layer formed on the top of the fins 202*a*, 202*b*, 202*c*, 202*d*, and the cladding layer 602 formed on the top of the fins 202*a*, 202*b*, 202*c*, 202*d* may have a curved profile instead of a flat profile. In some embodiments, the cladding layer 602 and the second semiconductor layers 108 include the same material having the same etch selectivity. For example, the cladding layer 602 and the second semiconductor layers 108 include SiGe. The cladding layer 602 and the second semiconductor layer 108 may be removed subsequently to create space for the gate electrode layer.

The cladding layer 602 may define the dimension of trenches 604, 606 in X direction. In some embodiments, the dimension of trenches 604, 606 in X direction is the width of the trenches 604, 606. The width of the trenches 604 may be less than the width of the trenches 606. The narrow dielectric feature may be formed in the trench 604, and the wide dielectric feature may be formed in the trench 606. The portions of the cladding layer 602 formed on the sidewalls of the fins 202*a*, 202*b*, 202*c*, 202*d* may have substantially the same thickness ranging from about 0.5 nm to about 10 nm. The thickness of the cladding layer 602 formed on the sidewalls of the fins 202*a*, 202*b*, 202*c*, 202*d* may define the space for the gate electrode layer 2802 (FIGS. 28A and 28B) to be formed therein after subsequent removal of the cladding layers 602. Thus, if the thickness of the cladding layer 602 is less than 0.5 nm, the space created by the subsequent removal of the cladding layer 602 may be too small to form the gate electrode layer. On the other hand, if the thickness of the cladding layer 602 is greater than 10 nm, the manufacturing cost is increased without significant advantage.

Figure 7:
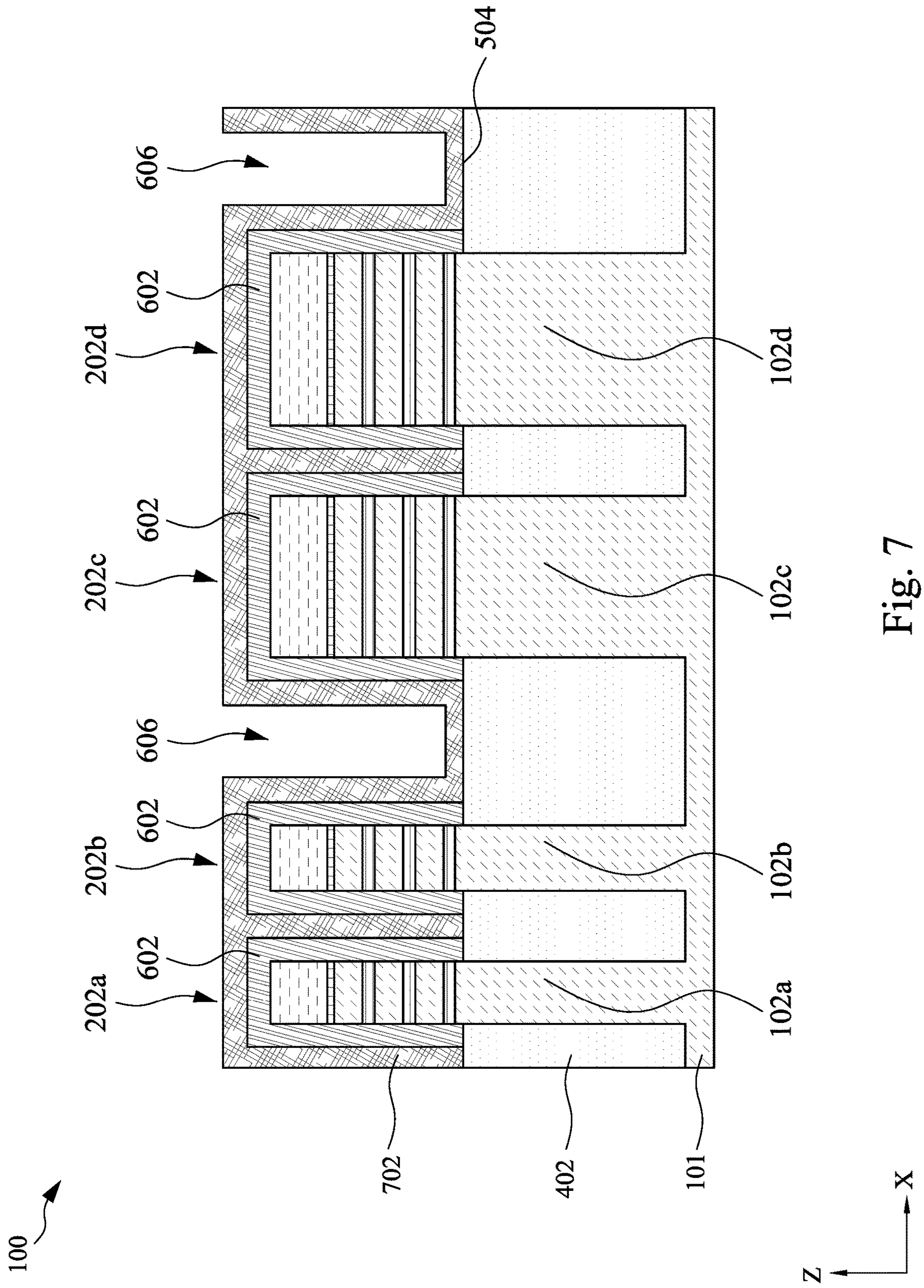

Next, as shown in FIG. 7, a liner 702 is formed in the trenches 604 (FIG. 6), 606 and over the top of the fins 202*a*, 202*b*, 202*c*, 202*d*. The liner 702 may include a low-K dielectric material (e.g., a material having a K value lower than 7), such as SiCN, SiOC, or SiOCN. The liner 702 may be formed by a conformal process, such as an ALD process. The liner 702 may fill the trenches 604 due to the small width of the trenches 604. The liner 702 may be formed on the top surface 504 of the insulating material 402 at the bottom of the trenches 606 and on the portions of the cladding layer 602 that function as sidewalls of the trenches 606. The liner 702 may have a thickness ranging from about 0.5 nm to about 8 nm. The liner 702 may fill the trenches 604 but not the trenches 606. Thus, if the thickness of the liner 702 is less than about 0.5 nm, the trenches 604 may not be filled. On the other hand, if the thickness of the liner 702 is greater than about 5 nm, the trenches 606 may be filled.

Figure 8:
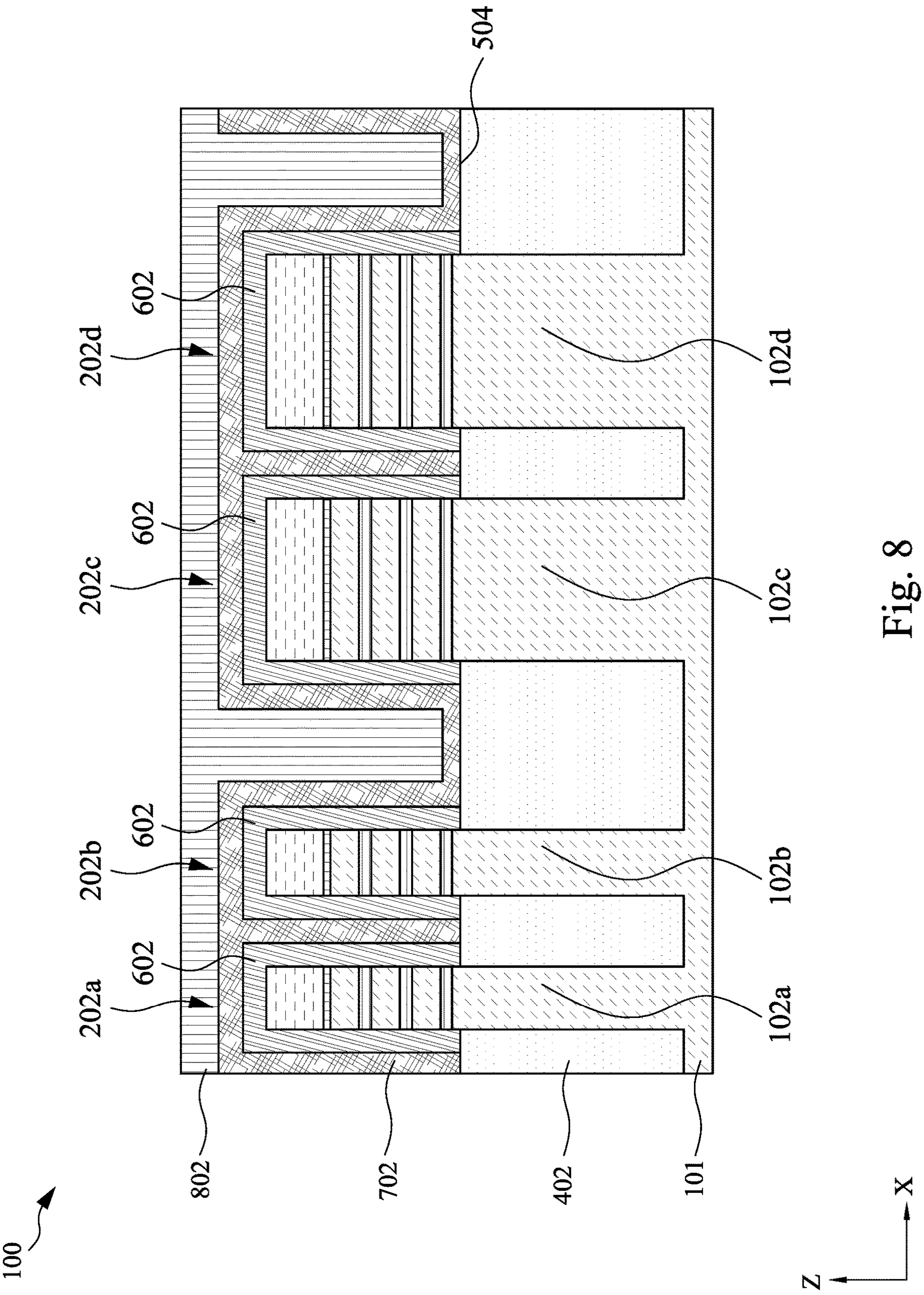

Next, as shown in FIG. 8, a low-K dielectric material 802 is formed in the trenches 606 and over the fins 202*a*, 202*b*, 202*c*, 202*d*. The low-K dielectric material 802 may include a material having a K value lower than 7, such as $SiO_2$, SiN, SiCN, SiOC, or SiOCN. In one example, the low-K dielectric material 802 includes $SiO_2$. The low-K dielectric material 802 may include the same or different material as the liner 702. The low-K dielectric material 802 may be formed by a flowable process, such as an FCVD process. The low-K dielectric material 802 may have a thickness ranging from about 2 nm to about 15 nm. The low-K dielectric material 802 may fill the trenches 606. Thus, if the thickness of the low-K dielectric material 802 is less than about 2 nm, the trenches 606 may not be filled. On the other hand, if the thickness of the low-K dielectric material 802 is greater than about 10 nm, the manufacturing cost is increased without significant advantage.

Figure 9:
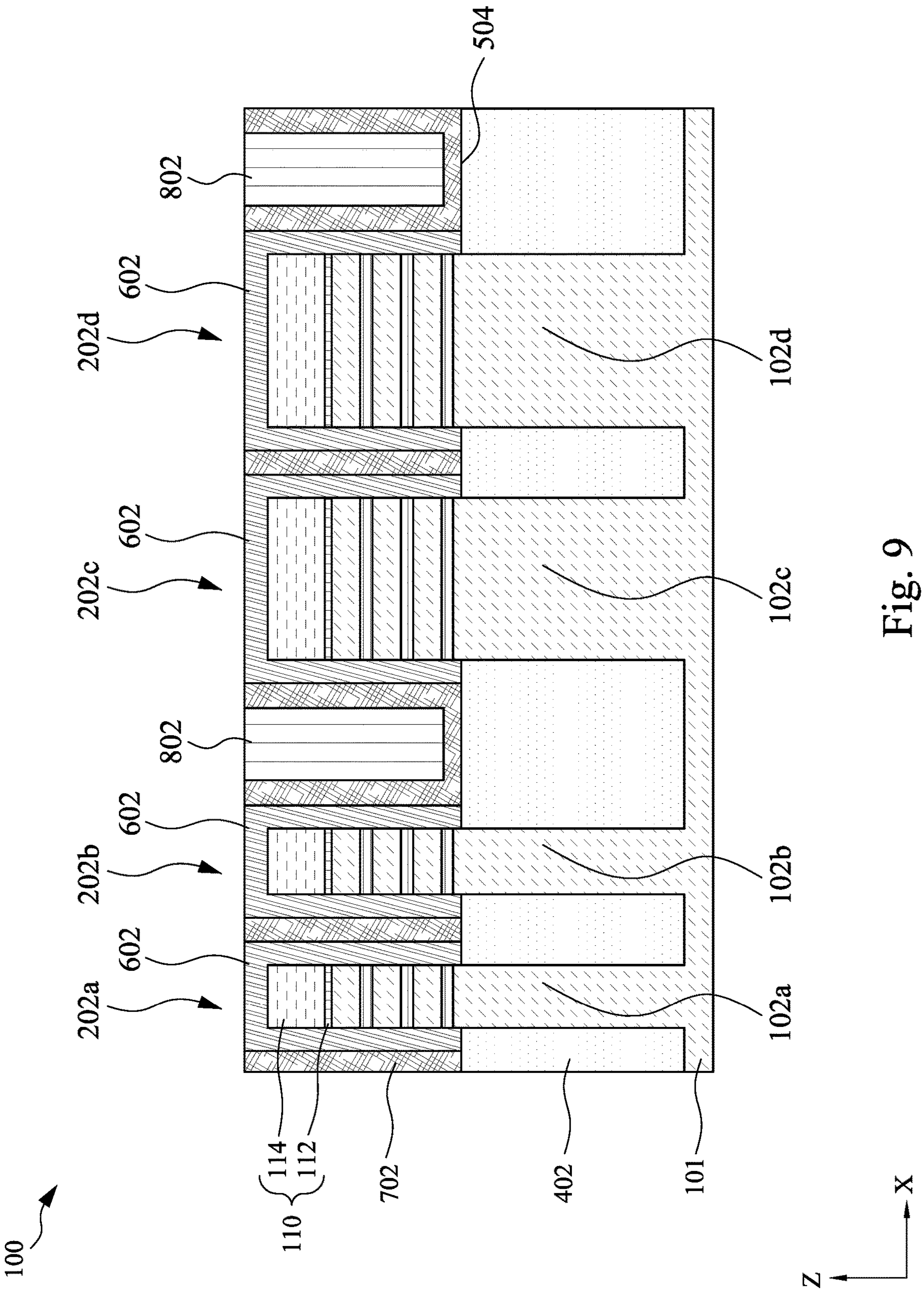

Next, as shown in FIG. 9, a planarization process is performed to expose the cladding layer 602 disposed over the top of the fins 202*a*, 202*b*, 202*c*, 202*d*, the liner 702, and the low-K dielectric material 802. The planarization process may be any suitable process, such as a CMP process. The planarization process removes portions of the low-K dielectric material 802 and portions of the liner 702 disposed on the portions of the cladding layer 602 disposed over the top of the fins 202*a*, 202*b*, 202*c*, 202*d*.

Figure 10:
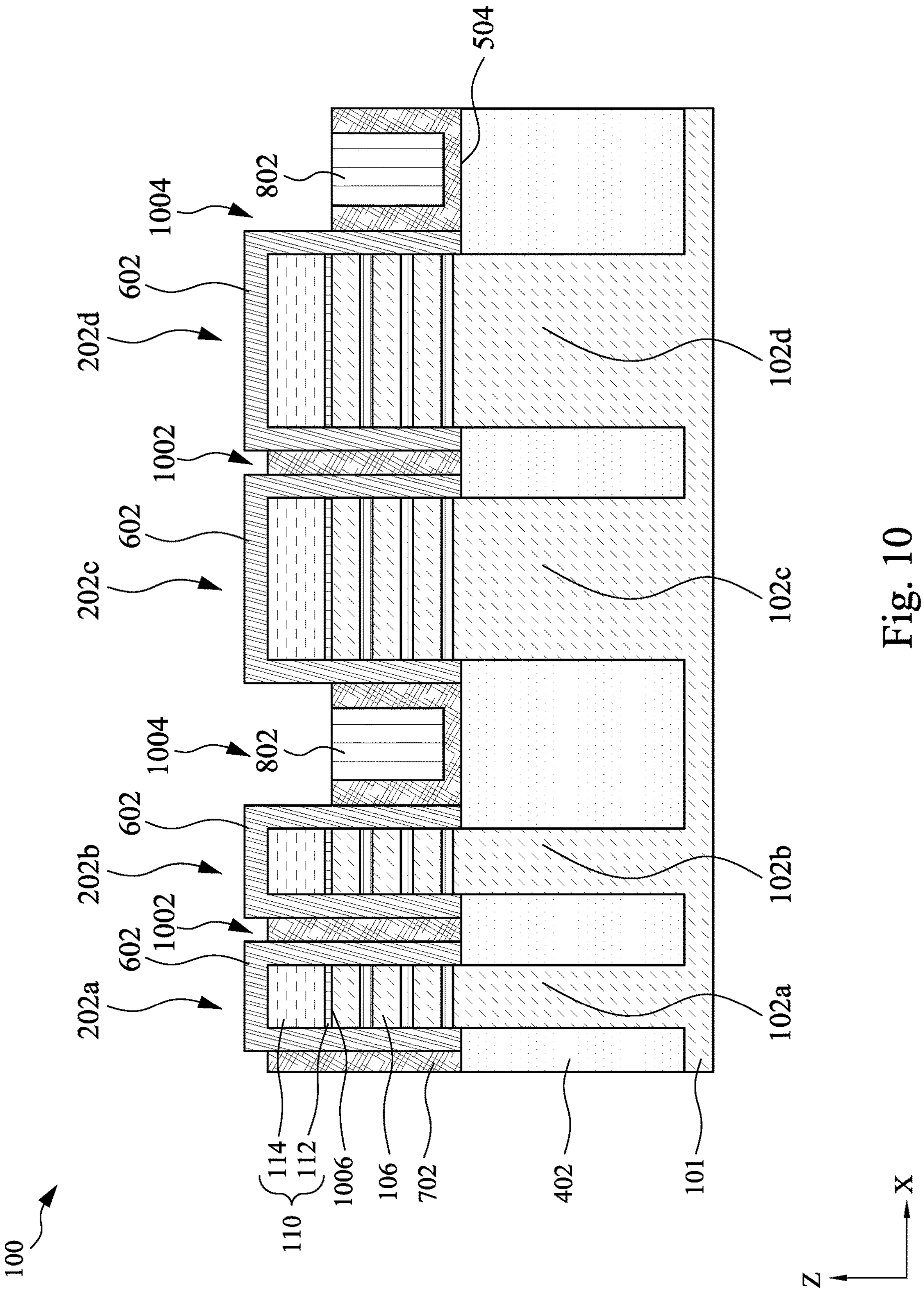

Next, as shown in FIG. 10, the liners 702 and the low-K dielectric materials 802 are recessed. The recess of the liners 702 and the low-K dielectric materials 802 may be performed by any suitable process, such as dry etch, wet, etch, or a combination thereof. The recess process may be controlled so that the liner 702 and the low-K dielectric materials 802 in the trenches 606 (FIG. 6) are substantially at the same level as a top surface 1006 of the topmost first semiconductor layer 106 in the stack of semiconductor layers 104. The top surface 1006 of the topmost first semiconductor layer 106 may be in contact with the oxygen-containing layer 112 of the mask structure 110. Because the liner 702 and the low-K dielectric material 802 in the trenches 606 (FIG. 6) together have a larger dimension in the X direction compared to the liner 702 in the trenches 604 (FIG. 6), the etchant removes less of the liner 702 in the trenches 604 (FIG. 6) than the liner 702 and the low-K dielectric material 802 in the trenches 606 (FIG. 6). As a result, the liner 702 and the low-K dielectric material 802 in the trenches 606 are etched at a faster rate than the etch rate of the liner 702 in the trenches 604. Thus, the liner 702 in the trenches 604 (FIG. 6) may have a height in Z direction greater than a height of the liner 702 and the low-K dielectric material 802 in the trenches 606 (FIG. 6). In some embodiments, the liner 702 and the low-K dielectric material 802 include the same material, and a single etch process may be performed to recess both the liner 702 and the low-K dielectric material 802. The etch process may be a selective etch process that does not remove the semiconductor material of the cladding layer 602. In some embodiments, the liner 702 and the low-K dielectric material 802 include different materials, and a first etch process may be performed to recess the low-K dielectric material 802 followed by a second etch process to recess the liner 702 in trenches 604, 606. The etch processes may be selective etch processes that do not remove the semiconductor material of the cladding layer 602. As a result of the recess process, trenches 1002 are formed between the fins 202*a*, 202*b*, and between the fins 202*c*, 202*d*, and trenches 1004 are formed between the fins 202*b*, 202*c*, and between the fin 202*d* and an adjacent fin (not shown). As shown in FIG. 10, the trenches 1002 are shallower than the trenches 1004.

Figure 11:
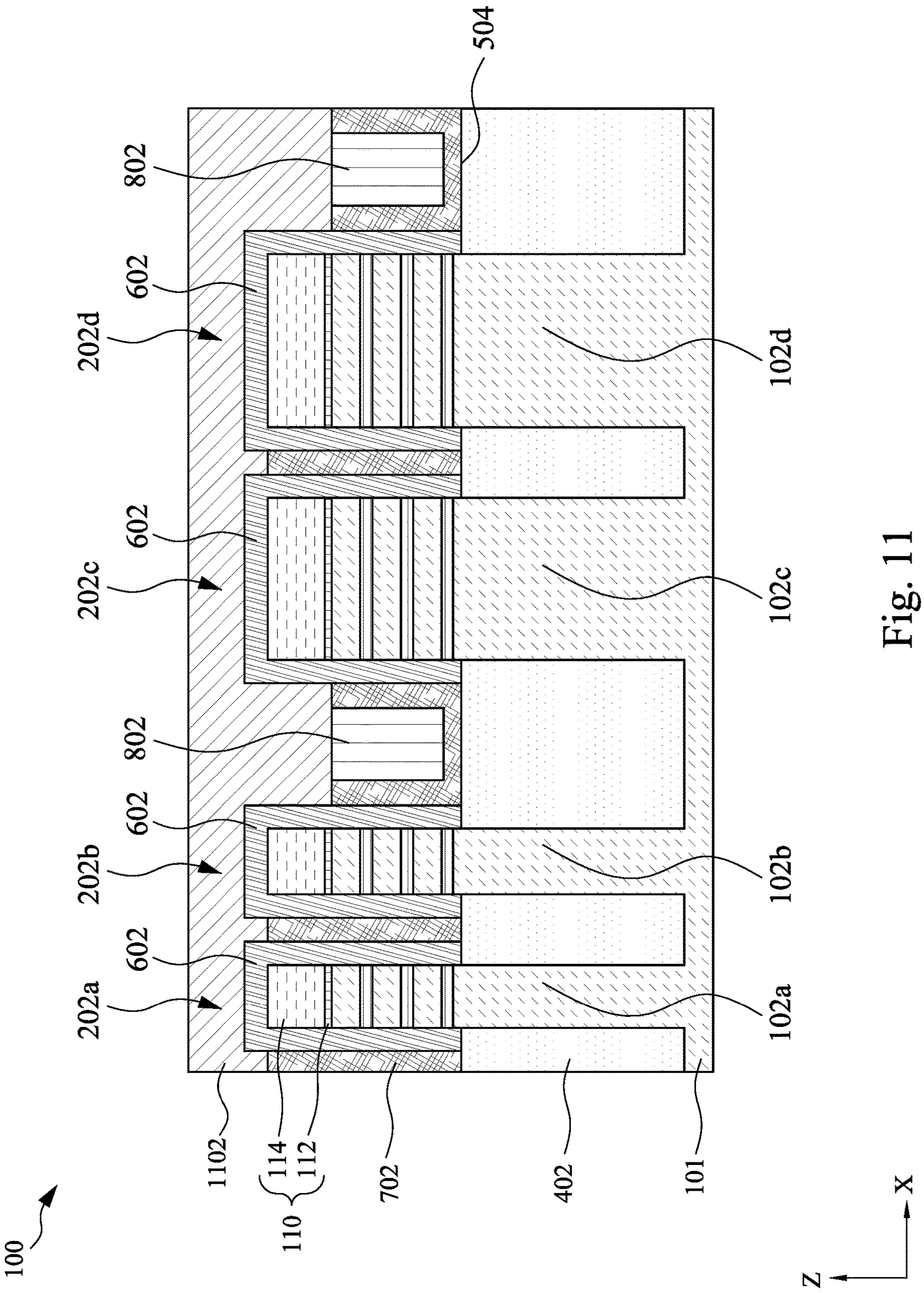

Next, as shown in FIG. 11, a high-K dielectric material 1102 is formed in the trenches 1002, 1004 and over the fins 202*a*, 202*b*, 202*c*, 202*d*. The high-K dielectric material 1102 may include a material having a K value greater than 7, such as $HfO_2$, $ZrO_2$, $HfAlO_x$, $HfSiO_x$, or $Al_2O_3$. The high-K dielectric material 1102 may be formed by any suitable process, such as a CVD, PECVD, FCVD, or ALD process. The high-K dielectric material 1102 may have a thickness ranging from about 5 nm to about 30 nm. The high-K dielectric material 1102 may fill the trenches 1002, 1004. Thus, if the thickness of the high-K dielectric material 1102 is less than about 5 nm, the trenches 1004 may not be filled. On the other hand, if the thickness of the high-K dielectric material 1102 is greater than about 20 nm, the manufacturing cost is increased without significant advantage.

Figure 12:
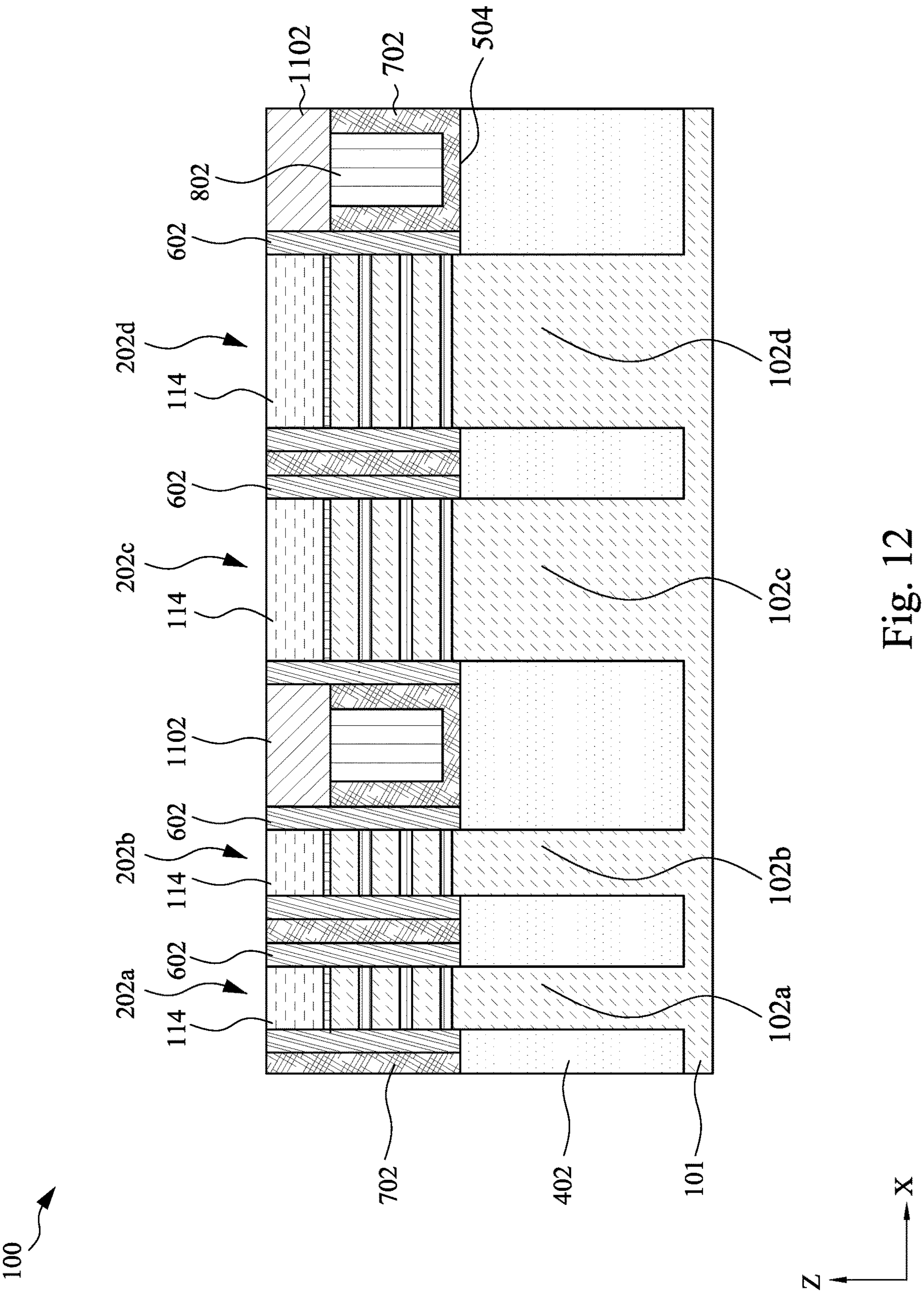

A planarization process is performed to expose the nitrogen-containing layer 114, the cladding layer 602, the liner 702, and the high-K dielectric material 1102, as shown in FIG. 12. The planarization process may be any suitable process, such as a CMP process. The planarization process removes portions of the high-K dielectric material 1102 and portions of the cladding layer 602 disposed over the top of the fins 202*a*, 202*b*, 202*c*, 202*d*.

Figure 13:
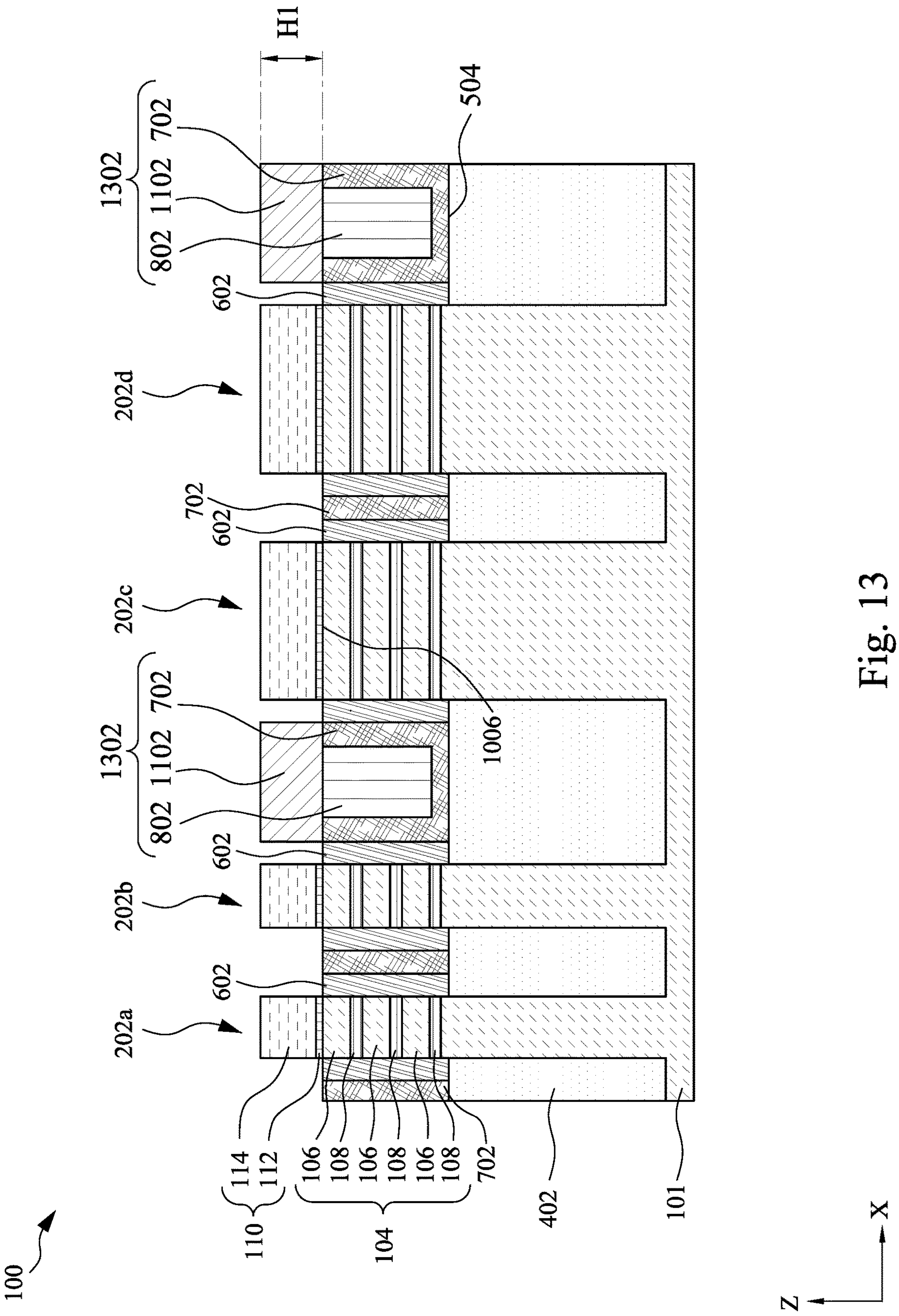

Next, as shown in FIG. 13, the cladding layer 602 and the liner 702 are recessed to substantially the same level as the low-K dielectric material 802 (e.g., the top surfaces of the cladding layer 602 and the liner 702 are substantially co-planar with the top surface of the low-K dielectric material 802). The recess process may be one or more etch processes, such as dry etch, wet etch, or a combination thereof. In some embodiments, a first etch process is performed to recess the liner 702, followed by a second etch process to recess the cladding layer 602. The first and second etch processes may be selective etch processes that do not remove the nitrogen-containing layer 114 and the high-K dielectric material 1102. As a result of the recess processes, the liners 702 are formed between the stacks of semiconductor layers 104 of the fins 202*a*, 202*b*, and between the stacks of semiconductor layers 104 of the fins 202*c*, 202*d*. As shown in FIG. 13, the high-K dielectric material 1102, the low-K dielectric material 802, and the liner 702 in the trenches 606 (FIG. 6) together may be referred to as a dielectric feature 1302. The dielectric feature 1302 may be the wide dielectric feature described above that can separate the S/D epitaxial features 2002 (FIG. 20A) of different devices, and the liner 702 may be the narrow dielectric feature that may or may not be present between the channel regions of the adjacent fins 202*a*, 202*b*. In some embodiments, the dielectric feature 1302 is a hybrid fin. The high-K dielectric material 1102 of the dielectric feature 1302 has a height H1 ranging from about 10 nm to 30 nm. The high-K dielectric material 1102 of the dielectric feature 1302 may be utilized to separate, or cut-off, the gate electrode layers. Thus, if the height H1 is less than about 10 nm, the gate electrode layers may not be sufficiently cut-off. On the other hand, if the height H1 is greater than about 30 nm, the manufacturing cost is increased without significant advantage.

Figure 14:
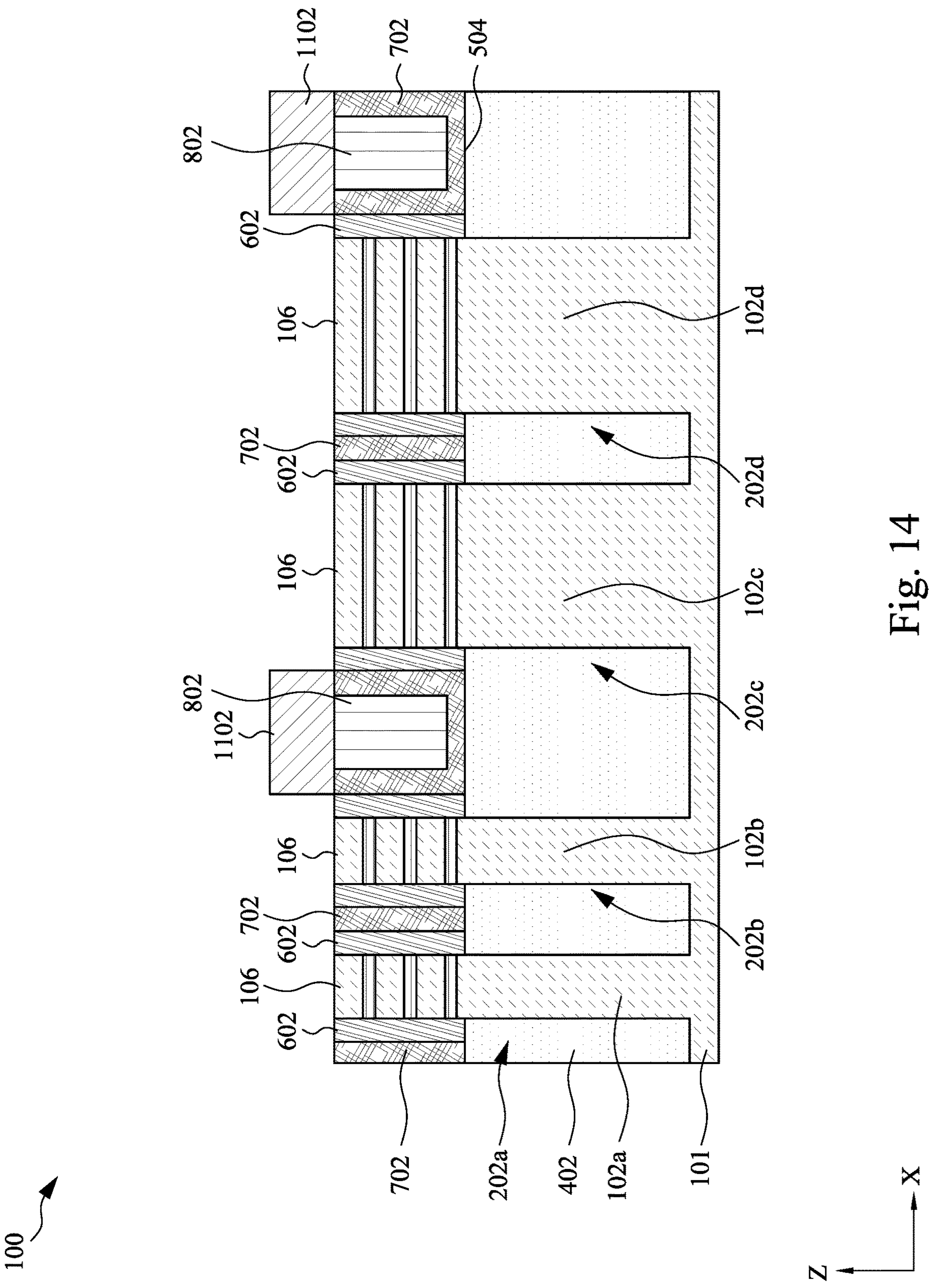

The mask structures 110 (FIG. 13) are then removed, as shown in FIG. 14. The removal process may be one or more etch processes, such as dry etch, wet etch, or a combination thereof. In some embodiments, a first etch process is performed to remove the nitrogen-containing layer 114 (FIG. 13), followed by a second etch process to remove the oxygen-containing layer 112 (FIG. 13). The first and second etch processes may be selective etch processes that do not remove the liner 702, the cladding layer 602, the first semiconductor layer 106, and the high-K dielectric material 1102. As a result of the removal processes, the semiconductor device structure 100 may have a substantially planar surface having the high-K dielectric materials 1102 extending therefrom.

Figure 15:
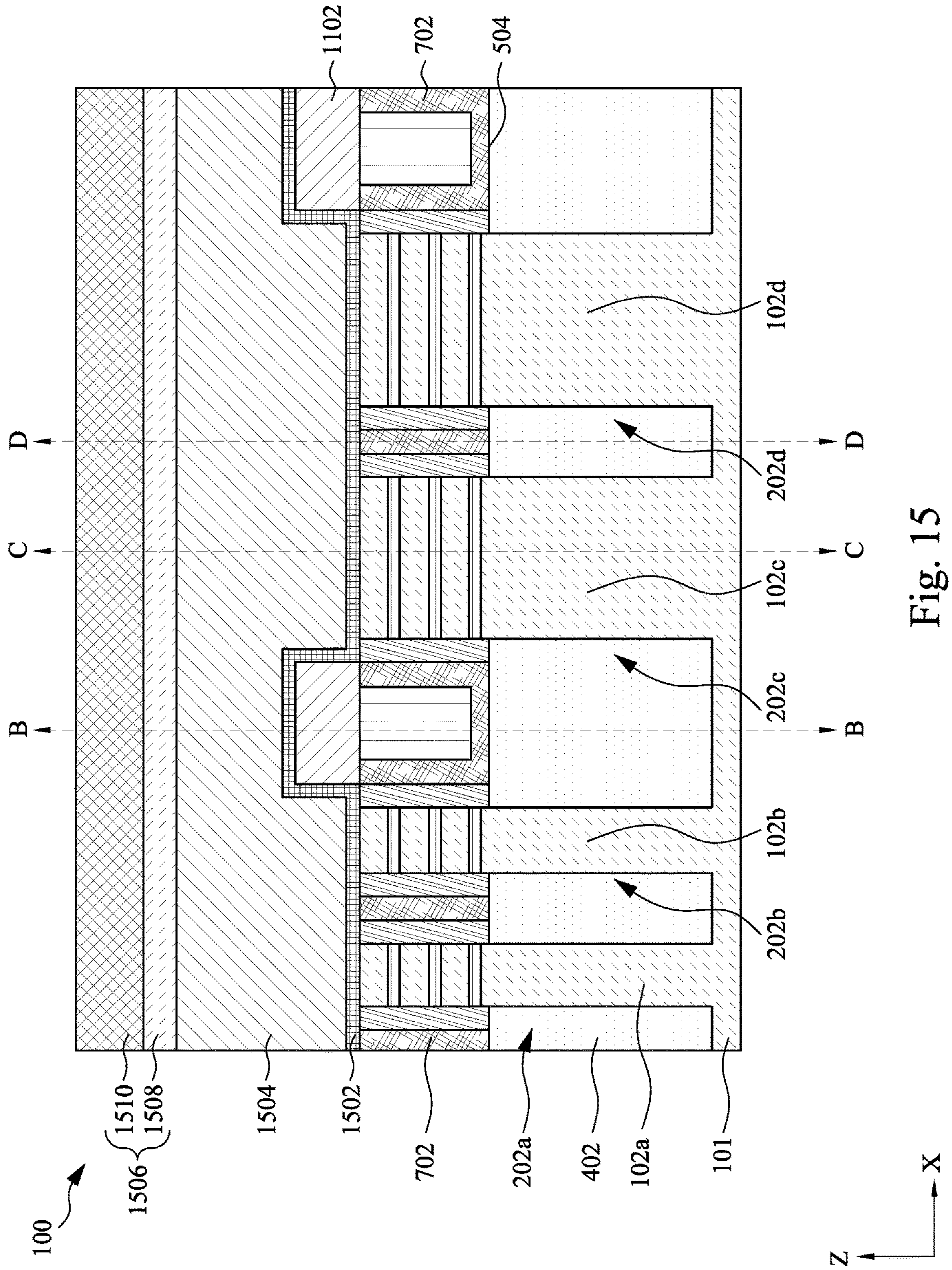

Next, as shown in FIG. 15, a sacrificial gate dielectric layer 1502 is formed on the substantially planar surface of the semiconductor device structure 100 and on the high-K dielectric materials 1102. The sacrificial gate dielectric layer 1502 may include one or more layers of dielectric material, such as $SiO_2$, SiN, a high-K dielectric material, and/or other suitable dielectric material. In some embodiments, the sacrificial gate dielectric layer 1502 includes a material different than that of the high-K dielectric material 1102. In some embodiments, the sacrificial gate dielectric layer 1502 may be deposited by a CVD process, a sub-atmospheric CVD (SACVD) process, a FCVD process, an ALD process, a PVD process, or other suitable process. By way of example, the sacrificial gate dielectric layer 1502 may be used to prevent damages to the fins 202*a*, 202*b*, 202*c*, 202*d* by subsequent processes (e.g., subsequent formation of the sacrificial gate stack). A sacrificial gate electrode layer 1504 and a mask structure 1506 are formed on the sacrificial gate dielectric layer 1502. The sacrificial gate electrode layer 1504 may include polycrystalline silicon (polysilicon). The mask structure 1506 may include an oxygen-containing layer 1508 and a nitrogen-containing layer 1510. In some embodiments, the sacrificial gate electrode layer 1504 and the mask structure 1506 are formed by various processes such as layer deposition, for example, CVD (including both LPCVD and PECVD), PVD, ALD, thermal oxidation, e-beam evaporation, or other suitable deposition techniques, or combinations thereof.

FIGS. 16A-20A are cross-sectional side views of various stages of manufacturing the semiconductor device structure taken along line A-A of FIG. 5, in accordance with some embodiments. FIGS. 16B-20B are cross-sectional side views of various stages of manufacturing the semiconductor device structure taken along line B-B of FIG. 15, in accordance with some embodiments. FIGS. 16C-20C are cross-sectional side views of various stages of manufacturing the semiconductor device structure taken along line C-C of FIG. 15, in accordance with some embodiments. FIGS. 16D-20D are cross-sectional side views of various stages of manufacturing the semiconductor device structure taken along line D-D of FIG. 15, in accordance with some embodiments. As shown in FIGS. 16A-16D, portions of the sacrificial gate dielectric layer 1502, the sacrificial gate electrode layer 1504, and the mask structure 1506 are removed to form a sacrificial gate stack 1512. The sacrificial gate stack 1512 includes the sacrificial gate dielectric layer 1502, the sacrificial gate electrode layer 1504, and the mask structure 1506, as shown in FIGS. 16B-16D.

Figure 16A:
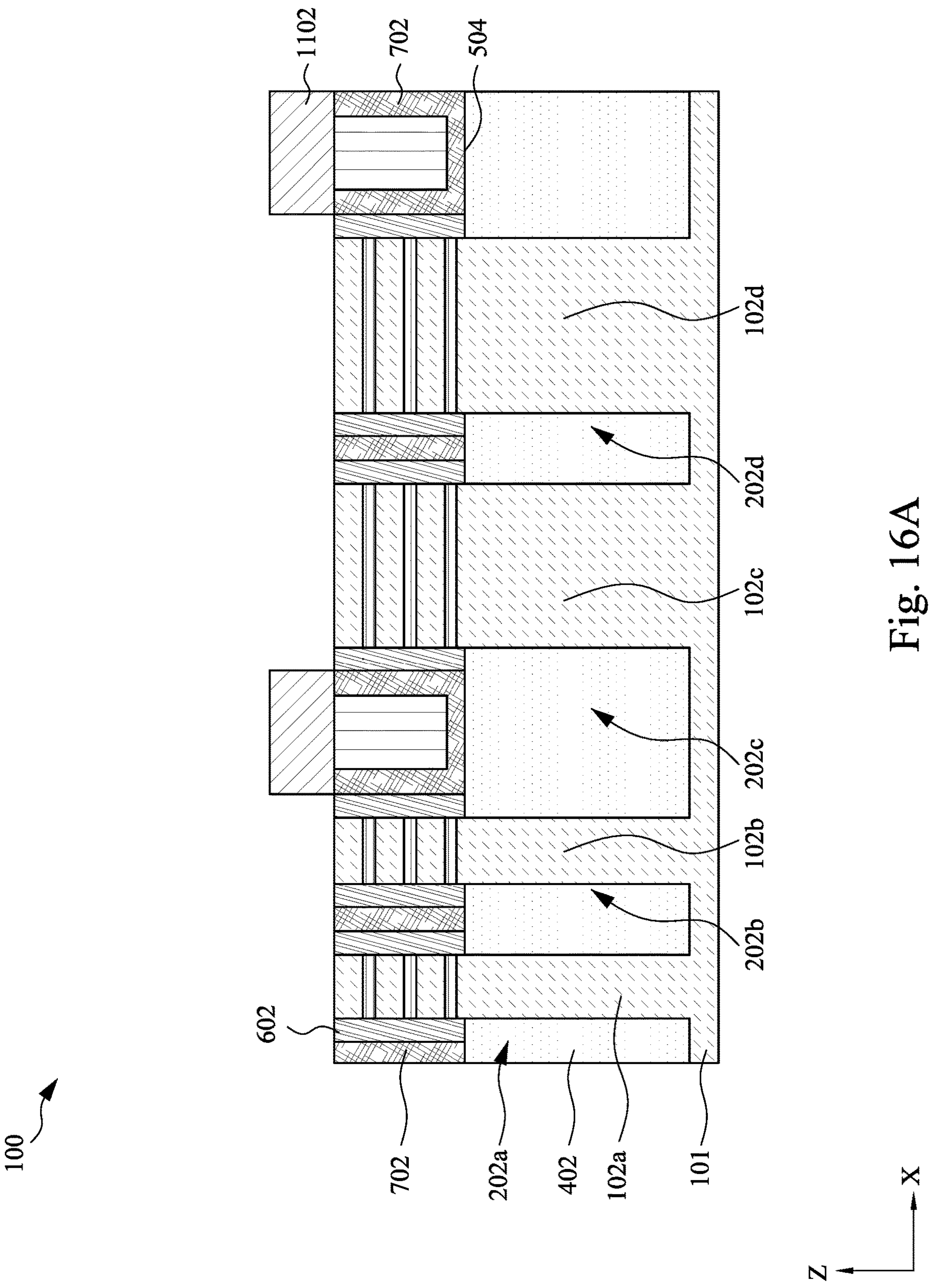
Figure 16C:
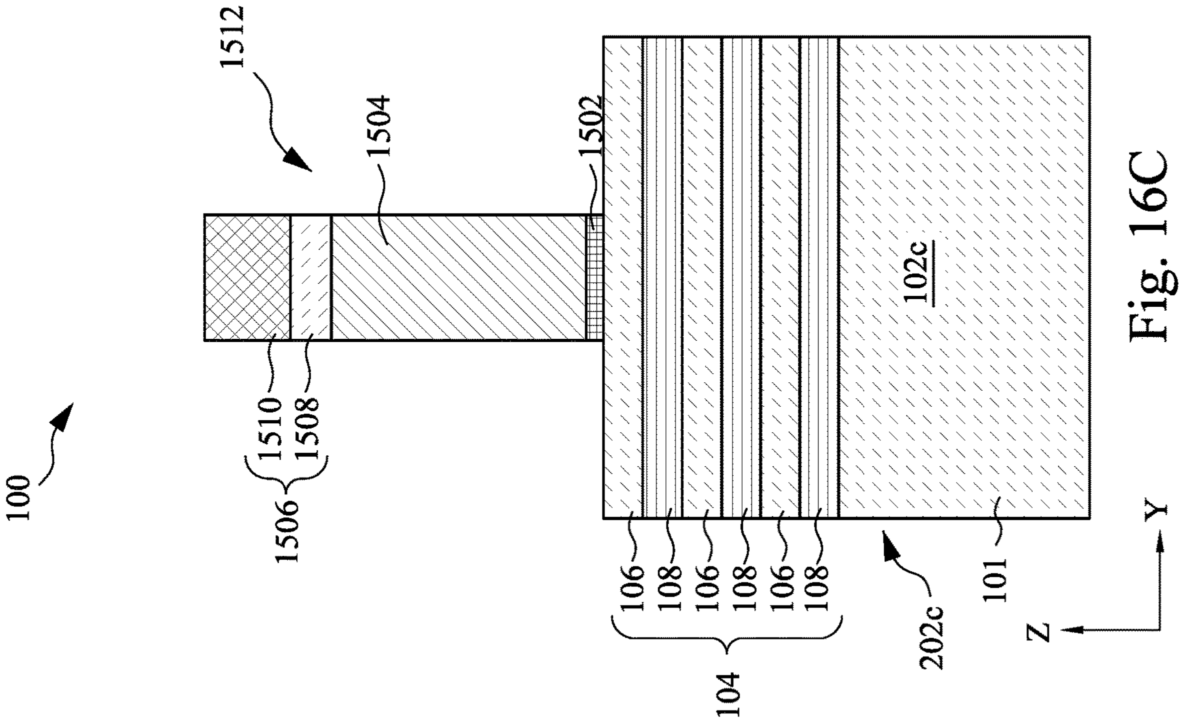
Figure 16B:
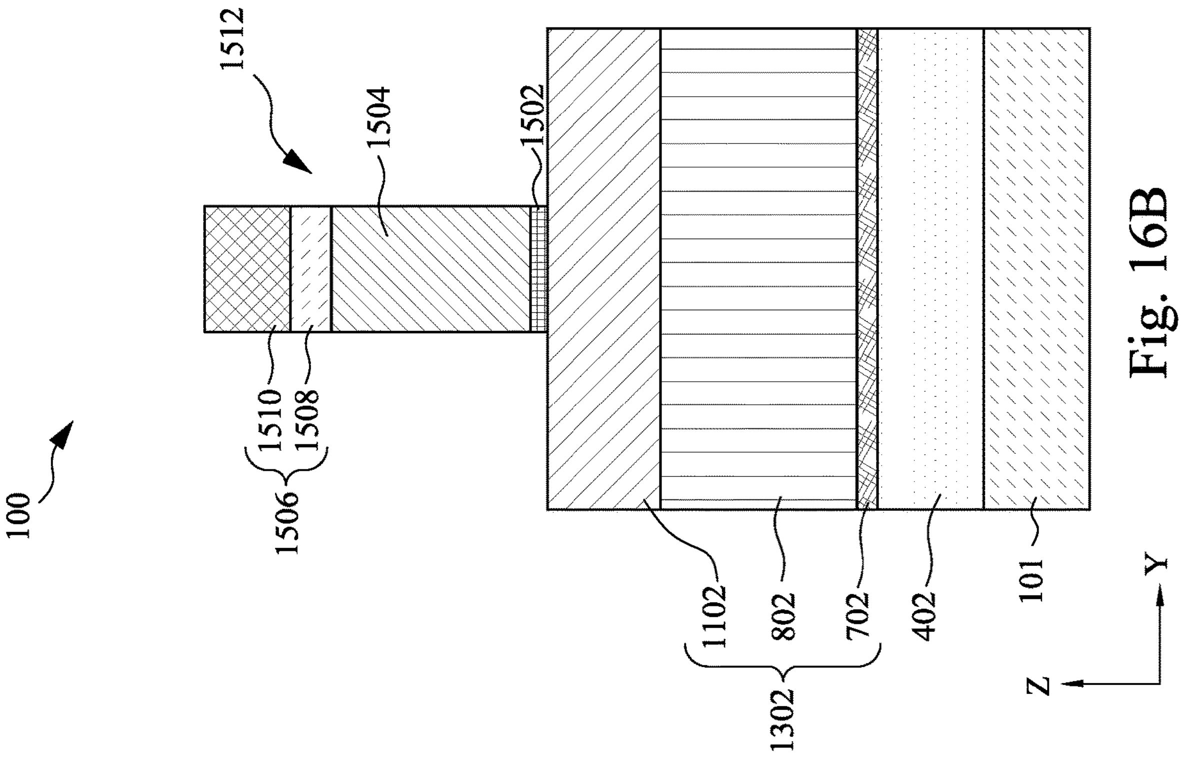
Figure 16D:
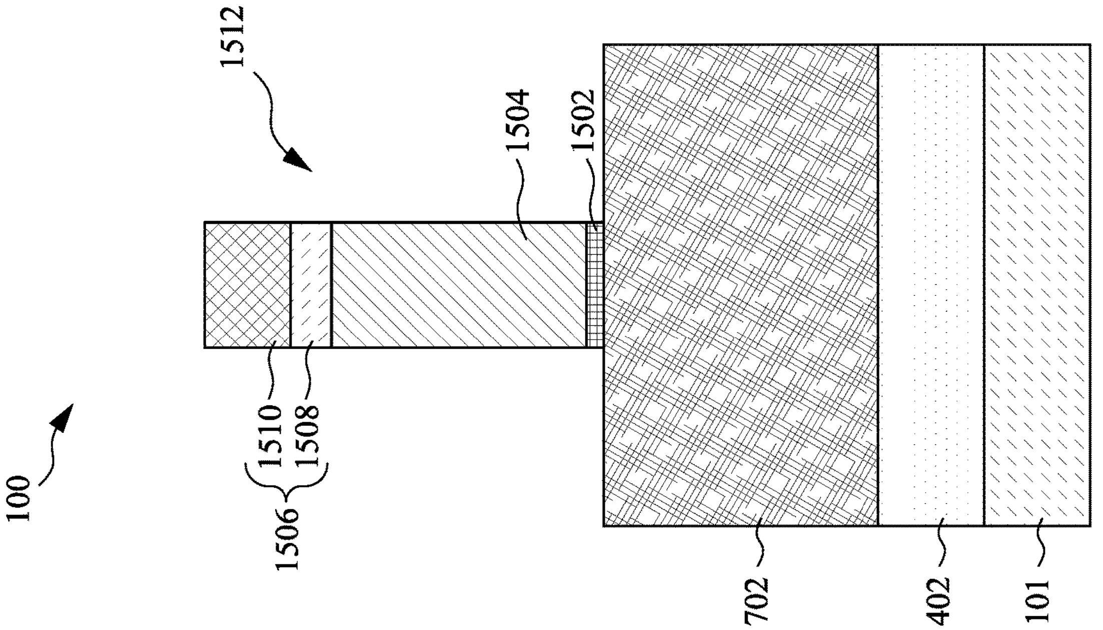

The sacrificial gate stack 1512 may be formed by patterning and etching processes. For example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, other etching methods, and/or combinations thereof. By patterning the sacrificial gate stack 1512, the stacks of semiconductor layers 104 of the fins 202*a*, 202*b*, 202*c*, 202*d* are partially exposed on opposite sides of the sacrificial gate stack 1512, as shown in FIG. 16C. As shown in FIGS. 16B, 16C, 16D, one sacrificial gate stack 1512 is formed, but the number of the sacrificial gate stacks 1512 is not limited to one. Two or more sacrificial gate stacks 1512 are arranged in the Y direction in some embodiments.

As shown in FIGS. 17A-17D, a spacer 1702 is formed on the sidewalls of the sacrificial gate stacks 1512. The spacer 1702 may be formed by first depositing a conformal layer that is subsequently etched back to form sidewall spacers 1702. For example, a spacer material layer can be disposed conformally on the exposed surfaces of the semiconductor device structure 100. The conformal spacer material layer may be formed by an ALD process. Subsequently, anisotropic etching is performed on the spacer material layer using, for example, RIE. During the anisotropic etching process, most of the spacer material layer is removed from horizontal surfaces, such as the tops of the fins 202*a*, 202*b*, 202*c*, 202*d*, the liner 702, the cladding layer 602, and the high-K dielectric material 1102, leaving the spacers 1702 on the vertical surfaces, such as the sidewalls of sacrificial gate stack 1512. The spacer 1702 may be made of a dielectric material such as silicon oxide, silicon nitride, silicon carbide, silicon oxynitride, SiCN, silicon oxycarbide, SiOCN, and/or combinations thereof. In some embodiments, the spacer 1702 includes multiple layers, such as main spacer walls, liner layers, and the like.

Figure 17A:
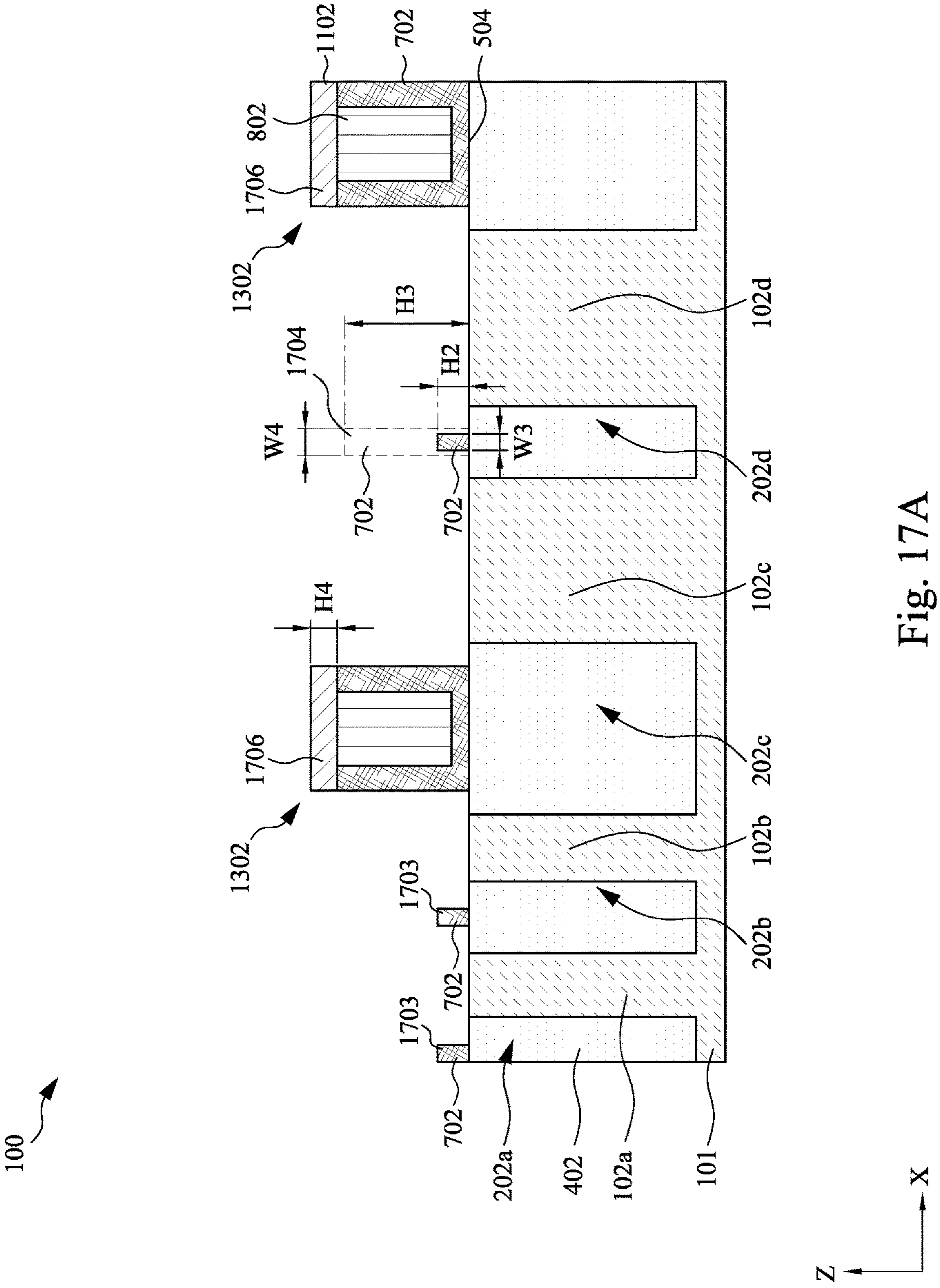

Next, exposed portions of the fins 202*a*, 202*b*, 202*c*, 202*d*, exposed portions of the cladding layers 602, and exposed portions of the liner 702 not covered by the sacrificial gate stack 1512 and the spacers 1702 are removed by using one or more suitable etch processes, such as dry etch, wet etch, or a combination thereof. In some embodiments, exposed portions of the stacks of semiconductor layers 104 (FIG. 16C) of the fins 202*a*, 202*b*, 202*c*, 202*d* are removed, exposing portions of the substrate portions 102*a*, 102*b*, 102*c*, 102*d*, respectively. As shown in FIG. 17A, the exposed portions of the fins 202*a*, 202*b*, 202*c*, 202*d* are recessed to a level at or below the top surface 504 of the insulating material 402, and the exposed liners 702 are recessed to having a height H2 ranging from about 0.5 nm to about 15 nm. The exposed portions of the liners 702 are recessed to the height H2 in order to facilitate the merging of adjacent S/D epitaxial features 2002 (FIG. 20A). Thus, if the height H2 of the liner 702 is greater than about 15 nm, the adjacent S/D epitaxial features may be prevented from being merged. In some embodiments, instead of recessing the exposed portion of the liner 702, the exposed portion of the liner 702 is removed (FIG. 29B). The one or more etch processes may include a first etch process that removes the exposed portions of the fins 202*a*, 202*b*, 202*c*, 202*d* and the exposed portions of the cladding layers 602. The first etch process may not be sufficient to recess the exposed portions of the liners 702 to the height H2 due to the different etch selectivity. A second etch process may be performed to further reduce the height of the liners 702 to the height H2. The liner 702 includes a first portion 1703 having the height H2 and the second portion 1704 (shown in dotted lines in FIG. 17A and in FIG. 17D) under the sacrificial gate stack 1512 that may have a height H3 greater than the height H2. The first portion 1703 of the liner 702 may be located between S/D regions, which is subsequently defined by the S/D epitaxial features 2002 (FIG. 20A), and the second portion 1704 of the liner 702 that is under the sacrificial gate stack 1512 may be located between the channel regions. The first portion 1703 of the liner 702 may not be present, as shown in FIG. 29B. Furthermore, the one or more etch processes may reduce the width of the first portion 1703 of the liner 702. In some embodiments, the first portion 1703 of the liner 702 has a width W3 that is less than a width W4 of the second portion 1704 of the liner 702, as shown in FIG. 17A. The width W4 may be less than about 10 nm. As described above, the second portion 1704 of the liner 702 between the channel regions may lead to reduced electrical resistance of the gate electrode layer 2802 (FIG. 28A). Thus, if the width W4 is greater than 10 nm, the second portion 1704 of the liner 702 may not be sufficient to reduce the electrical resistance of the gate electrode layer 2802 (FIG. 28A).

Figure 17C:
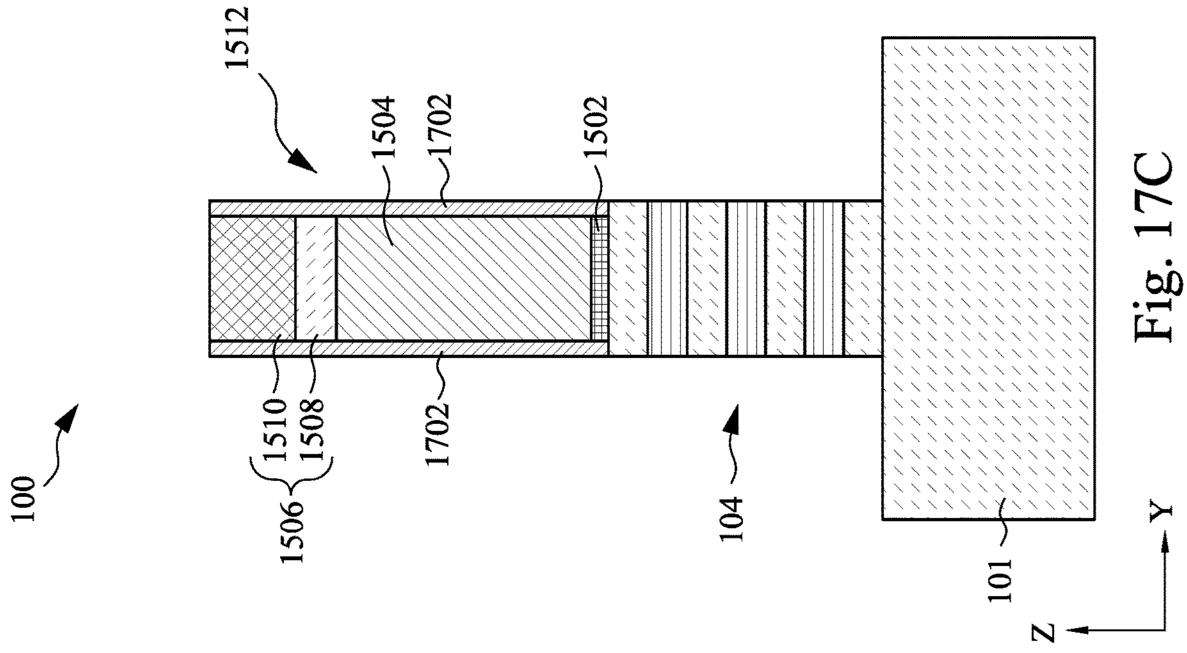
Figure 17B:
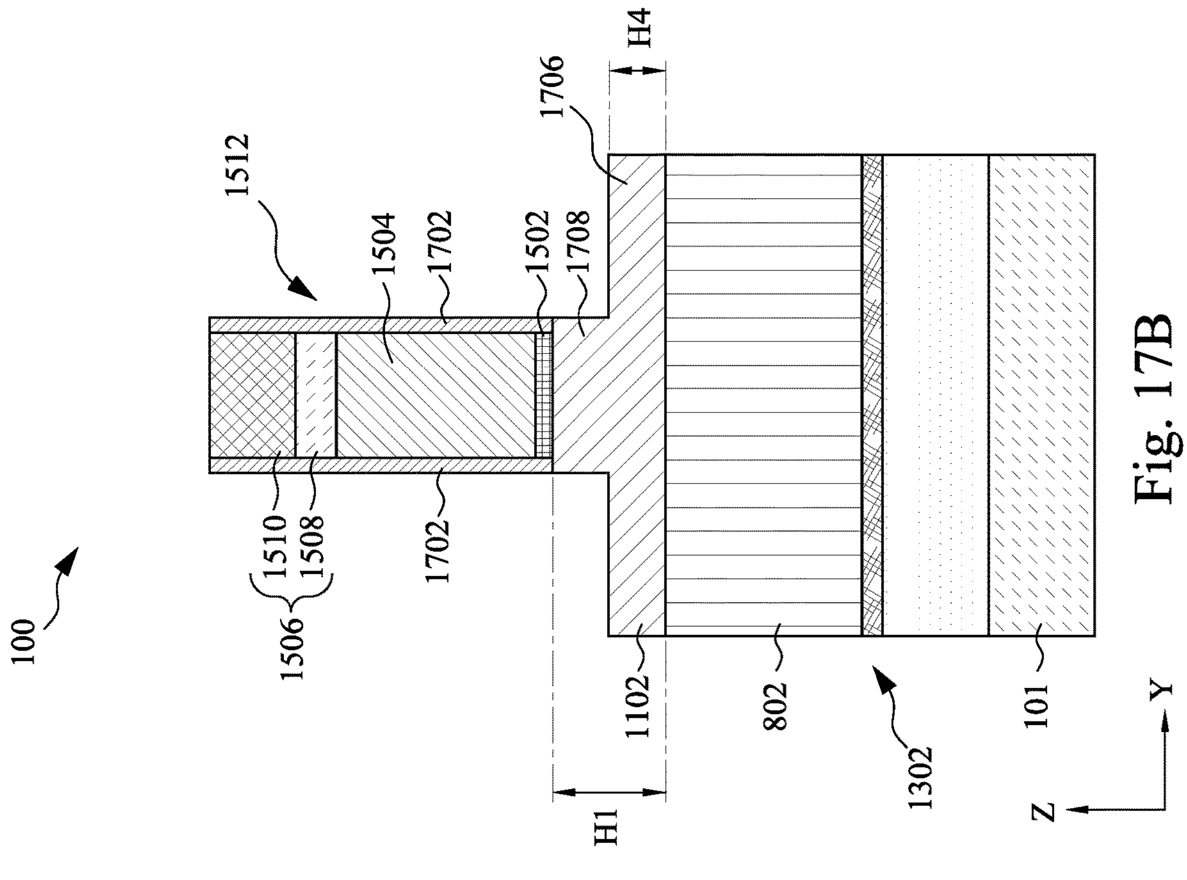
Figure 17D:
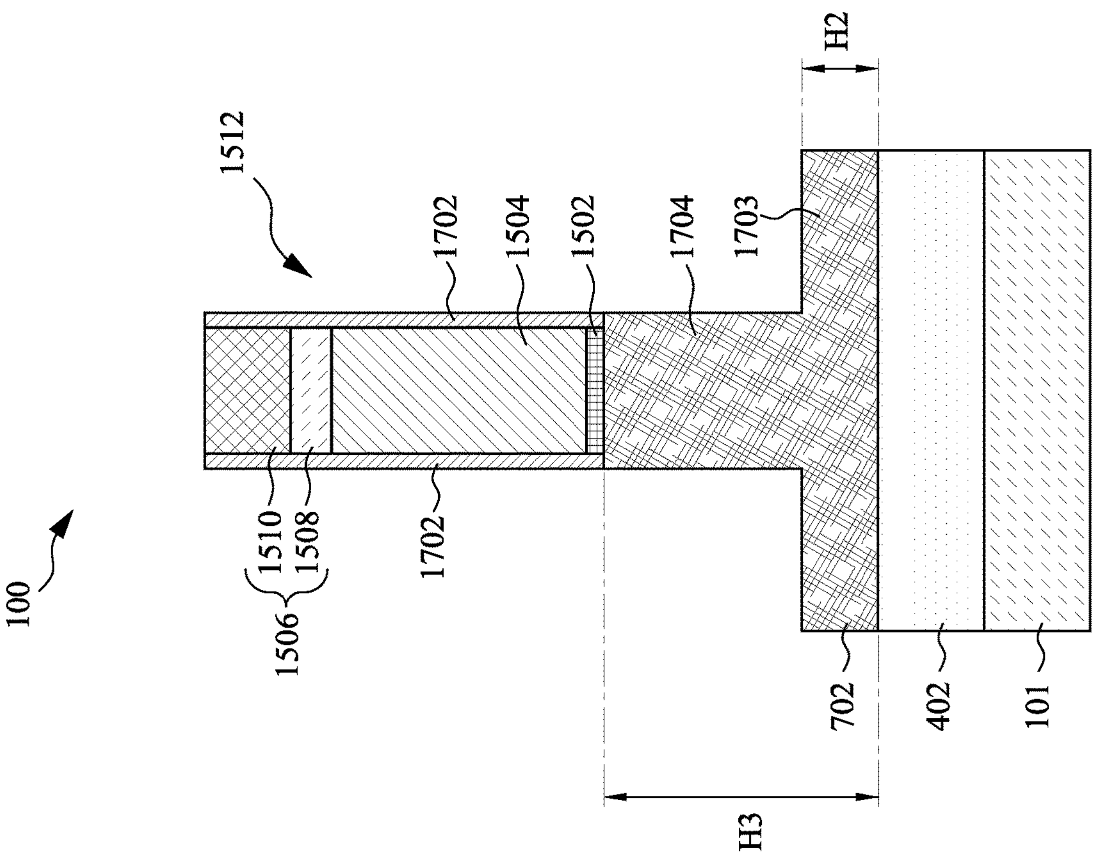
Figure 18A:
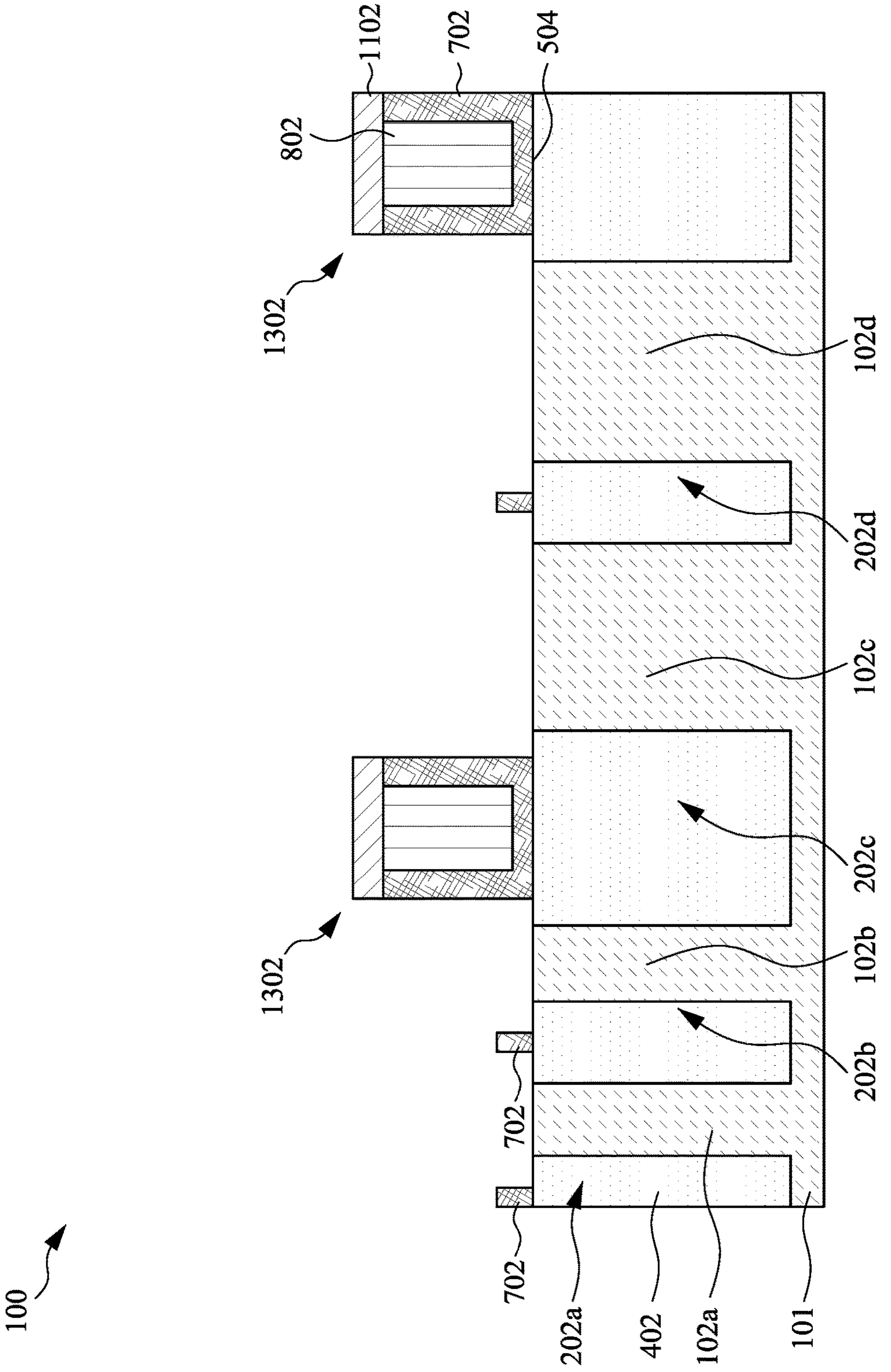
Figure 18C:
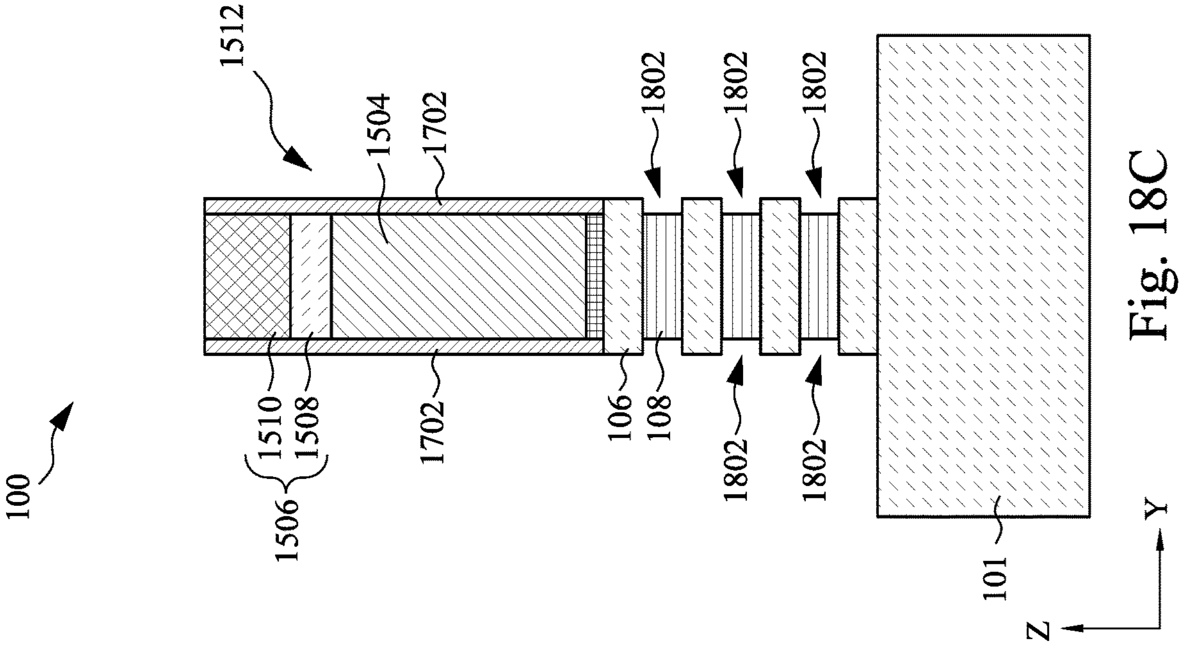
Figure 18B:
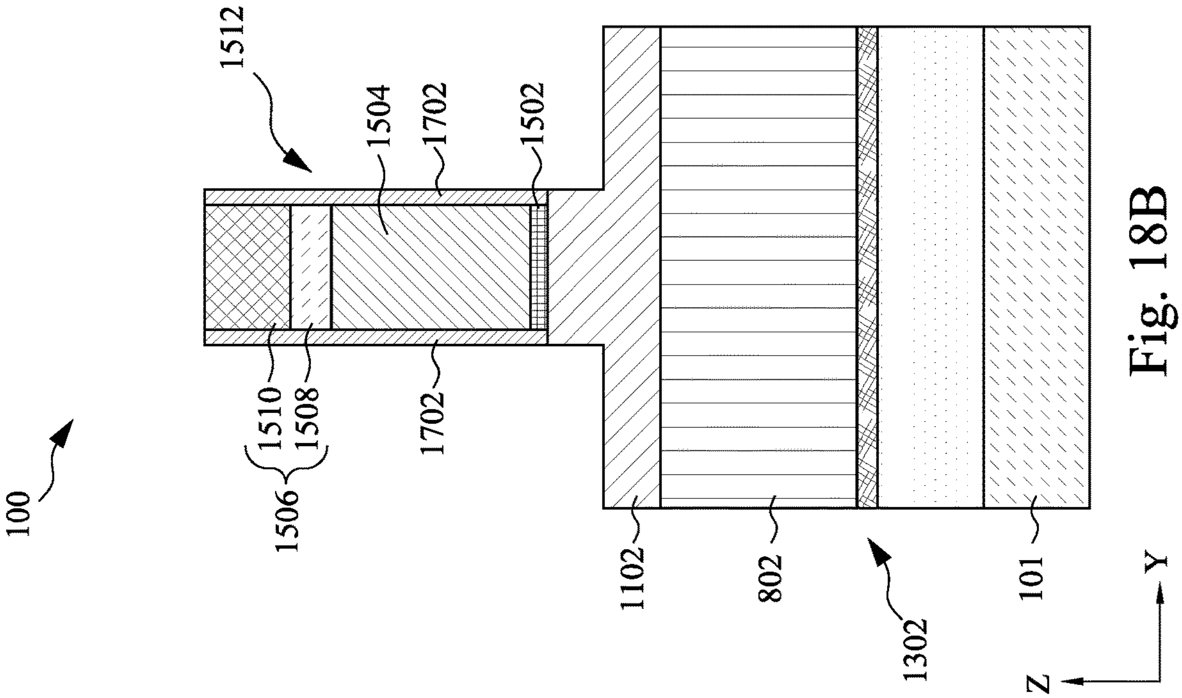
Figure 18D:
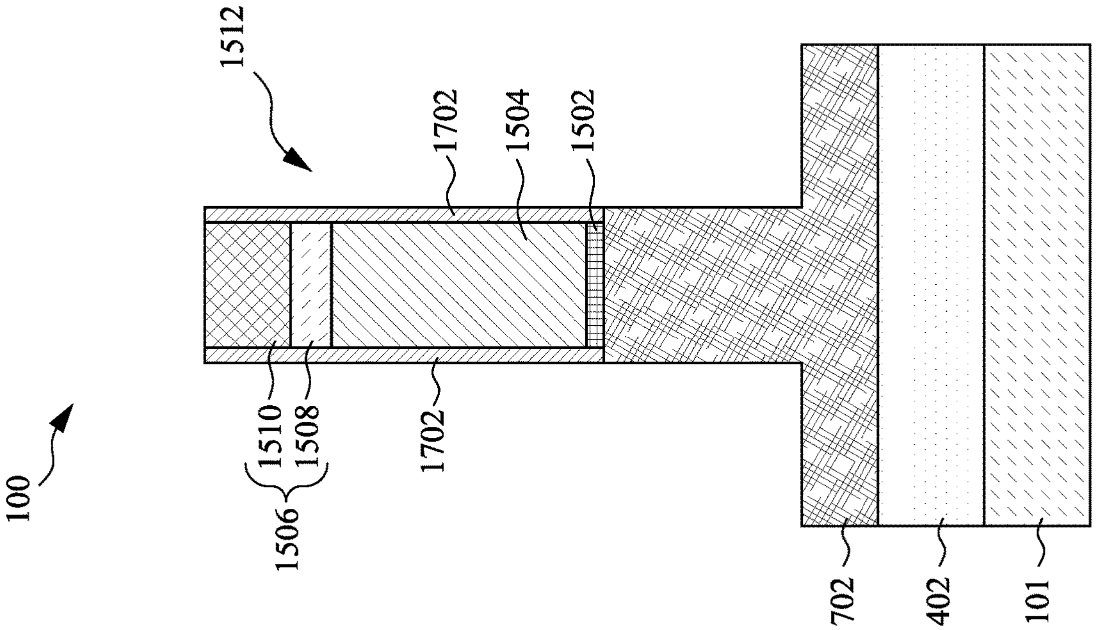
Figure 19A:
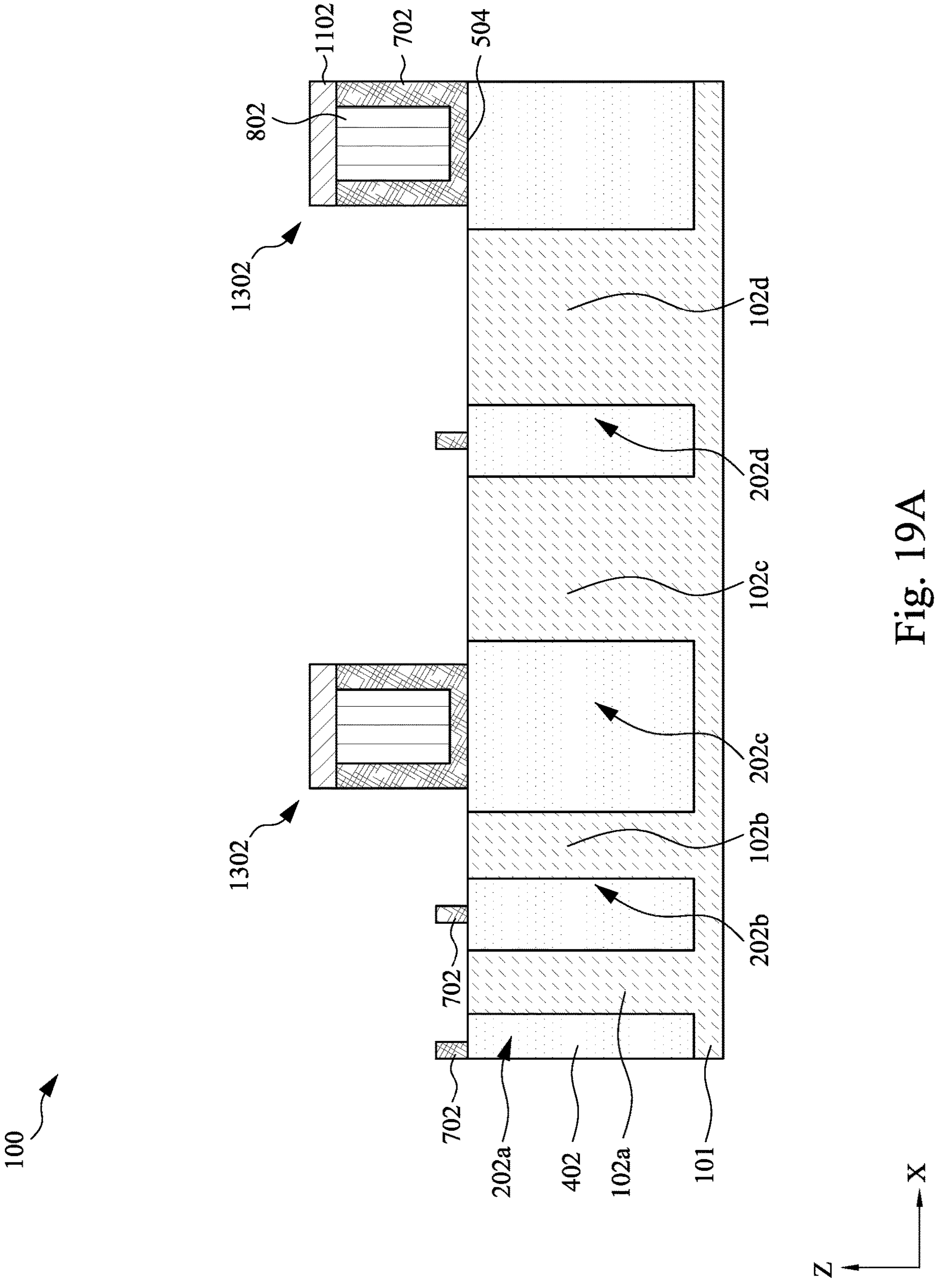
Figure 19C:
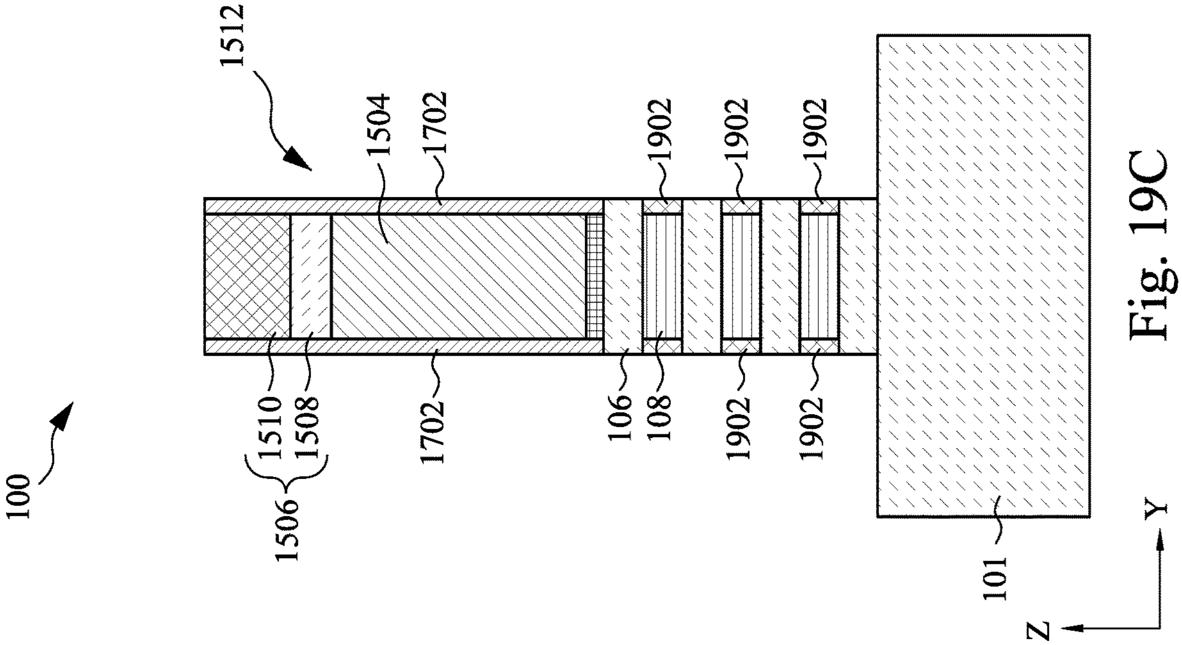
Figure 19B:
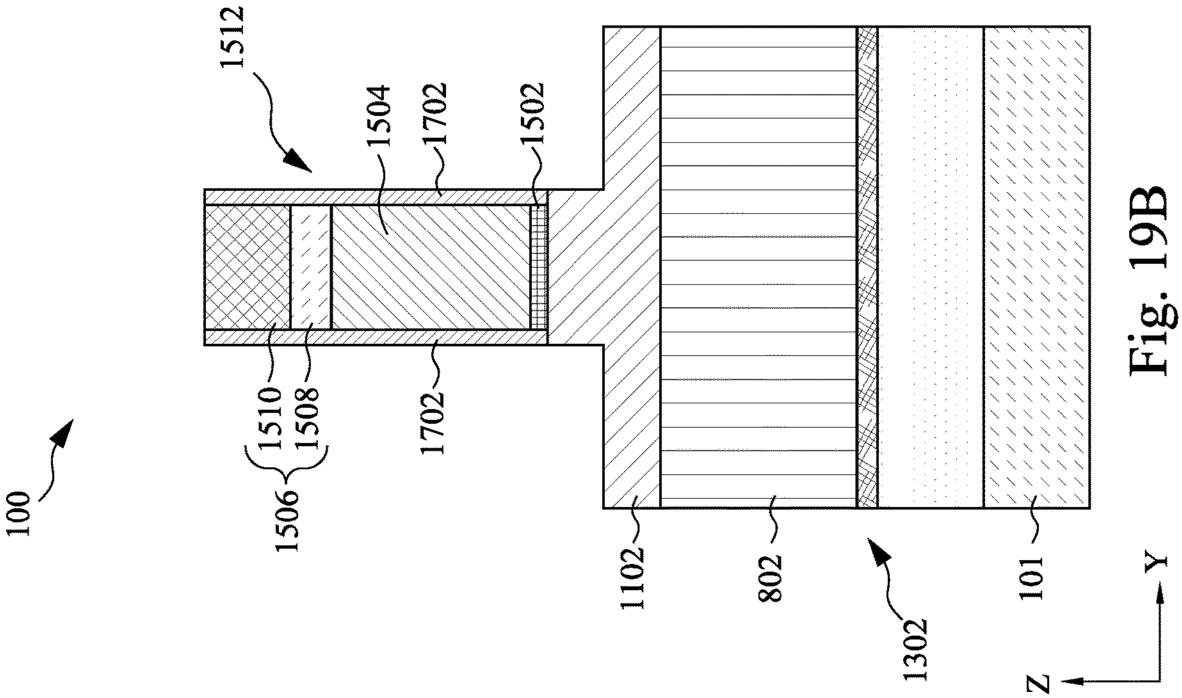
Figure 19D:
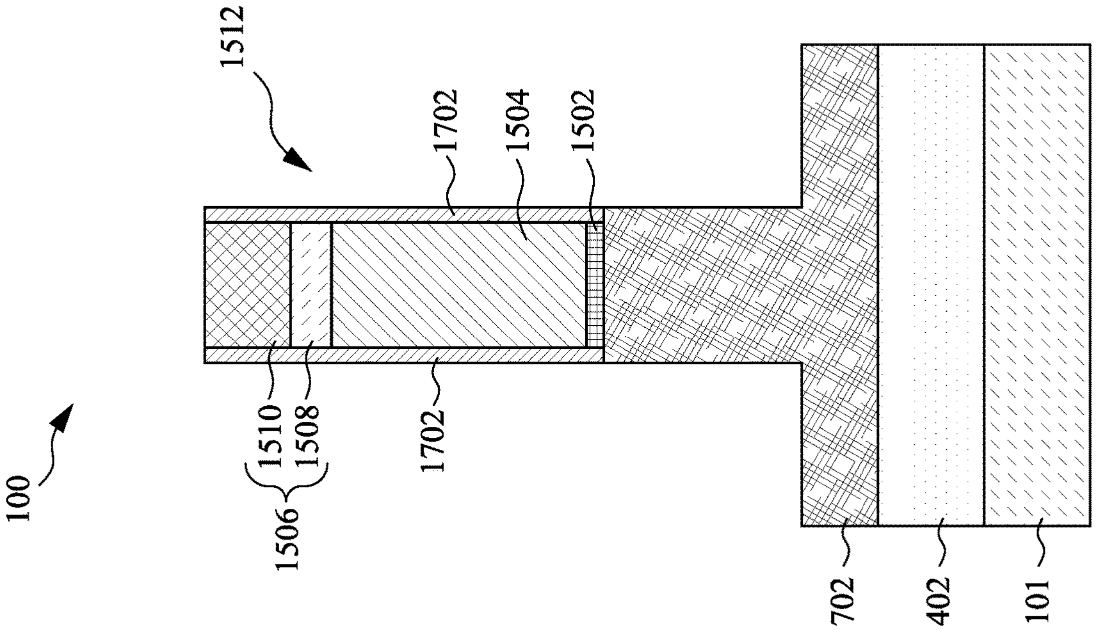

In some embodiments, the one or more etch processes may reduce the height of the exposed portion of the high-K dielectric material 1102 from H1 to H4, as shown in FIGS. 17A and 17B. Thus, the high-K dielectric material 1102 includes a first portion 1706 having the height H4 and a second portion 1708 having the height of H1 greater than the height H4, as shown in FIGS. 17A and 17B. The first portion 1706 of the high-K dielectric material 1102 may be located between S/D regions, and the second portion 1708 of the high-K dielectric material 1102 under the sacrificial gate stack 1512 may be located between channel regions. The second portion 1708 may be extending above a plane defined by the top surface 1006 of the topmost first semiconductor layer 106 (FIG. 13) by an amount equal to the height H1.

At this stage, end portions of the stack of semiconductor layers 104 under the sacrificial gate stack 1512 have substantially flat surfaces which may be flush with the spacers 1702, as shown in FIG. 17C. In some embodiments, the end portions of the stack of semiconductor layers 104 under the sacrificial gate stack 1512 are slightly horizontally etched.

Next, as shown in FIGS. 18A-18D, the edge portions of each second semiconductor layer 108 and the edge portions of the cladding layers 602 are removed, forming gaps 1802. In some embodiments, the portions of the second semiconductor layers 108 are removed by a selective wet etching process that does not remove the first semiconductor layers 106. For example, in cases where the second semiconductor layers 108 are made of SiGe, and the first semiconductor layers 106 are made of silicon, a selective wet etching including an ammonia and hydrogen peroxide mixtures (APM) may be used.

Next, as show in FIGS. 19A-19D, dielectric spacers 1902 are formed in the gaps 1802. In some embodiments, the dielectric spacers 1902 may be made of a low-K dielectric material, such as SiON, SiCN, SiOC, SiOCN, or SiN. In some embodiments, the dielectric spacers 1902 may be formed by first forming a conformal dielectric layer using a conformal deposition process, such as ALD, followed by an anisotropic etching to remove portions of the conformal dielectric layer other than the dielectric spacers 1902. The dielectric spacers 1902 may be protected by the first semiconductor layers 106 during the anisotropic etching process.

Figure 20C:
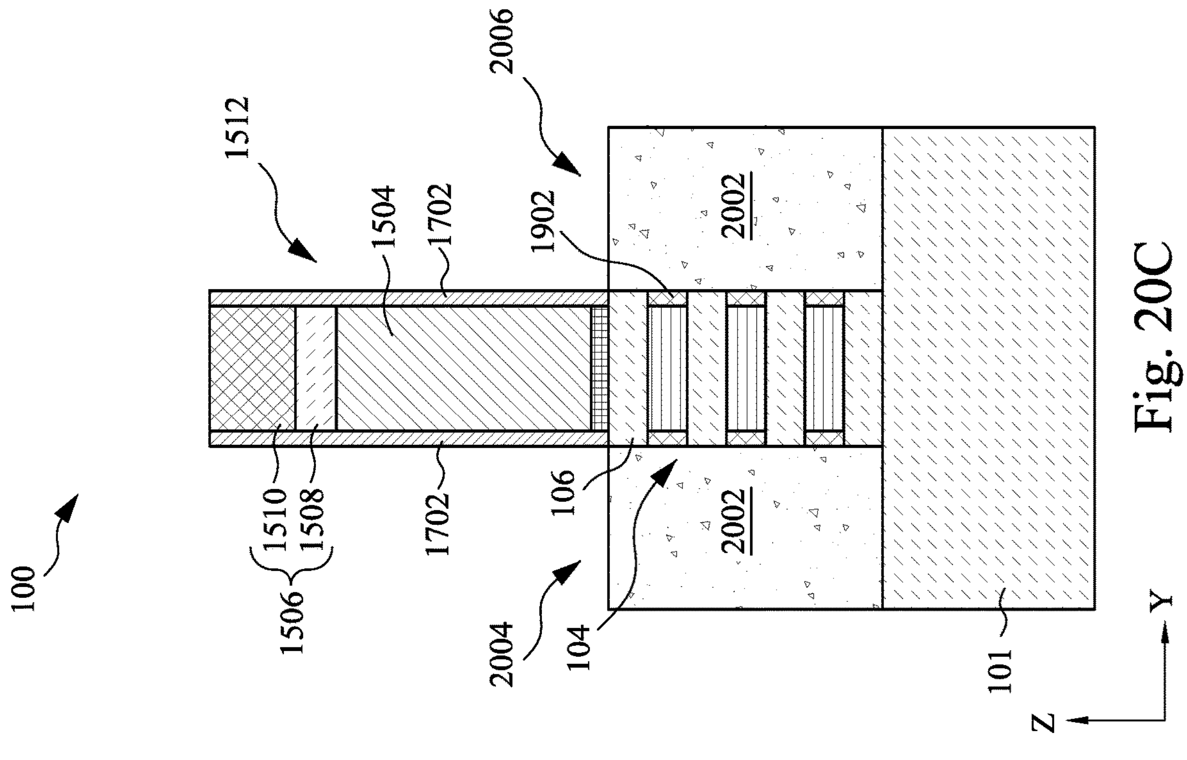

Next, as shown in FIGS. 20A-20D, S/D epitaxial features 2002 are formed on the substrate portions 102*a*, 102*b*, 102*c*, 102*d* of the fins 202*a*, 202*b*, 202*c*, 202*d*. The S/D epitaxial feature 2002 may include one or more layers of Si, SiP, SiC and SiCP for an n-channel FET or Si, SiGe, Ge for a p-channel FET. The S/D epitaxial features 2002 may grow both vertically and horizontally to form facets, which may correspond to crystalline planes of the material used for the substrate portions 102*a*, 102*b*, 102*c*, 102*d*. The S/D epitaxial features 2002 are formed by an epitaxial growth method using CVD, ALD or MBE. The S/D epitaxial features 2002 are in contact with the first semiconductor layers 106 and dielectric spacers 1902, as shown in FIG. 20C. The S/D epitaxial features 2002 may be the S/D regions. For example, one of a pair of S/D epitaxial features 2002 located on one side of the stack of semiconductor layers 104 is a source region 2004, and the other of the pair of S/D epitaxial features 2002 located on the other side of the stack of semiconductor layers 104 is a drain region 2006, as shown in FIG. 20C. A pair of S/D epitaxial features 2002 is referring to a source epitaxial feature 2002 and a drain epitaxial feature 2002 connected by the channels (i.e., the first semiconductor layers 106). In this disclosure, a source and a drain are interchangeably used, and the structures thereof are substantially the same.

As shown in FIG. 20A, the S/D epitaxial features 2002 formed from the fins 202*a*, 202*b* may be merged due to the small distance D1 between the fins 202*a*, 202*b* (FIG. 6). The first portion 1703 of the liners 702 between the S/D regions having the height H2 that does not prevent the adjacent S/D epitaxial features 2002 from merging with each other. The first portion 1703 may be positioned in an air gap 2010 located below the merged S/D epitaxial features 2002. In some embodiments, as shown in FIG. 20A, the first portion 1703 of the liner 702 may be positioned at a substantially midpoint between the substrate portion 102*a* and the substrate portion 102*b*. For example, as shown in FIG. 20A, the first portion 1703 of the liner 702 may be positioned a first distance D3 away from a plane defined by a sidewall 2008*a* of the substrate portion 102*a* and a second distance D4 away from a plane defined by a sidewall 2008*b* of the substrate portion 102*b*. The distance D3 may be substantially the same as the distance D4. In some embodiments, the first portion 1703 of the liner 702 is in contact with the merged S/D epitaxial features 2002, as shown in FIG. 20A. In some embodiments, the first portion 1703 of the liner 702 is not in contact with the merged S/D epitaxial features 2002. As described above, the S/D epitaxial feature 2002 formed from the substrate portion 102*b* of the fin 202*b* and the S/D epitaxial feature 2002 formed from the substrate portion 102*c* of the fin 202*c* may be for different devices. Thus, the S/D epitaxial feature 2002 formed from the substrate portion 102*b* of the fin 202*b* and the S/D epitaxial feature 2002 formed from the substrate portion 102*c* of the fin 202*c* are separated by the dielectric feature 1302, as shown in FIG. 20A.

Figure 21A:
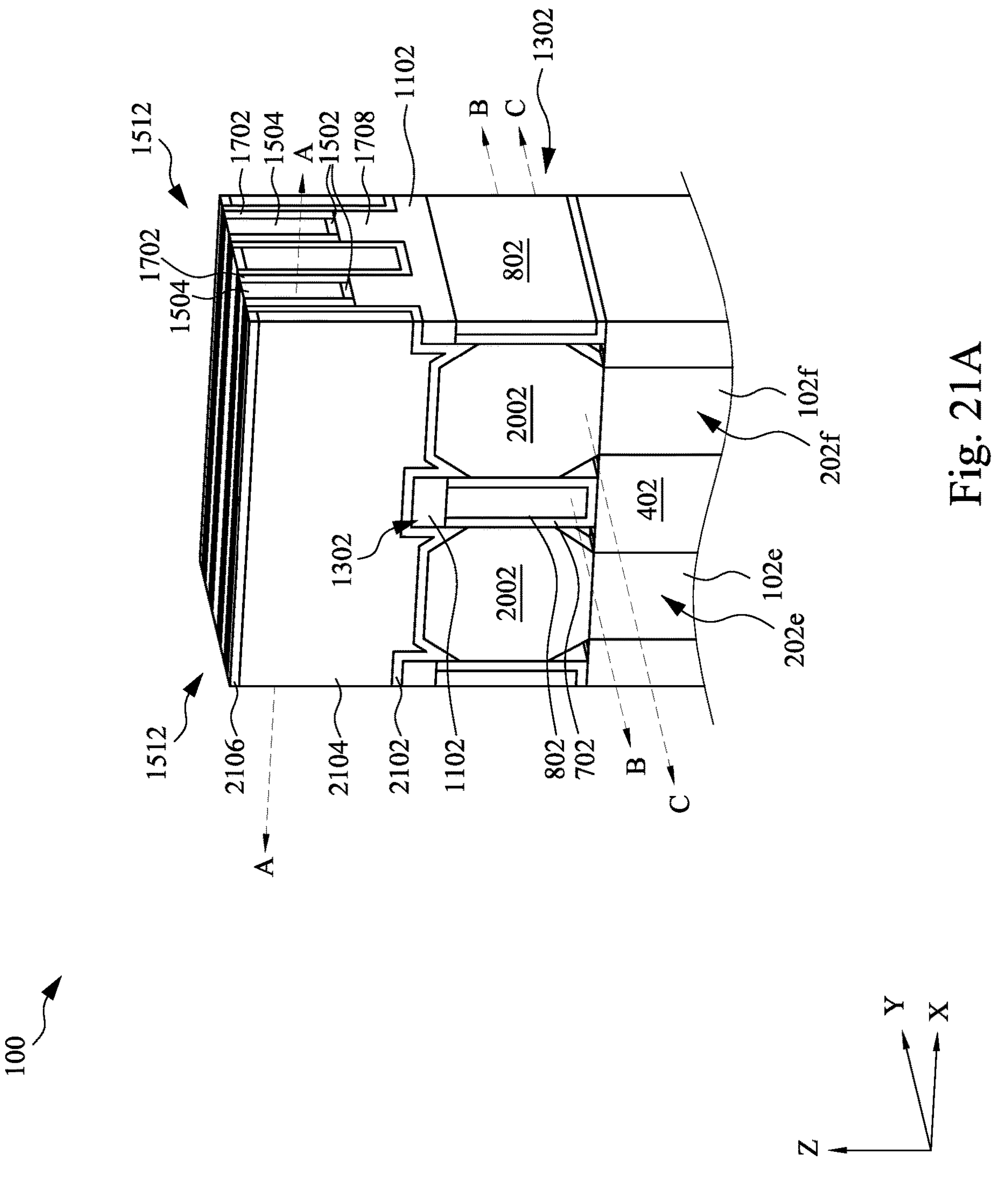

FIGS. 21A-25A are perspective views of various stages of manufacturing a semiconductor device structure 100, in accordance with some embodiments. FIGS. 21B-25B are cross-sectional side views of various stages of manufacturing the semiconductor device structure 100 taken along line B-B of FIG. 21A, in accordance with some embodiments. FIGS. 21C-25C are cross-sectional side views of various stages of manufacturing the semiconductor device structure 100 taken along line C-C of FIG. 21A, in accordance with some embodiments. FIG. 21A shows a portion of the semiconductor device structure 100 that is adjacent the portion of the semiconductor device structure 100 shown in FIG. 20A along the X direction. For example, as shown in FIG. 21A, a substrate portion 102*e* of a fin 202*e* may be adjacent the substrate portion 102*d* of the fin 202*d* (FIG. 20A), and the dielectric feature 1302 (FIG. 20A) may be between the S/D epitaxial feature 2002 (FIG. 20A) formed from the substrate portion 102*d* of the fin 202*d* (FIG. 20A) and the S/D epitaxial feature 2002 formed from the substrate portion 102*e* of the fin 202*e*. A substrate portion 102*f* of a fin 202*f* is adjacent the substrate portion 102*e* of the fin 202*e*, and the S/D epitaxial feature 2002 formed from the substrate portion 102*f* of the fin 202*f* is separated from the S/D epitaxial feature 2002 formed from the substrate portion 102*e* of the fin 202*e* by the dielectric feature 1302. As shown in FIG. 21A, the dielectric feature 1302 includes the high-K dielectric material 1102, the low-K dielectric material 802, and the liner 702. The high-K dielectric material 1102 includes the first portion 1706 located between the S/D regions and the second portion 1708 located below the sacrificial gate stack 1512.

Figure 21C:
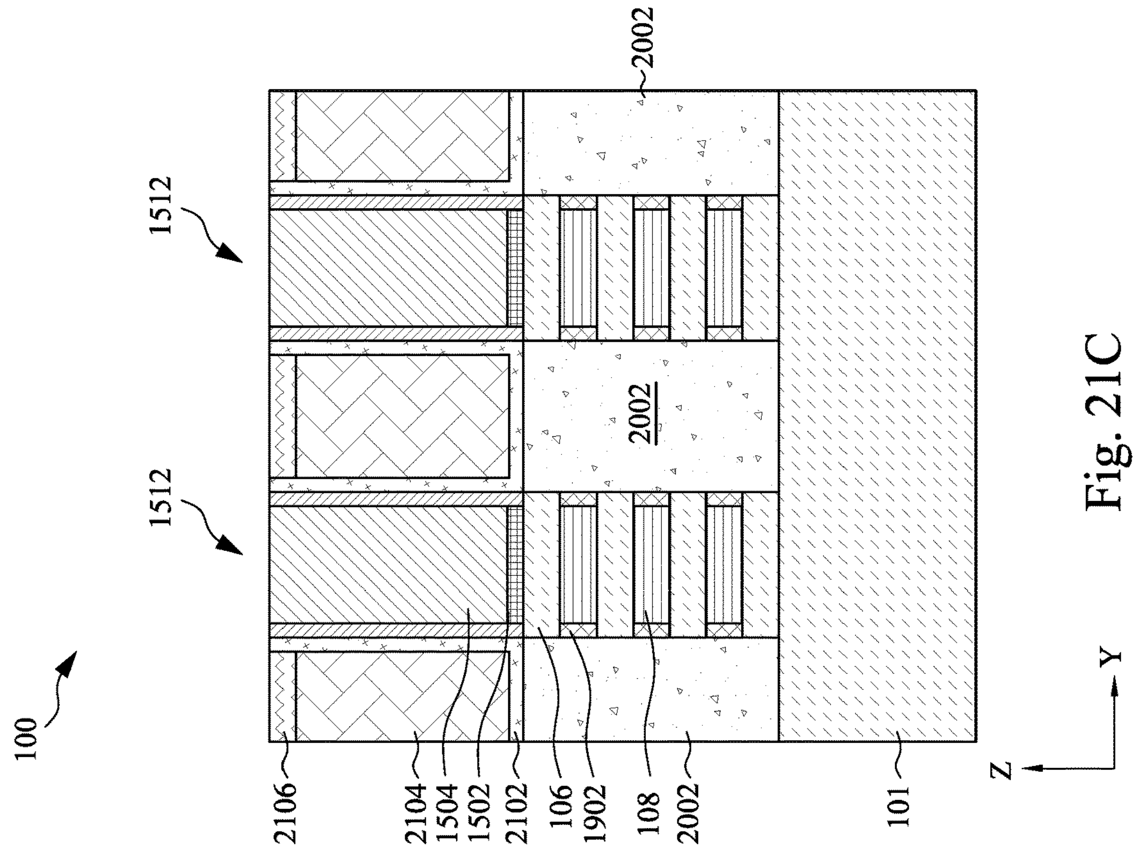
Figure 21B:
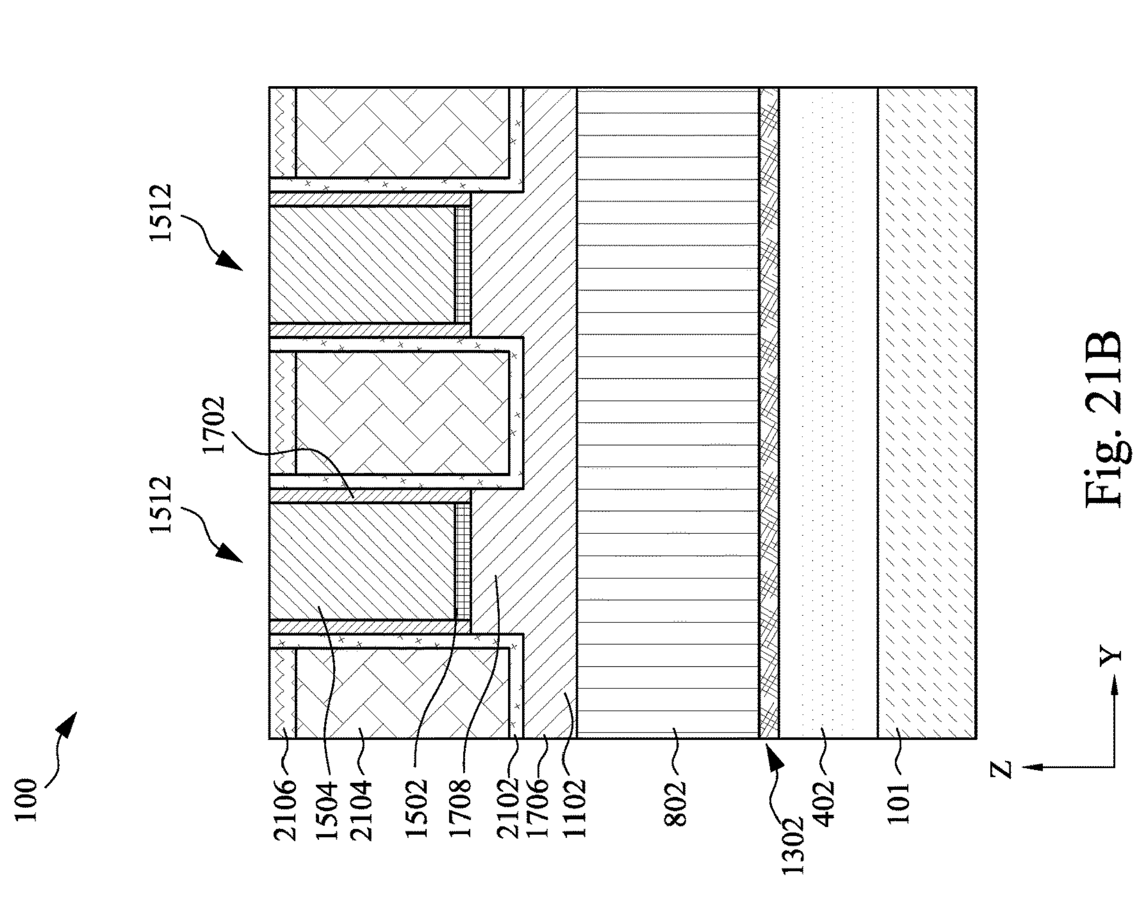

After the formation of the S/D epitaxial features 2002, a contact etch stop layer (CESL) 2102 may be formed on the S/D epitaxial features 2002, the dielectric features 1302, and the sacrificial gate stack 1512, as shown in FIGS. 21A-21C. The CESL 2102 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 2102 may be formed by CVD, PECVD, ALD, or any suitable deposition technique. In some embodiments, the CESL 2102 is a conformal layer formed by the ALD process. An interlayer dielectric (ILD) layer 2104 may be formed on the CESL 2102. The materials for the ILD layer 2104 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 2104 may be deposited by a PECVD process or other suitable deposition technique. In some embodiments, after formation of the ILD layer 2104, the semiconductor device structure 100 may be subject to a thermal process to anneal the ILD layer 2104.

Figure 20B:
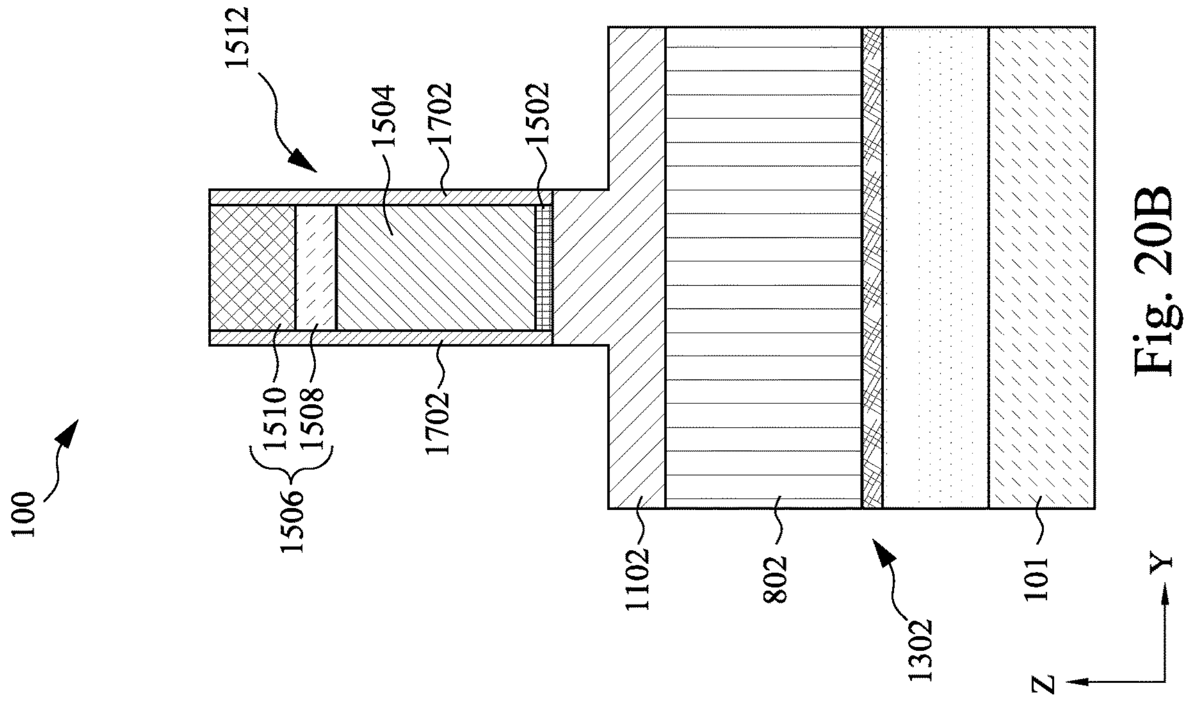
Figure 20D:
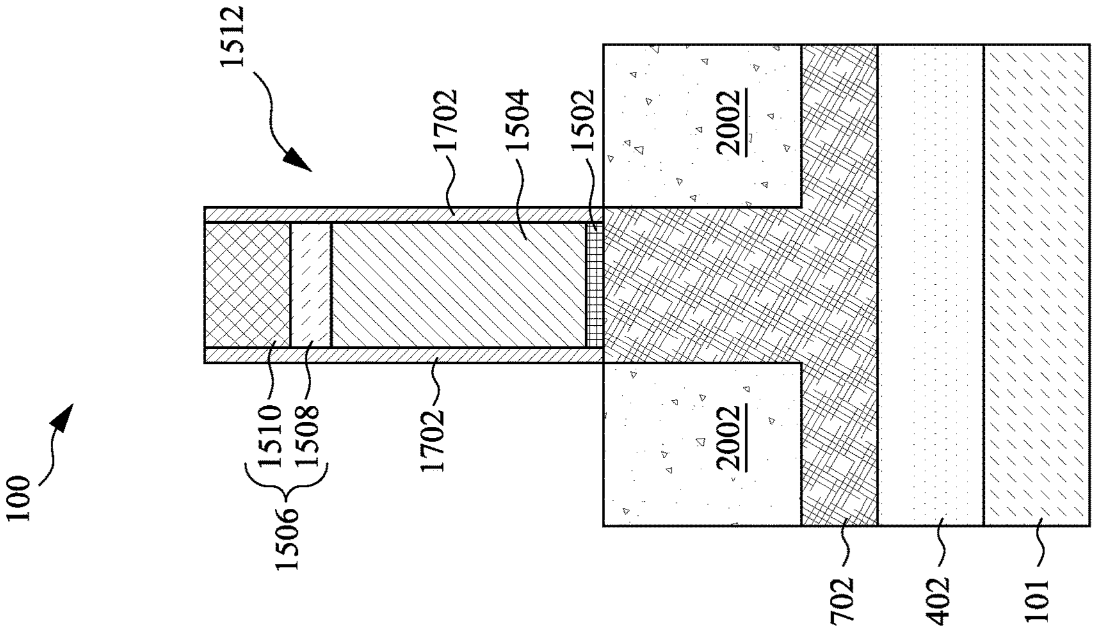

A planarization process is performed to expose the sacrificial gate electrode layer 1504, as shown in FIGS. 21A-21C. The planarization process may be any suitable process, such as a CMP process. The planarization process removes portions of the ILD layer 2104 and the CESL 2102 disposed on the sacrificial gate stacks 1512. The planarization process may also remove the mask structure 1506 (FIG. 20B). The ILD layer 2104 may be recessed to a level below the top of the sacrificial gate electrode layer 1504, and a nitrogen-containing layer 2106, such as a SiCN layer, may be formed on the recessed ILD layer 2104, as shown in FIGS. 21A-21C. The nitrogen-containing layer 2106 may protect the ILD layer 2104 during subsequent etch processes.

Figure 22A:
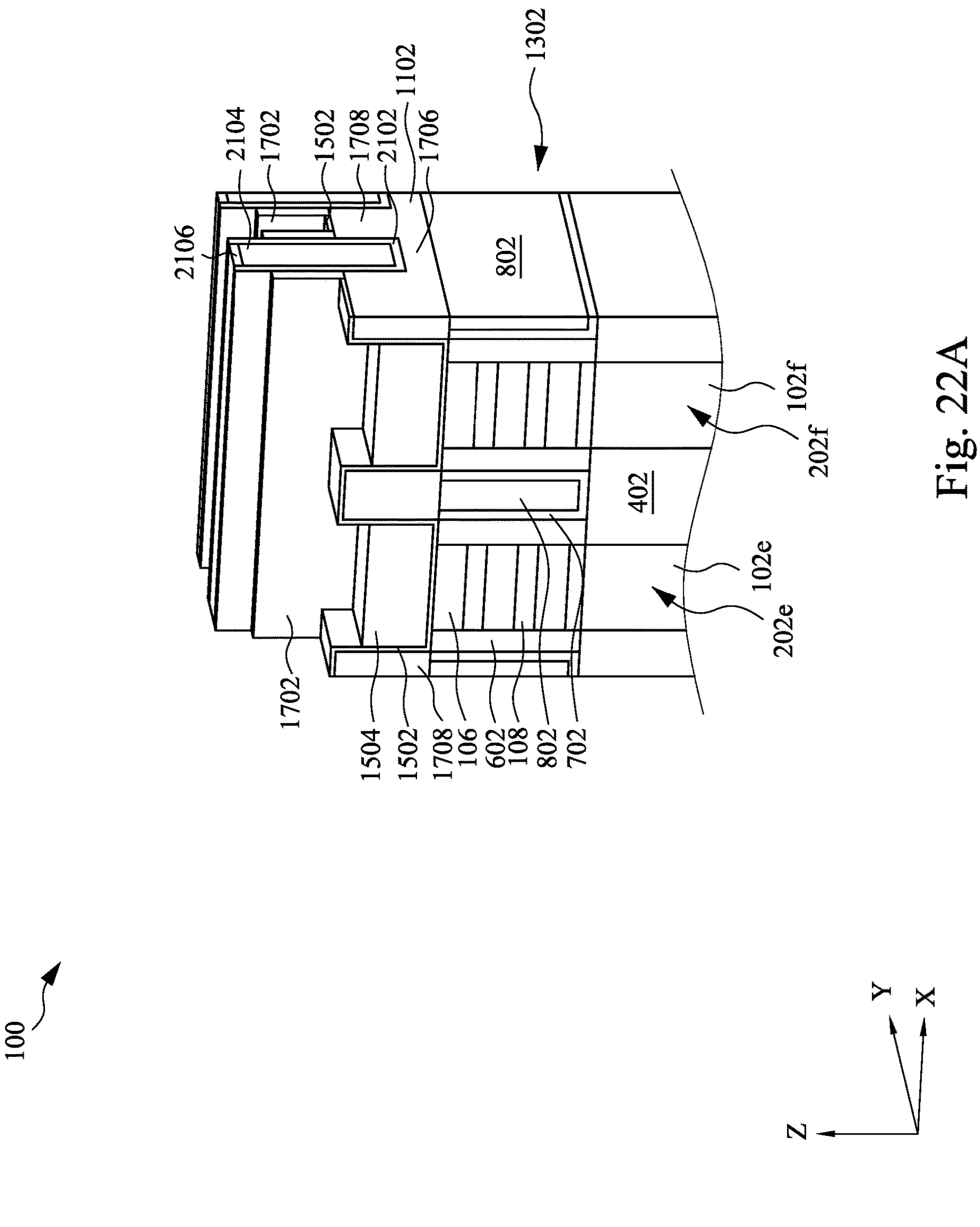
Figure 22C:
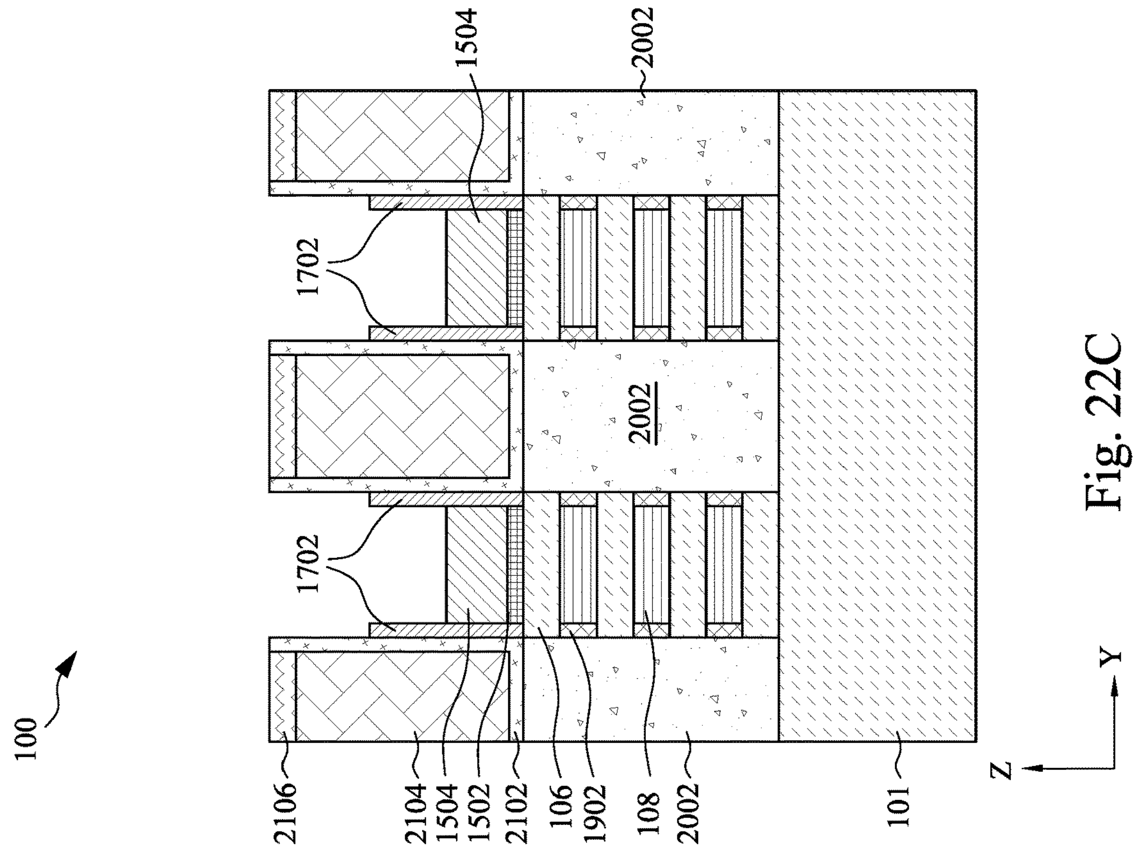
Figure 22B:
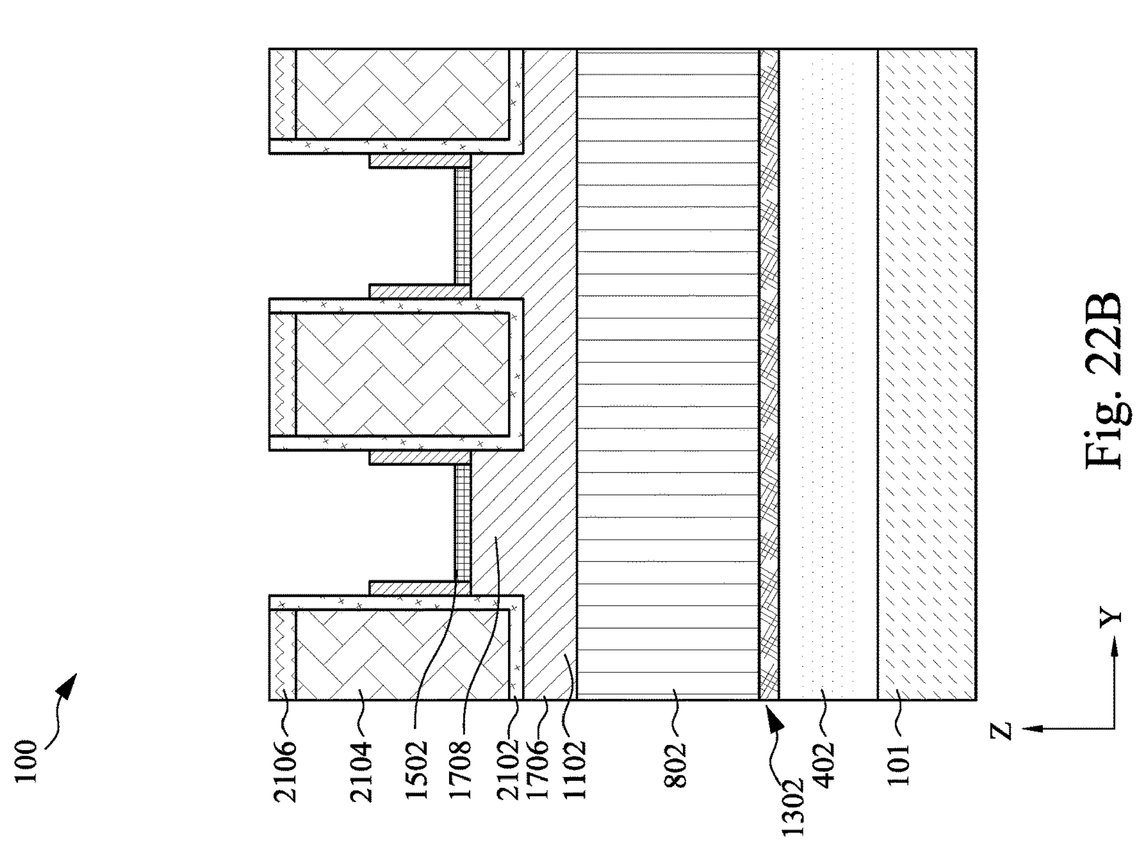

FIG. 22A is a perspective view of the semiconductor device structure 100 taken along line A-A of FIG. 21A, FIG. 22B is a cross-sectional side view of the semiconductor device structure 100 of FIG. 22A taken along line B-B of FIG. 21A, and FIG. 22C is a cross-sectional side view of the semiconductor device structure 100 of FIG. 22A taken along line C-C of FIG. 21A, in accordance with some embodiments. As shown in FIGS. 22A-22C, a portion of the sacrificial gate electrode layer 1504 is removed, and the remaining sacrificial gate electrode layer 1504 is below the level of the top of the second portion 1708 of the high-K dielectric material 1102. In other words, the sacrificial gate electrode layer 1504 is recessed to a level below the top of the second portion 1708 of the high-K dielectric material 1102. Portions of the sacrificial gate dielectric layer 1502 formed on the top of the high-K dielectric materials 1102 are exposed. The portion of the sacrificial gate electrode layer 1504 may be removed by any suitable process, such as dry etch, wet etch, or a combination thereof. In some embodiments, a wet etchant such as a tetramethylammonium hydroxide (TMAH) solution can be used to selectively remove the sacrificial gate electrode layer 1504 but not the nitrogen-containing layer 2106 and the CESL 2102. In some embodiments, a portion of the spacer 1702 may be removed by the etch process that removes the portion of the sacrificial gate electrode layer 1504, as shown in FIGS. 22A-22C.

Figure 23A:
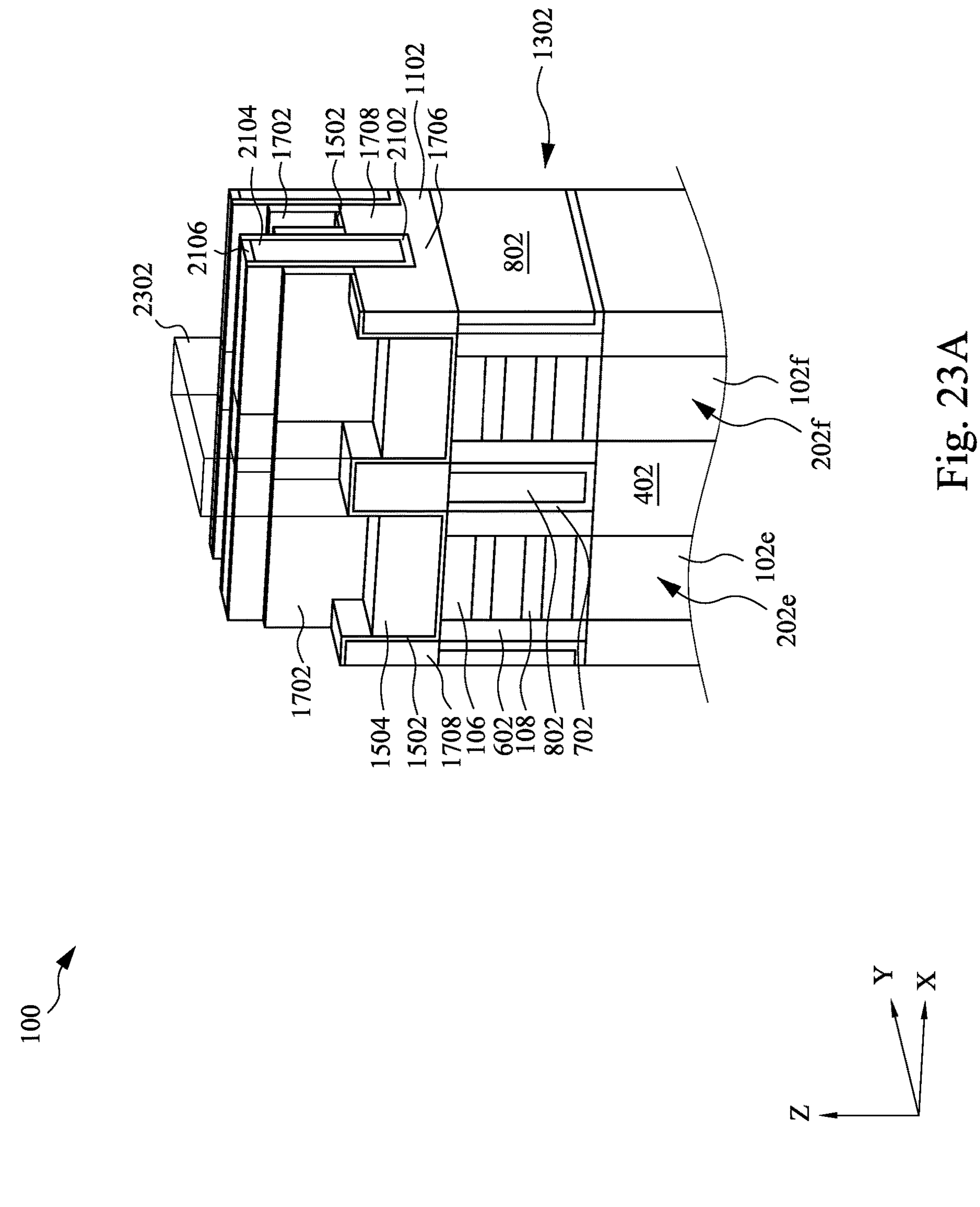
Figure 23C:
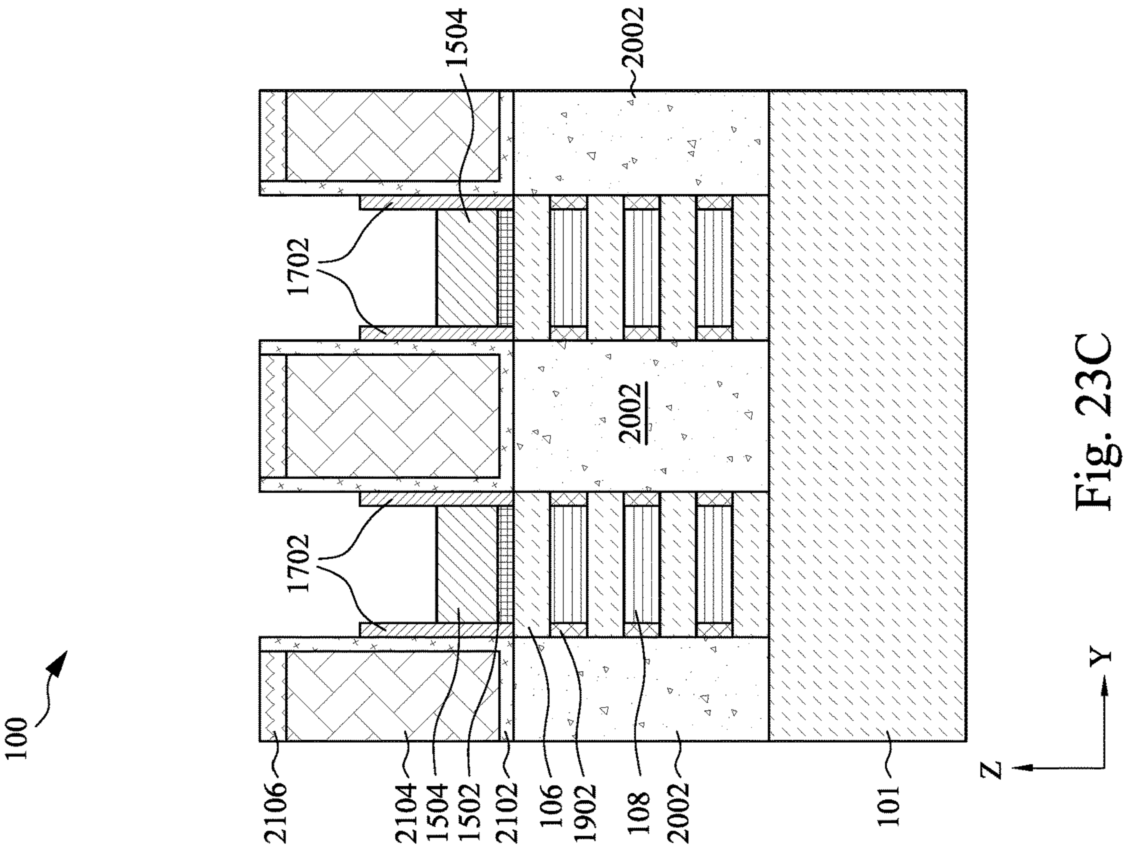
Figure 23B:
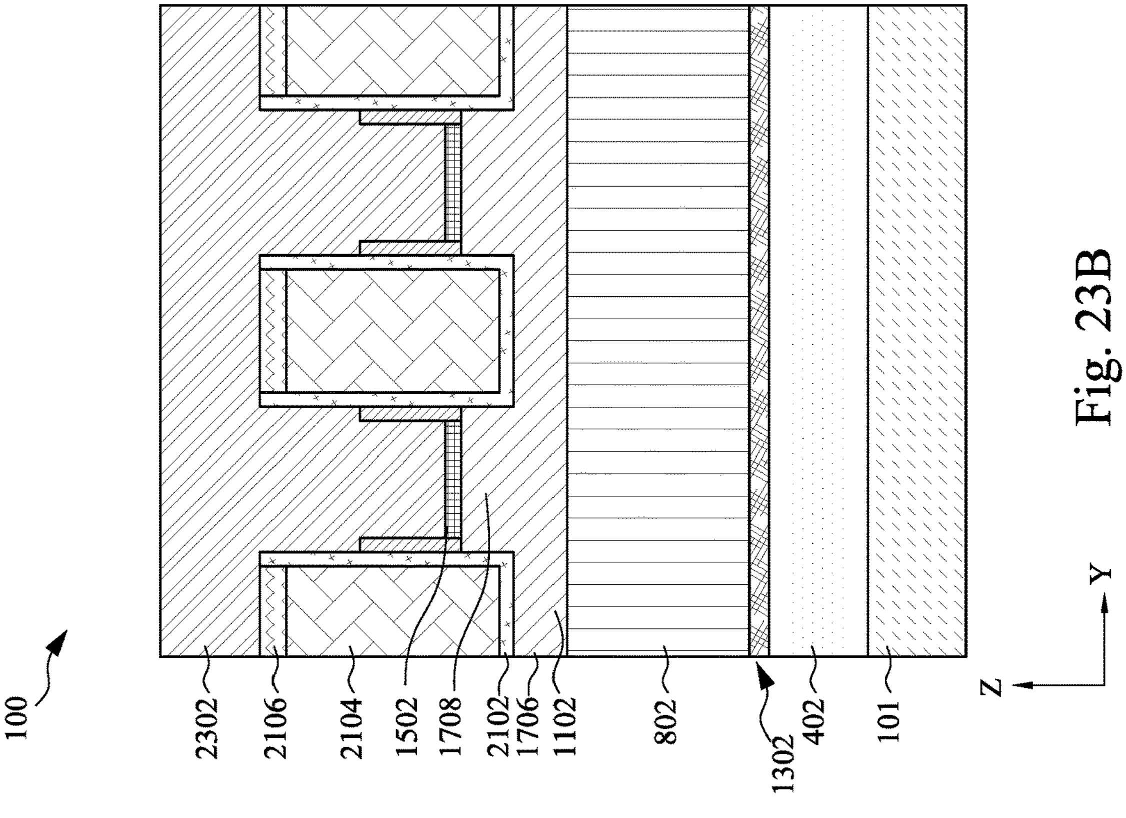

Next, as shown in FIGS. 23A-23C, a mask 2302 is formed on a portion of the exposed portions of the sacrificial gate dielectric layer 1502, and the mask 2302 may extend along the Y direction, which also covers a portion of the spacer 1702, the CESL 2102, and the nitrogen-containing layer 2106. The mask 2302 may be formed by first forming a blanket layer on the semiconductor device structure 100, followed by patterning and etch processes to remove portions of the blanket layer to form the mask 2302. The mask 2302 may include an oxygen-containing material and/or a nitrogen-containing material. In some embodiments, the mask 2302 is a photoresist formed by first forming a blanket photoresist layer on the semiconductor device structure 100, followed by patterning the photoresist to form the mask 2302.

The mask 2302 may be formed over one or more of the second portions 1708 of the high-K dielectric material 1102. The mask 2302 protects the one or more of the second portions 1708 in order to keep the protected second portions 1708 to separate the subsequently formed gate electrode layer 2802 (FIG. 28A). The unprotected second portions 1708 may be removed, leading to the subsequently formed gate electrode layer 2802 (FIG. 28A) connecting adjacent channel regions (FIG. 28A). In other words, if it is predetermined that the gate electrode layers 2802 (FIG. 28A) in adjacent channel regions should be separated, or cut-off, the mask 2302 is formed on the second portion 1708 of the high-K dielectric material 1102 of the dielectric feature 1302 formed between the adjacent channel regions. On the other hand, if it is predetermined that the gate electrode layers 2802 (FIG. 28A) in adjacent channel regions should be connected, the mask 2302 is not formed on the second portion 1708 of the high-K dielectric material 1102 of the dielectric feature 1302 formed between the adjacent channel regions. If the gate electrode layers 2802 (FIG. 28A) are connected, then a single signal (i.e., an electrical current) sent to the gate electrode layers 2802 may control both adjacent channel regions. If the gate electrode layers 2802 are cut-off, then independent signal (i.e., independent electrical current) may be sent to each gate electrode layer 2802 to separately control each of the adjacent channel region.

Figure 24A:
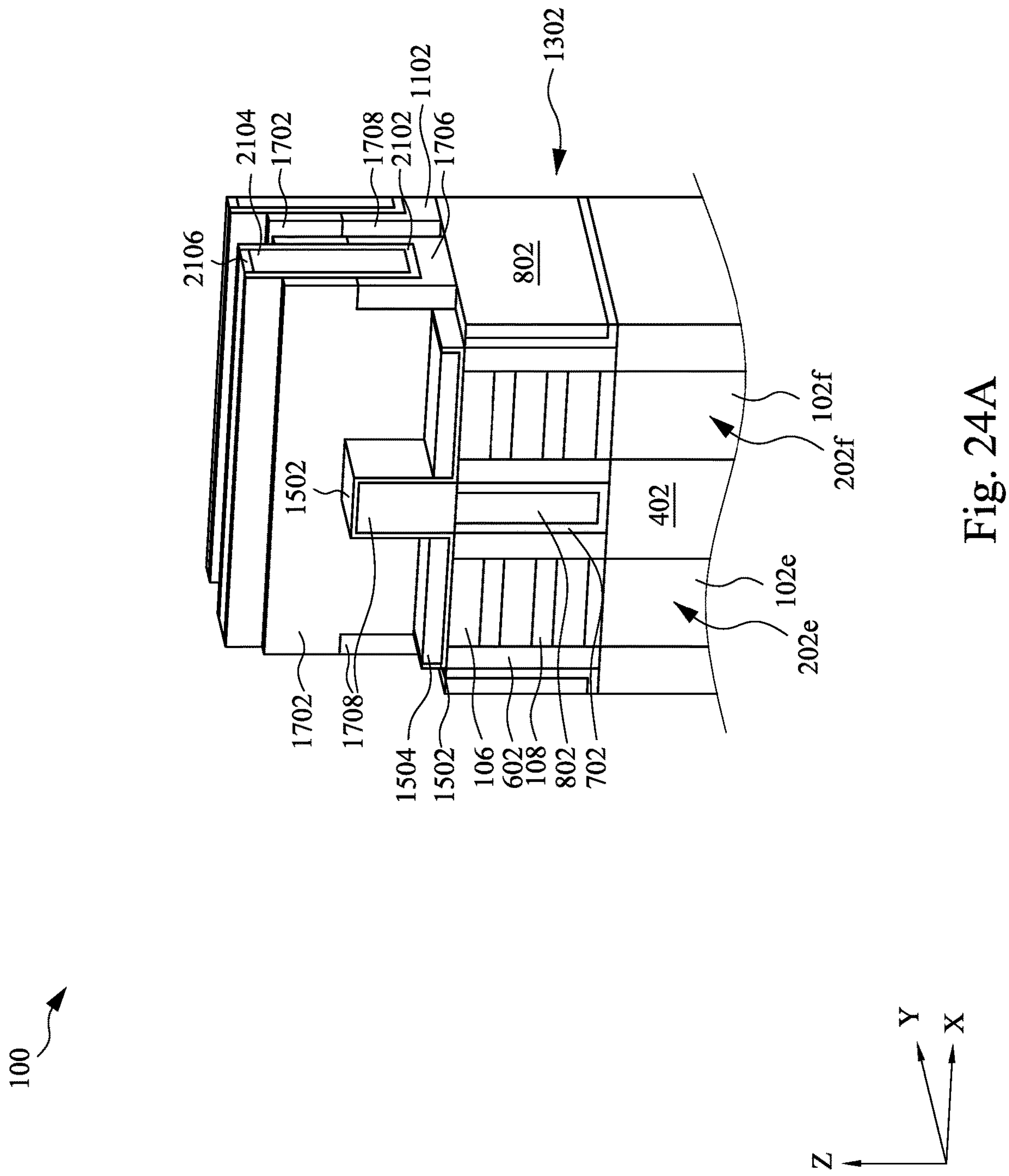
Figure 24C:
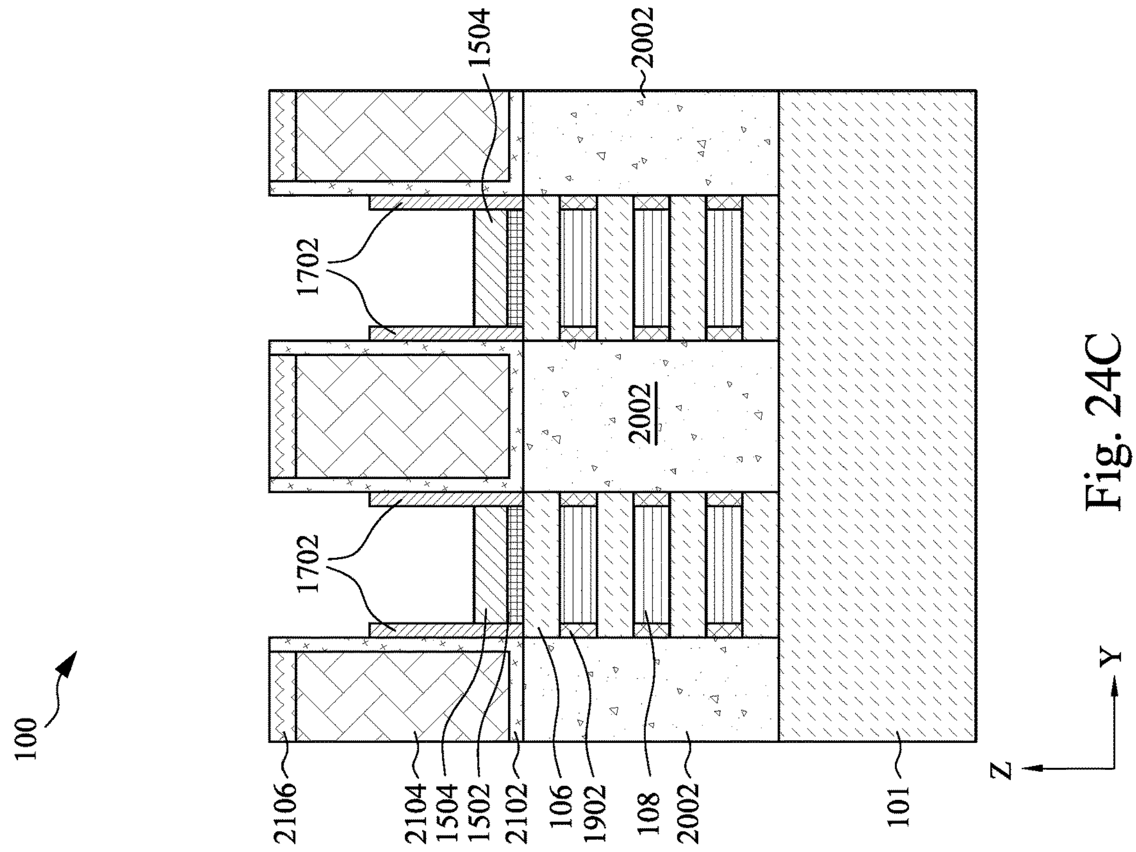
Figure 24B:
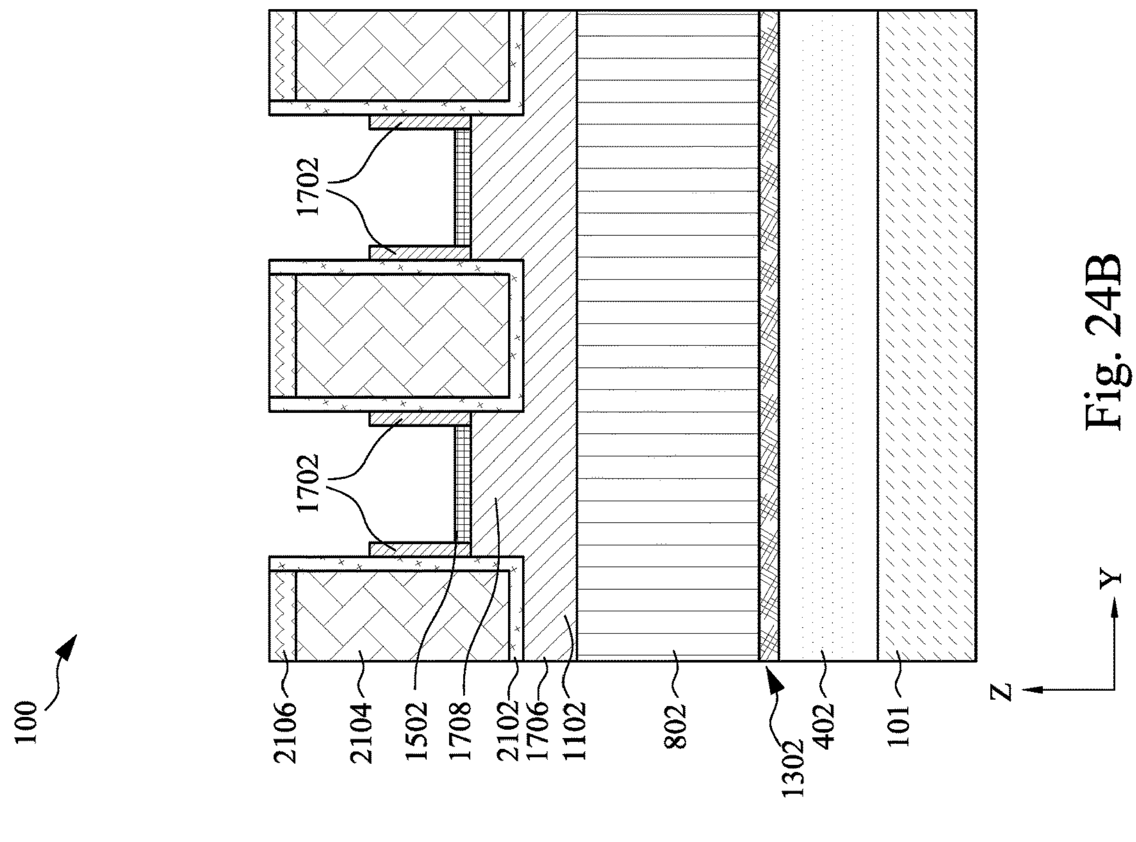

Next, as shown in FIGS. 24A-24C, the second portions 1708 of the high-K dielectric material 1102 not protected by the mask 2302 may be removed along with the portions of the sacrificial gate dielectric layer 1502 formed thereon. The first portions 1706 of the high-K dielectric material 1102 under the ILD layer 2104 are not removed. The removal of the portions of the second portions 1708 may expose portions of the liner 702 and low-K dielectric material 802 disposed therebelow. The removal process may be any suitable processes, such as dry etch, wet etch, or a combination thereof. In some embodiments, one etch process may be performed to remove both the portions of the sacrificial gate dielectric layer 1502 and the portions of the second portions 1708 of the high-K dielectric material 1102. In some embodiments, a first etch process may be performed to remove the portions of the sacrificial gate dielectric layer 1502, followed by a second etch process to remove the portions of the second portions 1708 of the high-K dielectric material 1102. The one or more etch processes may also remove a portion of the sacrificial gate electrode layer 1504, as shown in FIGS. 24A and 24C. The one or more etch processes do not remove the nitrogen-containing layer 2106, the CESL 2102, and the spacers 1702. A portion of the second portion 1708 of the high-K dielectric material 1102 may be protected by the spacer 1702. As a result, at least one of the dielectric features 1302 may include two or more discrete high-K dielectric materials 1102, and each discrete high-K dielectric material 1102 may have a "U" cross-sectional shape in the YZ plane, as shown in FIG. 24A. The "U" shape may be the result of having a first portion 1706 between two portions of the second portion 1708. As described above, the first portion 1706 has a height H4 that is less than the height H1 of the second portion 1708.

After the removal of the portions of the sacrificial gate dielectric layer 1502 and portions of the second portions 1708 of the high-K dielectric material 1102, the mask 2302 (FIGS. 23A and 23B) may be removed. The mask 2302 may be removed by any suitable removal process, such as ashing, dry etch, wet etch, or a combination thereof.

FIG. 24B illustrate a cross-sectional view of the semiconductor device structure 100 along the dielectric feature 1302 that is protected by the mask 2302 (FIGS. 23A and 23B). As a result, the protected dielectric feature 1302 includes a continuous high-K dielectric material 1102 having alternate first portions 1706 and second portions 1708. In some embodiments, multiple dielectric features 1302 are protected by the mask 2302 (FIGS. 23A and 23B).

Figure 25A:
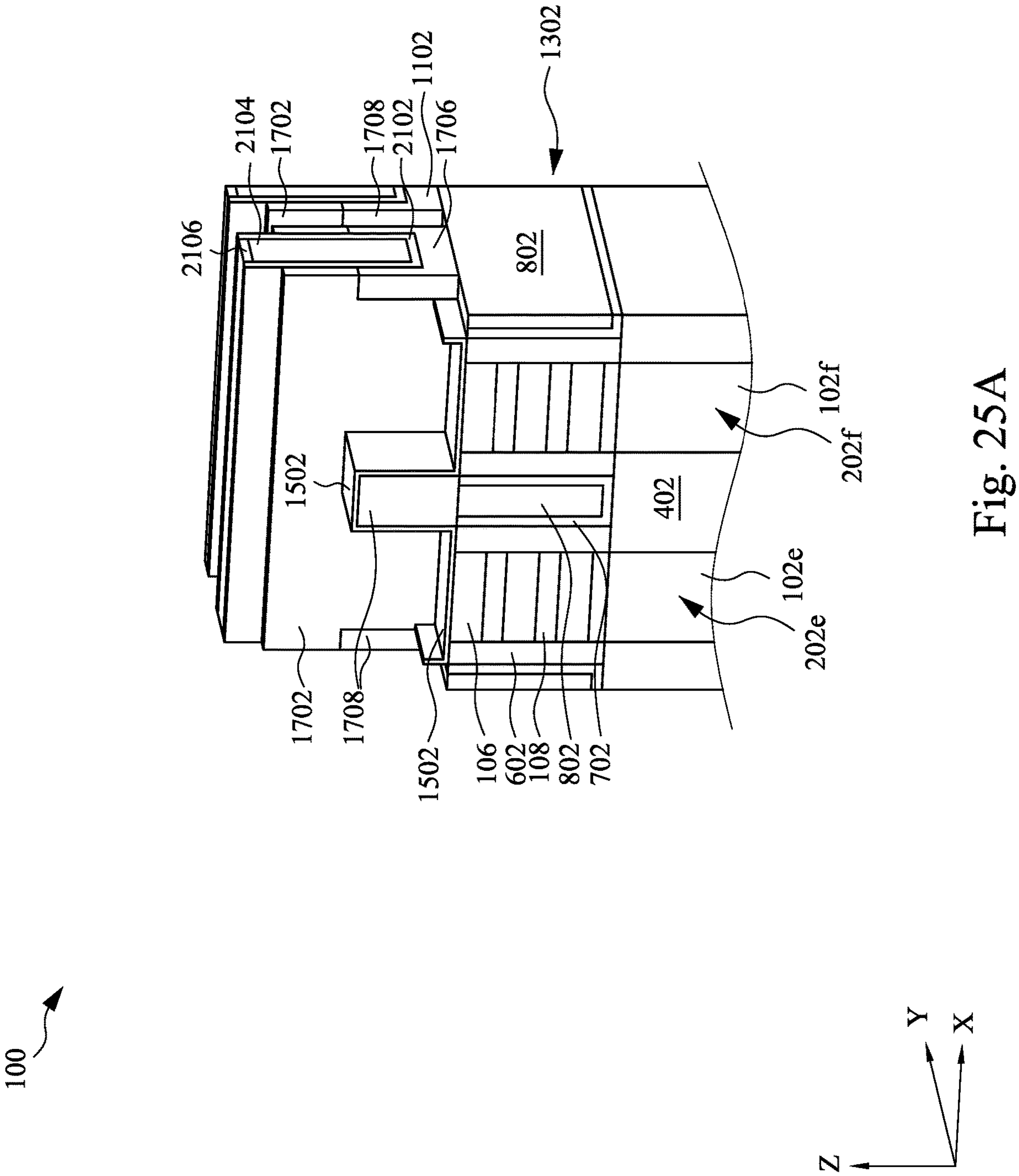
Figure 25C:
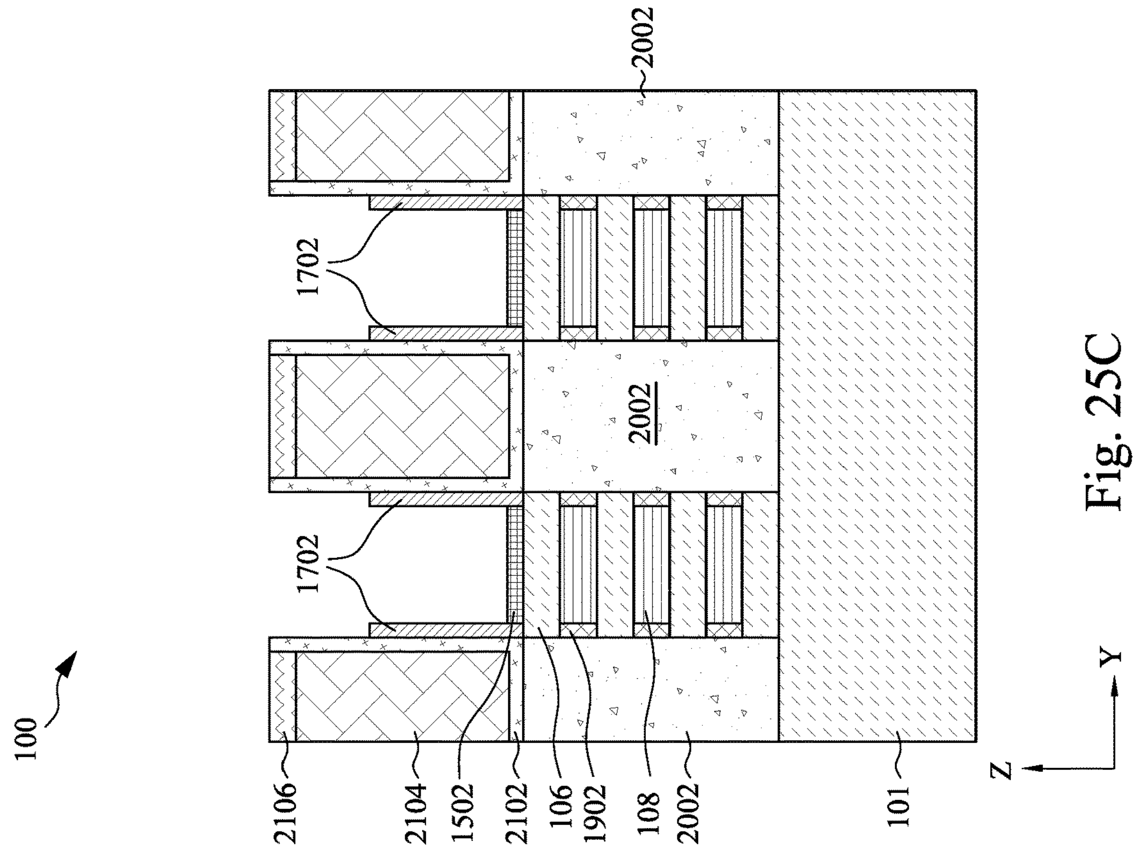
Figure 25B:
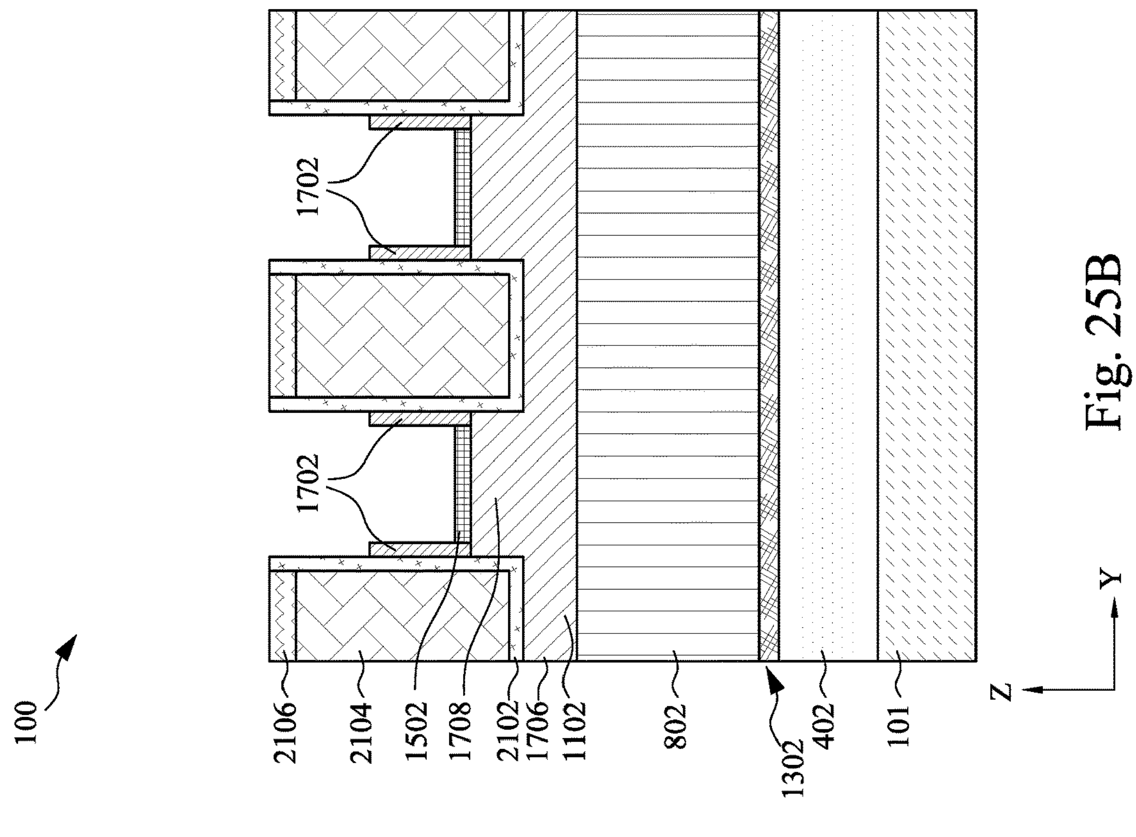

Next, as shown in FIGS. 25A-25C, the remaining portion of the sacrificial gate electrode layer 1504 is removed. The portion of the sacrificial gate electrode layer 1504 may be removed by any suitable process, such as dry etch, wet etch, or a combination thereof. In some embodiments, a wet etchant such as a tetramethylammonium hydroxide (TMAH) solution can be used to selectively remove the sacrificial gate electrode layer 1504 but not the nitrogen-containing layer 2106, the sacrificial gate dielectric layer 1502, and the CESL 2102.

Figure 26A:
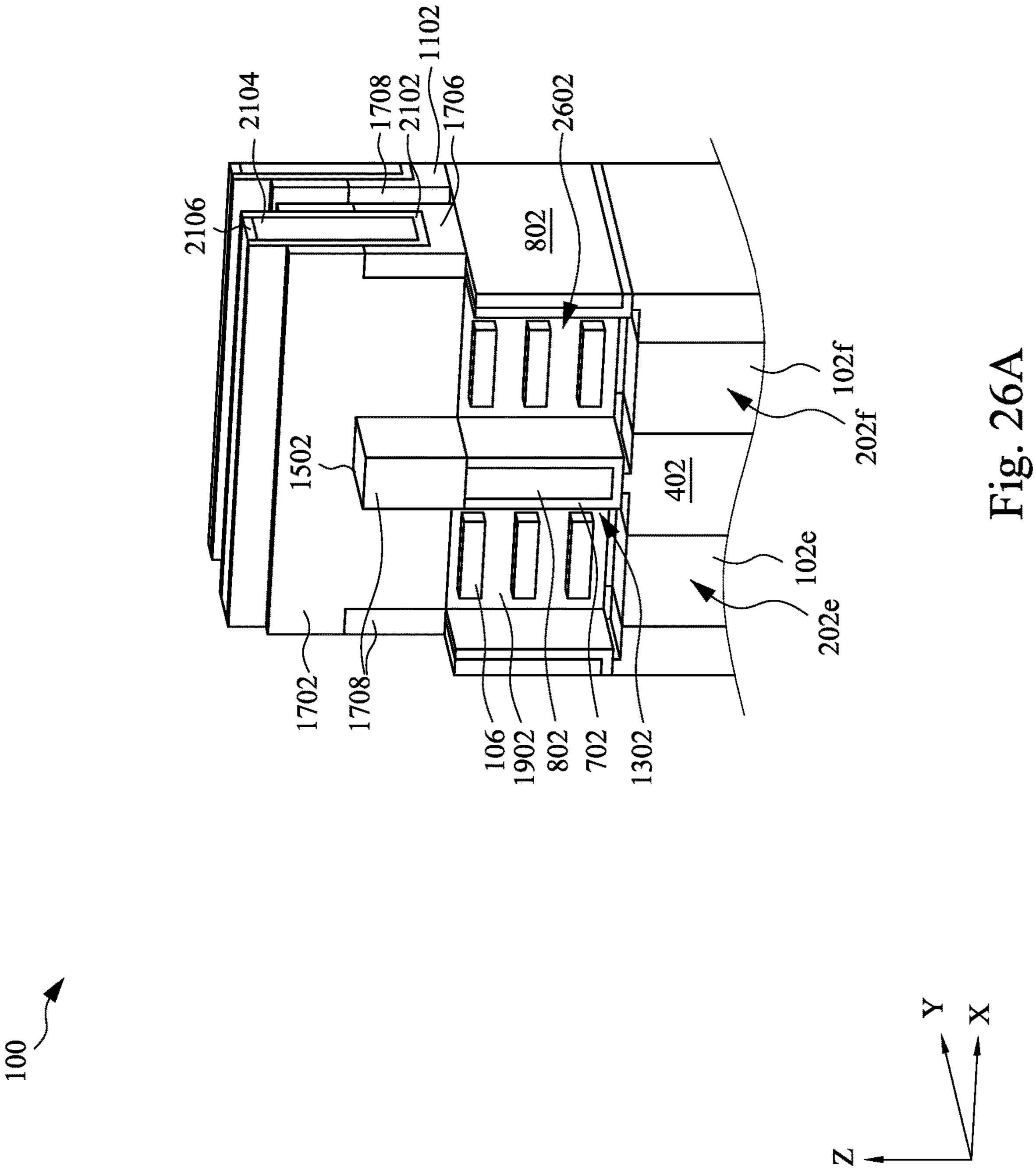
Figure 26C:
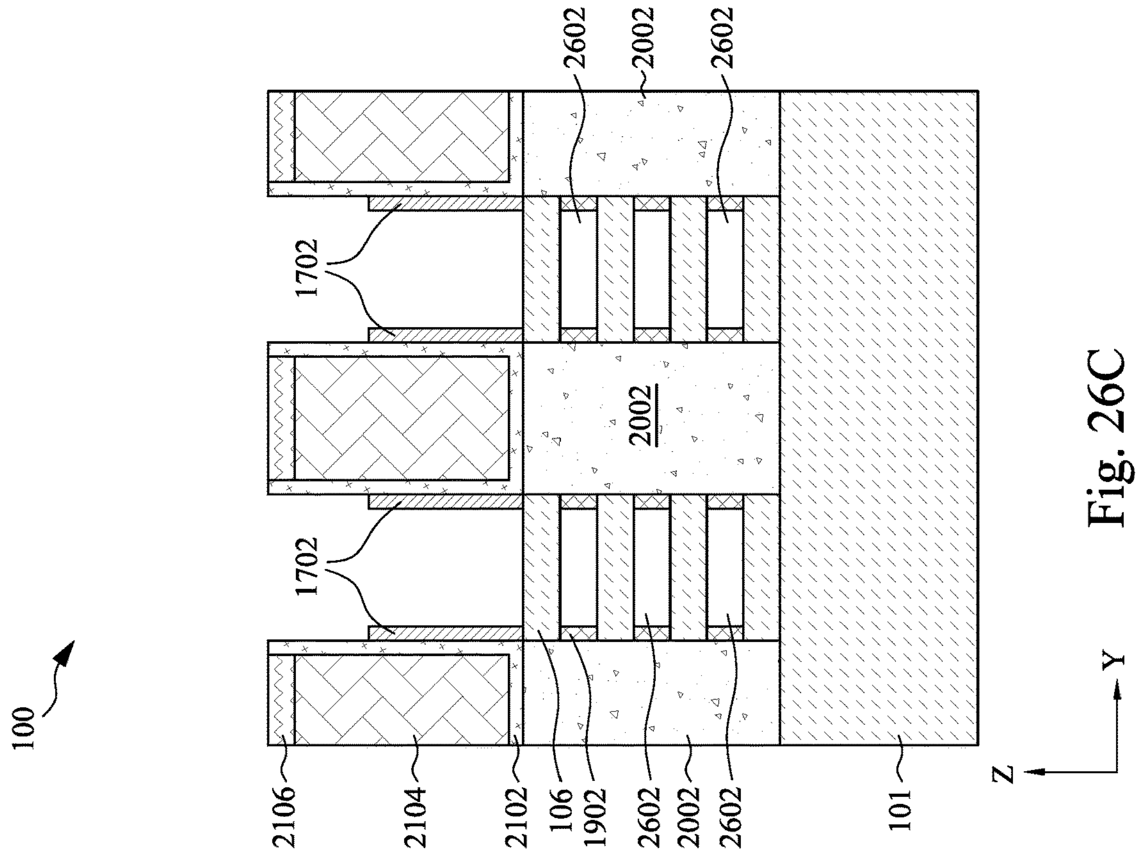
Figure 26B:
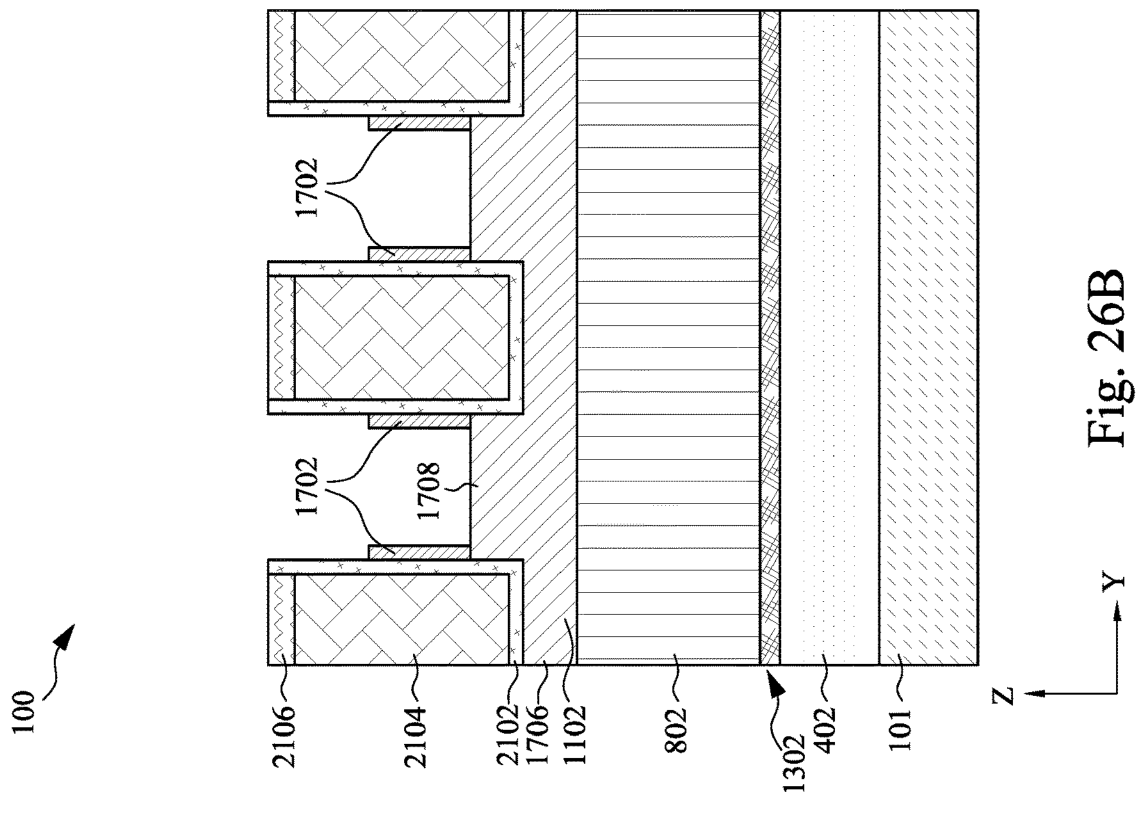

Next, as shown in FIGS. 26A-26C, the remaining portion of the sacrificial gate dielectric layer 1502, the cladding layers 602, and the second semiconductor layers 108 are removed. The removal processes expose the dielectric spacers 1902 and the first semiconductor layers 106, as shown in FIGS. 26A and 26C. The removal process may be any suitable processes, such as dry etch, wet etch, or a combination thereof. In some embodiments, a first etch process may be performed to remove the remaining portion of the sacrificial gate dielectric layer 1502, followed by a second etch process to remove the cladding layers 602 and the second semiconductor layers 108. The first etch process may be a selective etch process that removes the remaining portion of the sacrificial gate dielectric layer 1502 but not the high-K dielectric material 1102. Similarly, the second etch process may be a selective etch process that removes the cladding layers 602 and the second semiconductor layers 108 but not the high-K dielectric material 1102 and the firsts semiconductor layers 106. As a result, openings 2602 are formed in the channel regions of the semiconductor device structure 100, as shown in FIGS. 26A and 26C. The first semiconductor layers 106, the dielectric features 1302, and the liners 702 (FIG. 27A) may be exposed in the openings 2602. Each first semiconductor layer 106 may be a nanosheet channel of the nanosheet transistor.

Figure 27A:
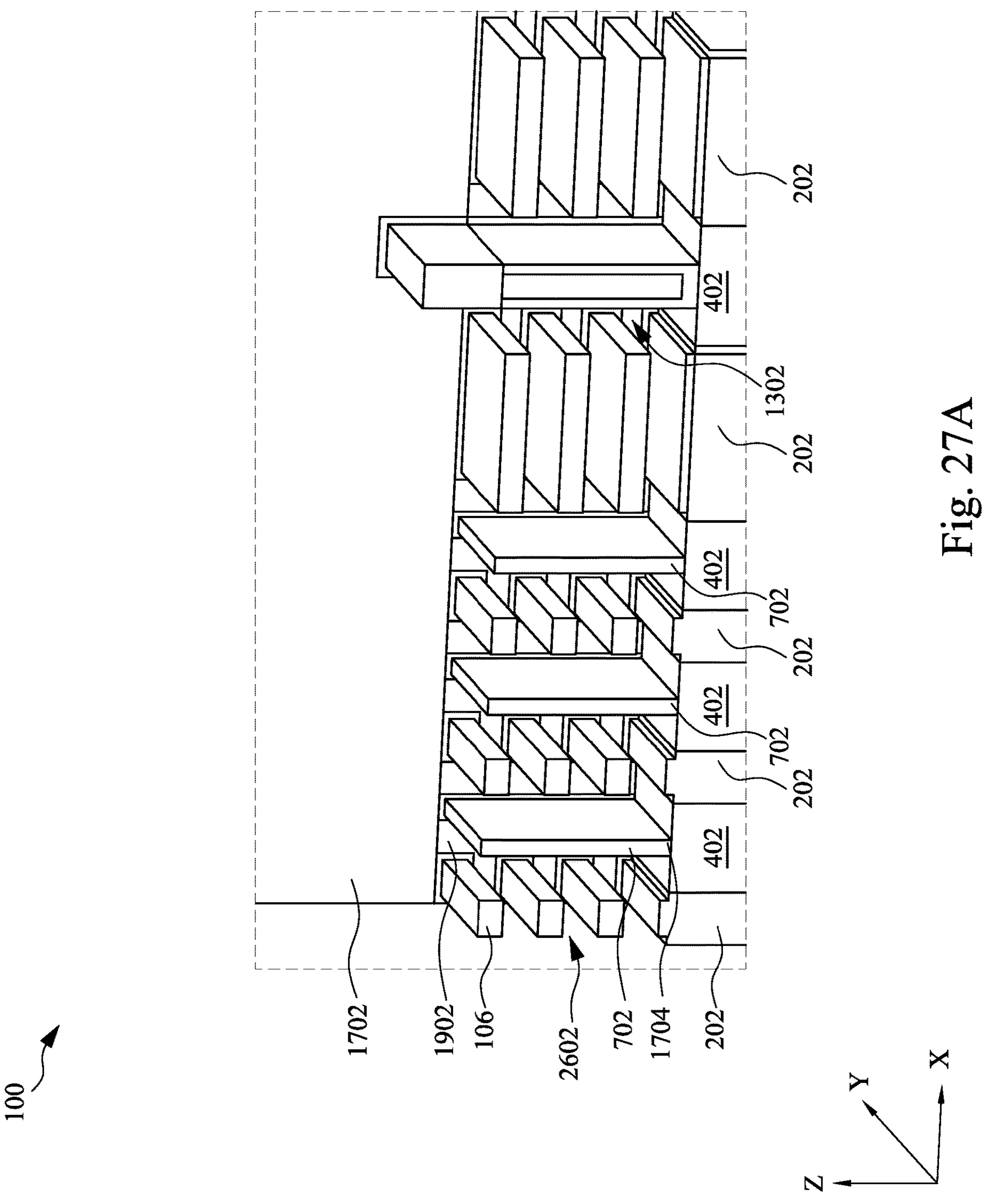
FIGS. 27A-27B are perspective views of the semiconductor device structure at the manufacturing stage shown in FIG. 26A, in accordance with some embodiments.

FIG. 27A is a perspective view of channel regions of the semiconductor device structure 100 at the manufacturing stage shown in FIG. 26A, in accordance with some embodiments. As shown in FIG. 27A, the semiconductor device structure 100 may include a plurality of fins 202 and a plurality of first semiconductor layers 106 disposed over each fin 202. The fins 202 may be any of the fins 202*a*, 202*b*, 202*c*, 202*d* shown in FIG. 6. In some embodiments, the second portion 1704 of the liners 702 and/or the dielectric features 1302 may be disposed between adjacent channel regions. As described above, the adjacent channel regions having the second portion 1704 of the liner 702 disposed therebetween may share the gate electrode layer 2802 (FIG.

28A), and the adjacent channel regions having the dielectric feature 1302 disposed therebetween may or may not share the gate electrode layer 2802 (FIG. 28A).

Figure 27B:
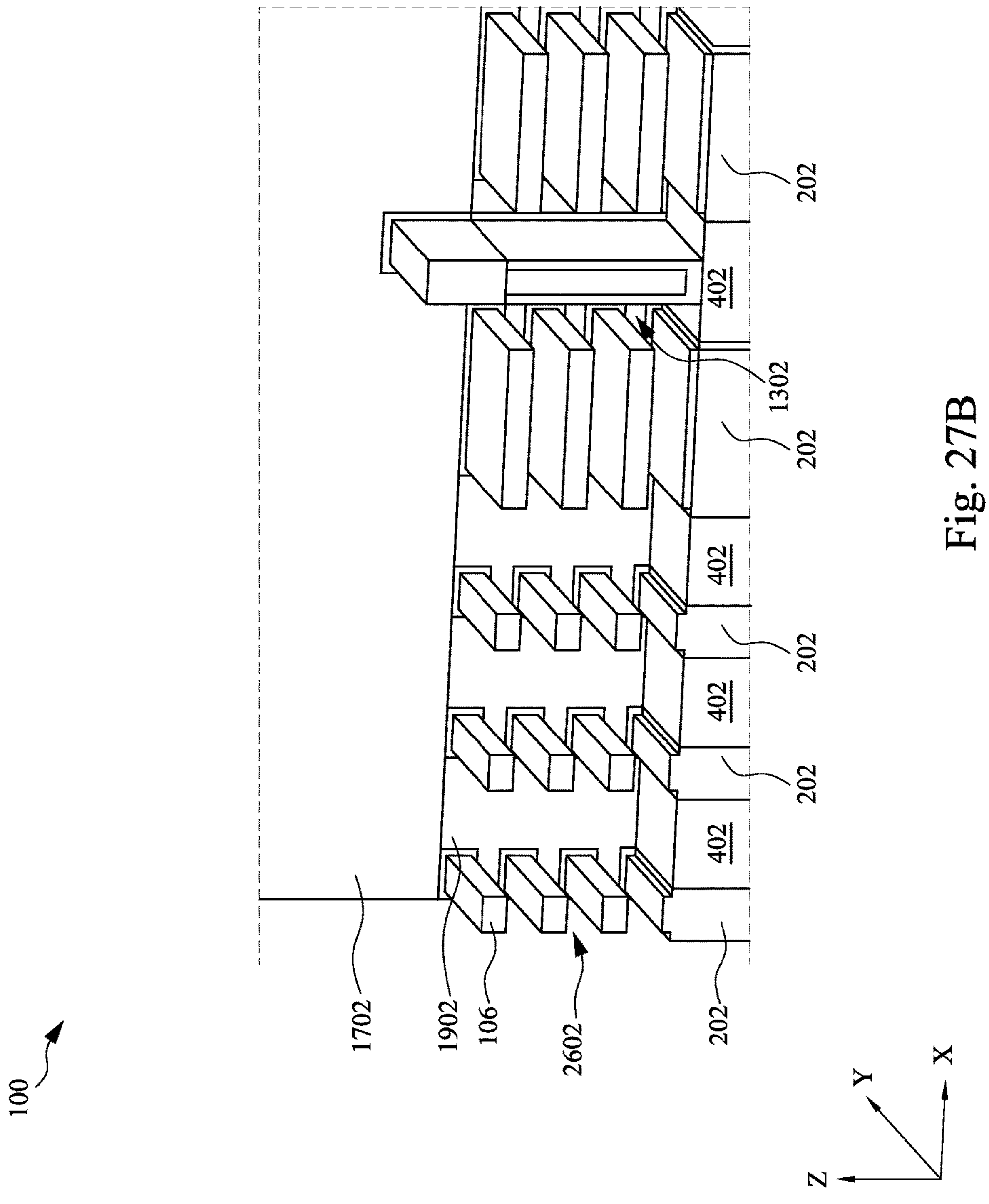

FIG. 27B is a perspective view of the channel regions of the semiconductor device structure 100 shown in FIG. 27A, according to another embodiment. As shown in FIG. 27B, the second portion 1704 of the liner 702 between the adjacent channel regions is removed, in some embodiments. As described above, the second portion 1704 of the liner 702 having a width less than about 10 nm or the non-existent second portion 1704 of the liner 702 may lead to reduced electrical resistance of the gate dielectric layer.

FIGS. 28A and 28B are cross-sectional side views of channel regions of the semiconductor device structure 100, in accordance with some embodiments. The semiconductor device structure 100 may include the fins 202*a*, 202*b*, 202*c*, 202*d*, 202*e* having the substrate portions 102*a*, 102*b*, 102*c*, 102*d*, 102*e*, respectively. In some embodiments, the second portion 1704 of the liners 702 and/or the dielectric features 1302 may be disposed between adjacent channel regions, as shown in FIG. 28A. In some embodiments, the second portion 1704 of the liners 702 are non-existent in the channel regions, as shown in FIG. 28B.

As shown in FIGS. 28A and 28B, an oxygen-containing layer 2803 may be formed around the exposed surfaces of the first semiconductor layer 106 and the substrate portions 102*a*, 102*b*, 102*c*, 102*d*, 102*e* in the openings 2602, followed by forming a high-K dielectric layer 2805 on the oxygen-containing layer 2803 in the openings 2602. The oxygen-containing layer 2803 may be an oxide layer, and the high-K dielectric layer 2805 may include the same material as the high-K dielectric material 1102. The oxygen-containing layer 2803 and the high-K dielectric layer 2805 may be formed by any suitable processes, such as ALD processes. In some embodiments, the oxygen-containing layer 2803 and the high-K dielectric layer 2805 are formed by conformal processes.

Next, the gate electrode layer 2802 is formed in the openings 2602 and on the high-K dielectric layer 2805. The gate electrode layer 2802 is formed on the high-K dielectric layer 2805 to surround a portion of each first semiconductor layer 106. The gate electrode layer 2802 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 2802 may be formed by PVD, CVD, ALD, electro-plating, or other suitable method. The gate electrode layer 2802 may be also deposited over the nitrogen-containing layer 2106 (FIG. 26A). The gate electrode layer 2802 formed over the nitrogen-containing layer 2106 may be removed by using, for example, CMP, until the nitrogen-containing layer 2106 is exposed.

Next, the gate electrode layer 2802 is recessed to a level below a top surface 2810 of the second portion 1708 of the high-K dielectric material 1102 of the dielectric feature 1302, as shown in FIGS. 28A and 28B. Thus, the second portion 1708 of the high-K dielectric material 1102 may be between two gate electrodes layers 2802. The recess process may be any suitable process, such as a dry etch, a wet etch, or a combination thereof. In some embodiments, the recess process may be a selective dry etch process that does not substantially affect the nitrogen-containing layer 2106, the spacer 1702, and the high-K dielectric layer 2805. As a result of the recess process, some adjacent channel regions may share the gate electrode layer 2802, while other adjacent channel regions may include distinct gate electrode layers 2802. For example, channel regions formed from the fin 202*a* and fin 202*b* share the gate electrode layer 2802, and channel regions formed from the fin 202*b* and fin 202*c* include distinct gate electrode layers 2802. As mentioned above, if the gate electrode layer 2802 is shared by the adjacent channel regions, a single signal (i.e., an electrical current) sent to the gate electrode layer 2802 may control both adjacent channel regions. If the gate electrode layers 2802 are cut-off, then independent signal (i.e., independent electrical current) may be sent to each gate electrode layer 2802 to separately control each of the adjacent channel region. As shown in FIGS. 28A and 28B, the dielectric feature 1302 without the high-K dielectric material 1102 is located between the channel regions formed from the fin 202*d* and the fin 202*e*. The portion of the high-K dielectric material 1102 may be removed by the processes described in FIGS. 25A-25C for the purpose of sharing the gate electrode layer 2802.

A metal layer 2804 may be formed on the gate electrode layer 2802, and a dielectric material 2806 is formed on the metal layer 2804 and the high-K dielectric layer 2805 formed on the second portion 1708 of the high-K dielectric material 1102, as shown in FIGS. 28A and 28B. The metal layer 2804 may include any suitable metal, such as fluorine-free tungsten, which grows on the gate electrode layer 2802 but not the high-K dielectric layer 2805. The dielectric material 2806 may include SiO, HfSi, SiOC, AlO, ZrSi, AlON, ZrO, HfO, TiO, ZrAlO, ZnO, TaO, LaO, YO, TaCN, SiN, SiOCN, ZrN, or SiCN. The dielectric material 2806 may be formed by any suitable process, such as PECVD. A conductive feature 2808 may be formed through the dielectric material 2806 and in contact with the metal layer 2804. The conductive feature 2808 may include a material having one or more of Ru, Mo, Co, Ni, W, Ti, Ta, Cu, Al, TiN and TaN. The conductive feature 2808 may provide a signal, such as an electrical current, to the gate electrode layer 2802 shared by the channel regions formed from the fins 202*c*, 202*d*, 202*e*, as shown in FIGS. 28A and 28B. The shared gate electrode layer 2802 in the channel regions formed from the fins 202*a* and 202*b* may receive a signal from a different conductive feature (not shown).

Figure 29A:
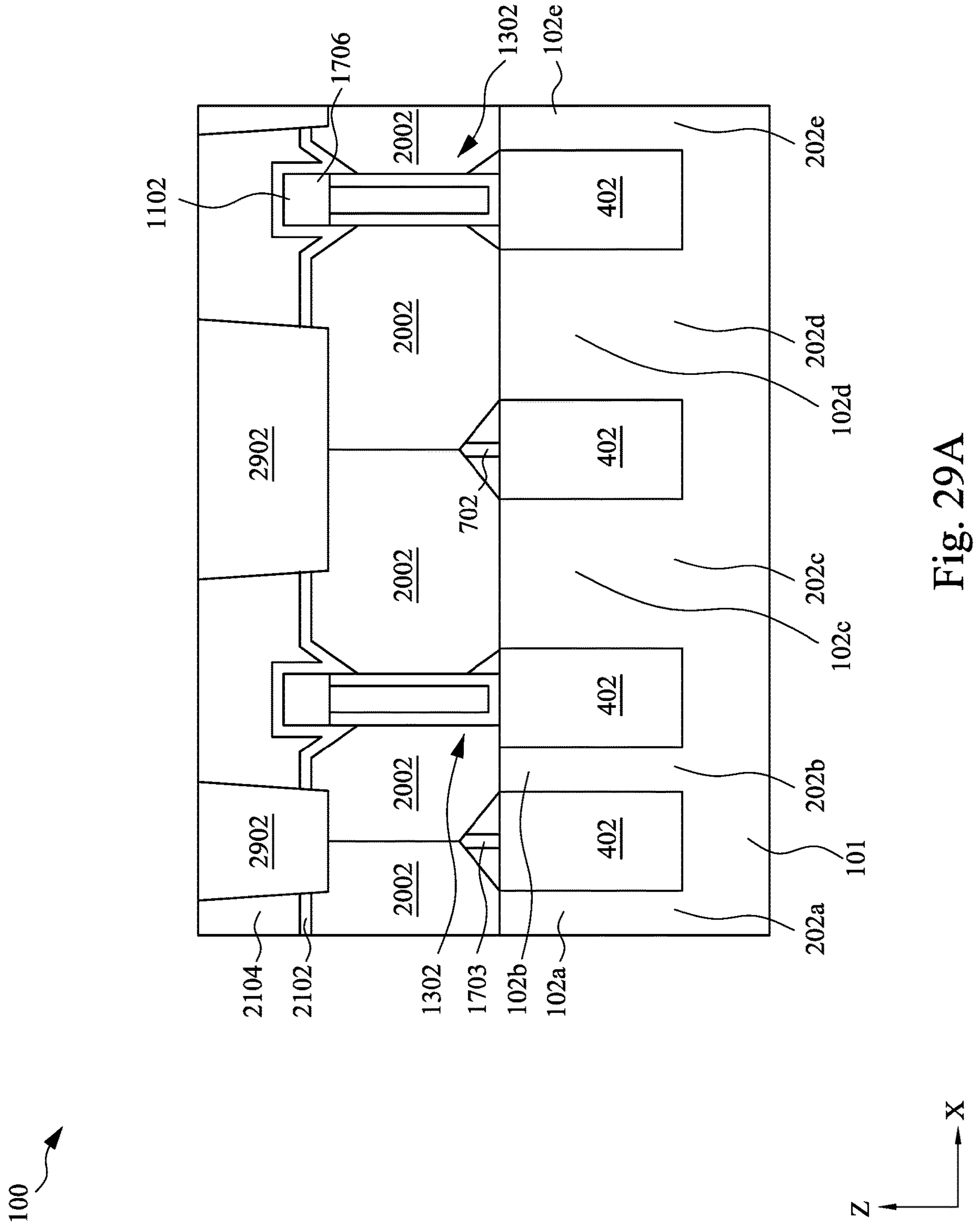
FIGS. 29A-29B are cross-sectional side views of the semiconductor device structure, in accordance with some embodiments.
Figure 29B:
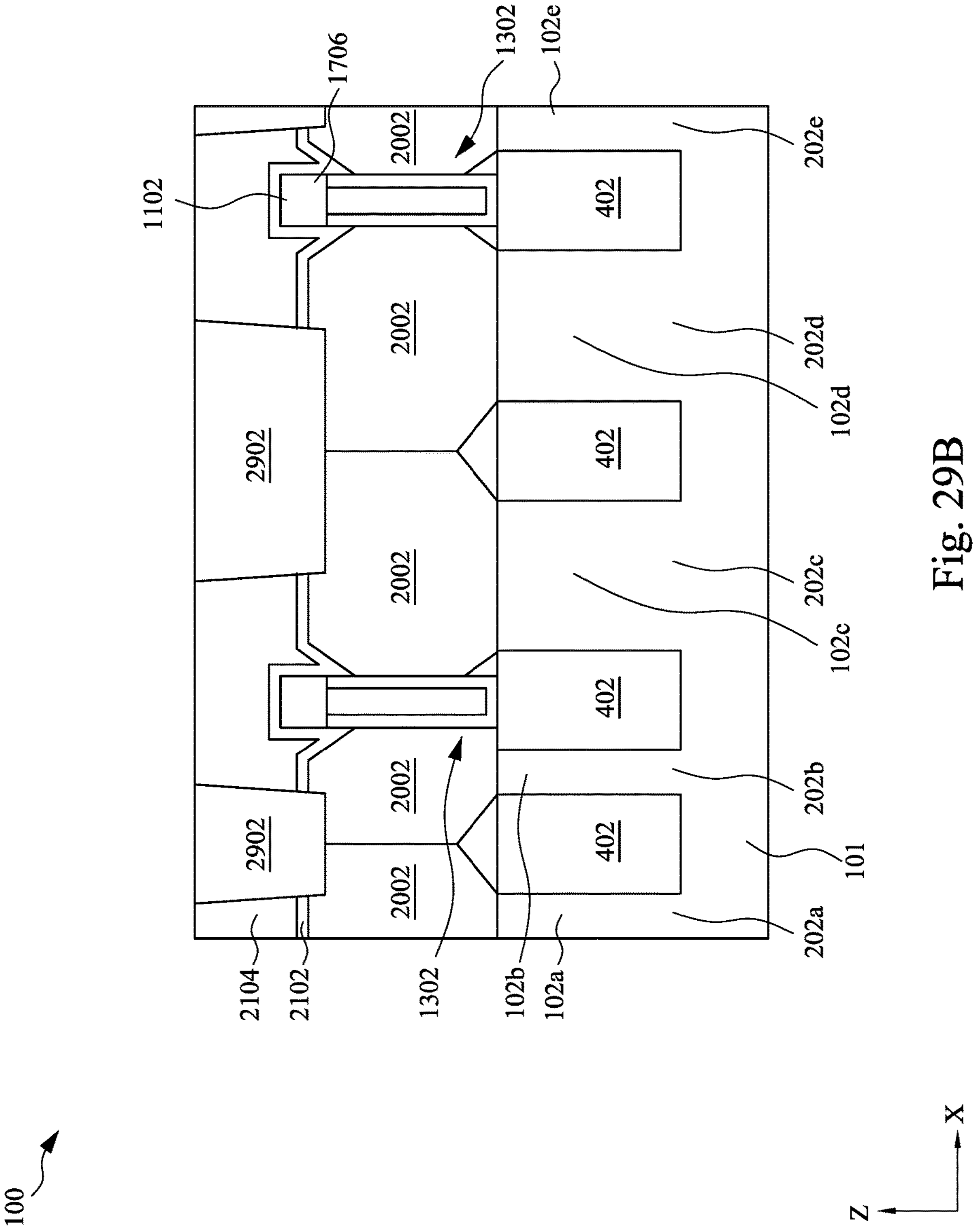

FIGS. 29A and 29B are cross-sectional side views of S/D regions of the semiconductor device structure 100, in accordance with some embodiments. The semiconductor device structure 100 shown in FIGS. 29A and 29B may include the channel regions shown in FIG. 28A or in FIG. 28B. As shown in FIGS. 29A and 29B, the S/D epitaxial features 2002 formed from the substrate portions 102*a*, 102*b* of the fins 202*a*, 202*b* are merged, and the S/D epitaxial features 2002 formed from the substrate portions 102*c*, 102*d* of the fins 202*c*, 202*d* are merged. The S/D epitaxial features 2002 formed from the substrate portions 102*b*, 102*c* of the fins 202*b*, 202*c* are separated by the dielectric feature 1302, and the S/D epitaxial features 2002 formed from the substrate portions 102*d*, 102*e* of the fins 202*d*, 202*e* are separated by the dielectric feature 1302. The semiconductor device structure 100 may include the first portion 1703 of the liner 702, as shown in FIG. 29A, or the first portion 1703 of the liner 702 does not exist, as shown in FIG. 29B. The dielectric feature 1302 located between the S/D epitaxial feature 2002 formed from the substrate portion 102*d* of the fin 202*d* and the S/D epitaxial feature 2002 formed from the substrate portion 102*e* of the fin 202*e* includes the first portion 1706 of the high-K dielectric material 1102, while the second portion 1708 of the high-K dielectric material 1102 of the dielectric feature 1302 between the fin 202*d* and fin 202*e* is removed (FIGS. 28A and 28B). As described above, the dielectric feature 1302 may include discrete high-K dielectric materials 1102, which are located between the S/D regions.

As shown in FIGS. 29A and 29B, in some embodiments, conductive features 2902 may be formed through the ILD layer 2104 and the CESL 2102 to be in contact with the S/D epitaxial features 2002. The conductive features 2902 may include the same material as the conductive features 2808 and may be formed by the same method as the conductive features 2808. In some embodiments, a silicide layer (not shown) is formed on the S/D epitaxial feature 2002, and the conductive feature 2902 is in contact with the silicide layer.

Figure 30:
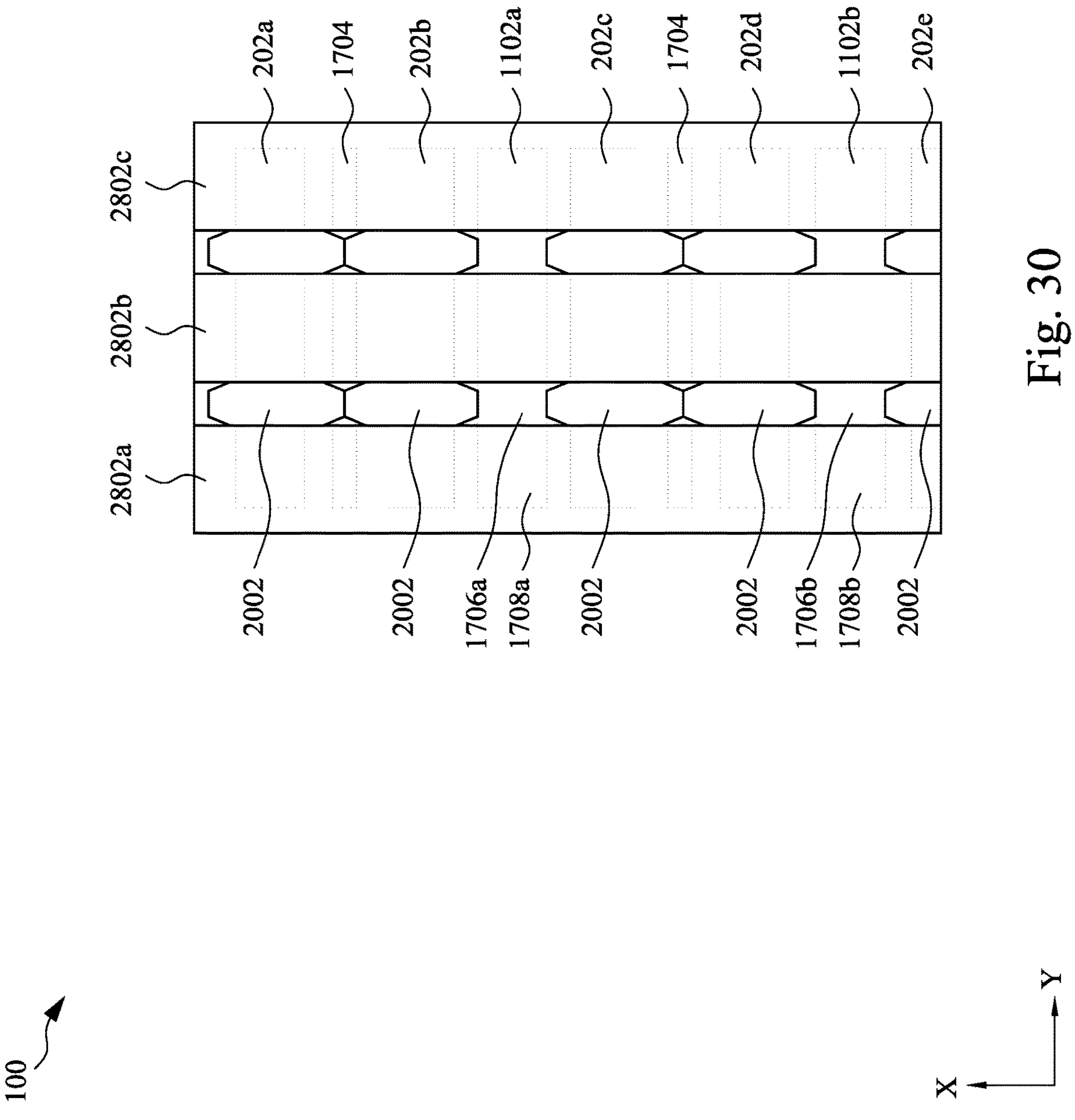
FIG. 30 is a top view of the semiconductor device structure, in accordance with some embodiments.

FIG. 30 is a schematic top view of the semiconductor device structure 100 of FIG. 28A, in accordance with some embodiments. As shown in FIG. 30, three gate electrode layers 2802*a*, 2802*b*, 2802*c* extend across the fins 202*a*-202*e*. The high-K dielectric material 1102*a* located between the fins 202*b*, 202*c* extends from the first gate electrode layer 2802*a* through the second gate electrode layer 2802*b* to the third gate electrode layer 2802*c*. The high-K dielectric material 1102*a* may be protected by the mask 2302 (FIG. 23A). The high-K dielectric material 1102*b* located between the fins 202*d*, 202*e* does not extend through the second gate electrode layer 2802*b*. The second portion 1708*b* of the high-K dielectric material 1102*b* located between the fins 202*d*, 202*e* may be removed as described in FIG. 28A. As a result, the second gate electrode layer 2802*b* may be used to control the channel regions of fins 202*d*, 202*e*.

The present disclosure provides a semiconductor device structure 100 including a first fin 202*a* having a first substrate portion 102*a*, a second fin 202*b* having a second substrate portion 102*b* adjacent the first substrate portion 102*a*, and a third fin 202*c* having a third substrate portion 102*c* adjacent the second substrate portion 102*b*. A first S/D epitaxial feature 2002 extending from the first substrate portion 102*a* may be merged with a second S/D epitaxial feature 2002 extending from the second substrate portion 102*b*, and a portion 1703 of a liner 702 may be below the merged S/D epitaxial features 2002. The second S/D epitaxial feature 2002 may be separated from a third S/D epitaxial feature 2002 extending from the third substrate portion 102*c* by a dielectric feature 1302. Some embodiments may achieve advantages. For example, the recessed first portion 1703 of the liner 702 allows the adjacent S/D epitaxial features 2002 to merge, leading to increased device density and reduced electrical resistance.

An embodiment is a semiconductor device structure. The structure includes a first fin extending from a substrate, and the first fin includes a first substrate portion having a first sidewall. The structure further includes a second fin extending from the substrate adjacent the first fin, and the second fin includes a second substrate portion having a second sidewall facing the first sidewall. The structure further includes a third fin extending from the substrate adjacent the second fin, and the third fin includes a third substrate portion. The structure further includes a first source/drain epitaxial feature extending from the first substrate portion, a second source/drain epitaxial feature extending from the second substrate portion, and the first source/drain epitaxial feature is merged with the second source/drain epitaxial feature. The structure further includes a third source/drain epitaxial feature extending from the third substrate portion, and a first liner positioned at a first distance away from a first plane defined by the first sidewall and a second distance away from a second plane defined by the second sidewall. The first distance is substantially the same as the second distance, and the merged first and second source/drain epitaxial features is disposed over the first liner. The structure further includes a dielectric feature disposed between the second source/drain epitaxial feature and the third source/drain epitaxial feature.

Another embodiment is a semiconductor device structure. The structure includes a first fin extending from a substrate, and the first fin includes a first substrate portion and a first plurality of semiconductor layers disposed over the first substrate portion. The structure further includes a second fin extending from the substrate adjacent the first fin, and the second fin includes a second substrate portion and a second plurality of semiconductor layers disposed over the second substrate portion. The structure further includes a third fin extending from the substrate adjacent the second fin, and the third fin includes a third substrate portion and a third plurality of semiconductor layers disposed over the third substrate portion. The structure further includes a first source/drain epitaxial feature extending from the first substrate portion, a second source/drain epitaxial feature extending from the second substrate portion, and the first source/drain epitaxial feature is merged with the second epitaxial feature. The structure further includes a third source/drain epitaxial feature extending from the third substrate portion, and a first liner including a first portion disposed between the first plurality of semiconductor layers and the second plurality of semiconductor layers. The first portion of the first liner has a first width. The structure further includes a dielectric feature disposed between the second plurality of semiconductor layers and the third plurality of semiconductor layers, and the dielectric feature has a second width greater than the first width.

A further embodiment is a method. The method includes forming first, second, and third fins from a substrate, forming a first liner between the first and second fins, forming a dielectric feature between the second and third fins, and forming a sacrificial gate stack on a portion of the first, second, and third fins and a first portion of the first liner. A portion of the first, second, and third fins and a portion of the first liner are exposed. The method further includes removing a portion of the exposed portion of the first, second, and third fins, and removing at least a portion of the exposed portion of the first liner to form a second portion of the first liner. The first portion of the first liner has a first height, the second portion of the first liner has a second height, and the first height is greater than the second height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:

a first fin extending from a substrate, wherein the first fin comprises a first portion including a first sidewall;

a second fin extending from the substrate adjacent the first fin, wherein the second fin comprises a second portion including a second sidewall facing the first sidewall;

an insulating material disposed between the first and second fins and extending from the first fin to the second fin;

a third fin extending from the substrate adjacent the second fin, wherein the third fin comprises a third portion;

a first source/drain epitaxial feature extending from the first portion;

a second source/drain epitaxial feature extending from the second portion, wherein the first source/drain epitaxial feature is merged with the second source/drain epitaxial feature;

a third source/drain epitaxial feature extending from the third substrate portion;

a dielectric material positioned over the insulating material at a first distance away from a first plane defined by the first sidewall and a second distance away from a second plane defined by the second sidewall, wherein the first distance is substantially the same as the second distance, the merged first and second source/drain epitaxial features is disposed over the dielectric material, and a sidewall of the dielectric material is exposed in a space below the merged first and second source/drain epitaxial features; and a dielectric feature disposed between the second source/drain epitaxial feature and the third source/drain epitaxial feature.

2. The semiconductor device structure of claim 1, wherein the dielectric feature comprises:

a liner;

a low-K dielectric material disposed on the liner; and a high-K dielectric material disposed on the liner and the low-K dielectric material.

3. The semiconductor device structure of claim 2, further comprising:

a first plurality of semiconductor layers disposed over the first portion;

a second plurality of semiconductor layers disposed over the second portion; and a third plurality of semiconductor layers disposed over the third portion.

4. The semiconductor device structure of claim 3, wherein the dielectric feature is disposed between the second plurality of semiconductor layers and the third plurality of semiconductor layers.

5. The semiconductor device structure of claim 4, further comprising:

a first gate electrode layer surrounding the first and second pluralities of semiconductor layers; and a second gate electrode layer surrounding the third plurality of semiconductor layers.

6. The semiconductor device structure of claim 5, wherein the high-K dielectric material comprises:

a first portion disposed between the second source/drain epitaxial feature and the third source/drain epitaxial feature; and a second portion disposed between the first gate electrode layer and the second gate electrode layer.

7. The semiconductor device structure of claim 6, wherein the first portion of the high-K dielectric material has a first height, and the second portion of the high-K dielectric material has a second height greater than the first height.

8. The semiconductor device structure of claim 3, wherein the dielectric material comprises a first portion and a second portion, wherein the merged first and second source/drain epitaxial features is disposed over the first portion of the dielectric material, and the second portion of the dielectric material is disposed between the first plurality of semiconductor layers and the second plurality of semiconductor layers.

9. The semiconductor device structure of claim 8, wherein the first portion of the dielectric material has a first width, and the second portion of the dielectric material has a second width greater than the first width.

10. The semiconductor device structure of claim 3, wherein the dielectric material is not between the first and second pluralities of semiconductor layers.

11. A semiconductor device structure, comprising:

a first fin extending from a substrate, wherein the first fin comprises a first portion and a first plurality of semiconductor layers disposed over the first portion;

a second fin extending from the substrate adjacent the first fin, wherein the second fin comprises a second portion and a second plurality of semiconductor layers disposed over the second portion;

an insulating material disposed between the first and second fins and extending from the first fin to the second fin;

a third fin extending from the substrate adjacent the second fin, wherein the third fin comprises a third portion and a third plurality of semiconductor layers disposed over the third portion;

a first source/drain epitaxial feature adjacent the first plurality of semiconductor layers;

a second source/drain epitaxial feature adjacent the second plurality of semiconductor layers, wherein the first source/drain epitaxial feature is merged with the second source/drain epitaxial feature;

a third source/drain epitaxial feature adjacent the third plurality of semiconductor layers;

a first dielectric layer comprising a first portion disposed between the first plurality of semiconductor layers and the second plurality of semiconductor layers and a second portion disposed over the insulating material, wherein the first portion of the first dielectric layer has a first width, the second portion is disposed below the merged first and second source/drain epitaxial features, and a sidewall of the second portion of the dielectric layer is exposed in a space below the merged first and second source/drain epitaxial features; and a dielectric feature disposed between the second plurality of semiconductor layers and the third plurality of semiconductor layers, wherein the dielectric feature has a second width greater than the first width.

12. The semiconductor device structure of claim 11, wherein the dielectric feature comprises:

a second dielectric layer;

a low-K dielectric material disposed on the second dielectric layer; and discrete high-K dielectric materials disposed on the second dielectric layer and the low-K dielectric material.

13. The semiconductor device structure of claim 12, wherein each discrete high-K dielectric material has a U shape with respect to a cross-sectional view of the semiconductor device structure.

14. The semiconductor device structure of claim 13, further comprising a gate electrode layer surrounding the first, second, and third pluralities of semiconductor layers.

15. The semiconductor device structure of claim 11, wherein the second portion of the first dielectric layer has a third width less than the first width of the first portion of the first dielectric layer.

16. A semiconductor device structure, comprising:

a first substrate portion;

a firsts source/drain epitaxial feature disposed over the first substrate portion;

a second substrate portion;

a second source/drain epitaxial feature disposed over the second substrate portion and adjacent the first source/drain epitaxial feature, wherein the first source/drain epitaxial feature is merged with the second source/drain epitaxial feature;

an insulating material disposed between the first and second substrate portions and extending from the first substrate portion to the second substrate portion;

a dielectric material comprising a first portion and a second portion, wherein the first portion of the dielectric material is disposed over the insulating material and below the merged first and second source/drain epitaxial features; and a gate electrode layer disposed around the second portion of the dielectric material, wherein the first portion of the dielectric material has a height less than a height of the second portion of the dielectric material.

17. The semiconductor device structure of claim 16, further comprising a dielectric feature disposed adjacent the second source/drain epitaxial feature.

18. The semiconductor device structure of claim 17, wherein the dielectric feature is disposed adjacent the gate electrode layer.

19. The semiconductor device structure of claim 16, wherein a width of the second portion of the dielectric material is greater than a width of the first portion of the dielectric material.

20. The semiconductor device structure of claim 16, wherein the dielectric material comprises SiCN, SiOC, or SiOCN.

* * * * *